United States Patent
Mori et al.

(10) Patent No.: US 7,675,773 B2
(45) Date of Patent: Mar. 9, 2010

(54) SEMICONDUCTOR MEMORY, TEST METHOD OF SEMICONDUCTOR MEMORY AND SYSTEM

(75) Inventors: Kaoru Mori, Kawasaki (JP); Toshikazu Nakamura, Kawasaki (JP); Jun Ohno, Kawasaki (JP); Masaki Okuda, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 90 days.

(21) Appl. No.: 12/130,480

(22) Filed: May 30, 2008

(65) Prior Publication Data
US 2009/0040850 A1 Feb. 12, 2009

(30) Foreign Application Priority Data
Aug. 10, 2007 (JP) ............................. 2007-210114

(51) Int. Cl.
*G11C 11/34* (2006.01)
(52) U.S. Cl. .............................. 365/185.03; 365/230.06
(58) Field of Classification Search ............ 365/185.03, 365/230.06
See application file for complete search history.

(56) References Cited
U.S. PATENT DOCUMENTS 7,335,907 B2* 2/2008 Terao et al. .................... 257/2
2002/0114205 A1 8/2002 Tsuruda et al.
2003/0146950 A1* 8/2003 Miyo et al. .................... 347/19
2005/0030783 A1* 2/2005 Sekiguchi et al. ............ 365/145
2005/0237836 A1* 10/2005 Fang et al. ................... 365/222

FOREIGN PATENT DOCUMENTS

| JP | 01-125796 A | 5/1989 |
|---|---|---|
| KR | 0297230 | 8/2001 |
| KR | 2002-68457 | 8/2002 |

* cited by examiner

*Primary Examiner*—Michael T Tran
(74) *Attorney, Agent, or Firm*—Arent Fox LLP

(57) ABSTRACT

An address switch circuit receives a row address signal supplied to a first address terminal group and a column address signal supplied to a second address terminal group. Further, the address switch circuit receives the row address signal supplied to the second address terminal group and thereafter receives the column address signal supplied to the second address terminal group and supplies the received row address signal and the received column address signal to the row decoder and the column decoder during a second operation mode. The number of semiconductor memories that are tested at once can be increased by executing an operation test of the semiconductor memories in the second operation mode. In addition, it becomes possible to test a semiconductor memory using test assets for other semiconductor memories. Consequently, the test efficiency can be improved, and the test cost can be reduced.

19 Claims, 39 Drawing Sheets

|  | NRLMD(CIFZ=L) | CIFMD(CIFZ=H) | |
|---|---|---|---|
|  |  | /RAS (1st /ADV) | /CAS (2nd /ADV) |
| AD18-22 | RAD9-13 (AD18-22) | — | — |
| AD14-17 | RAD5-8 (AD14-17) | — | — |
| AD9-13 | RAD0-4 (AD9-13) | RAD9-13 (AD9-13) | — |
| AD5-8 | CAD5-8 (AD5-8) | RAD5-8 (AD5-8) | CAD5-8 (AD5-8) |
| AD0-4 | CAD0-4 (AD0-4) | RAD0-4 (AD0-4) | CAD0-4 (AD0-4) |

Fig. 19

| MEM(FCRAM) | SDRAM |
|---|---|
| CLK<br>CE2<br>/CE1<br>/ADV<br>/OE<br>/WE<br>/UB, /LB<br>AD<br>DQ | CLK<br>CKE<br>/CS<br>/RAS<br>/CAS<br>/WE<br>DQM<br>AD<br>DQ |

Fig. 27

SEMICONDUCTOR MEMORY, TEST METHOD OF SEMICONDUCTOR MEMORY AND SYSTEM

CROSS-REFERENCE TO RELATED APPLICATION

This application is based upon and claims the benefit of priority from Japanese Patent Application No. 2007-210114, filed on Aug. 10, 2007, the entire contents of which are incorporated herein by reference.

BACKGROUND

1. Field

The application relates to a semiconductor memory which receives a row address signal and a column address signal to operate.

2. Description of the Related Art

A semiconductor memory such as a pseudo SRAM has DRAM memory cells (dynamic memory cells) and operates as an SRAM by internally performing a refresh operation of the memory cells automatically. The pseudo SRAM performs the refresh operation without being recognized by a controller such as CPU during a period in which a read operation or a write operation is not performed. The refresh operation is performed using an address signal generated by an internal address counter in response to an internal refresh request which occurs periodically in the pseudo SRAM (for example, Japanese Laid-open Patent Publication No. H01-125796).

The memory core of a pseudo SRAM has the same structure as the memory core of a DRAM, and the memory core operates as a DRAM. Accordingly, when DRAMs and pseudo SRAMs are manufactured, the test efficiency improves if the same program as that for the DRAMs can be used for testing the pseudo SRAMs. Particularly, a test pattern for writing a predetermined data pattern in memory cells arranged in a matrix form is designed depending on the layout structure of a memory core. Therefore, it is wasteful to design test patterns respectively for pseudo SRAMs and DRAMs having memory cores of the same structure.

However, in a pseudo SRAM, a row address signal and a column address signal are supplied simultaneously via terminals different from each other together with an access command (address non-multiplex type). On the other hand, in a DRAM, a row address signal and a column address signal are supplied sequentially from a common address terminal (address multiplex type). Therefore, conventionally, it has not been possible to use a test pattern for a DRAM to test a pseudo SRAM.

SUMMARY

According to an aspect of an embodiment, a semiconductor memory includes a memory core having a plurality of memory cells, a plurality of word lines coupled to the memory cells, a plurality of bit lines coupled to the memory cells, a row decoder which selects the word lines according to a row address signal, and a column decoder which selects the bit lines according to a column address signal. An address switch circuit receives a row address signal supplied to a first address terminal group and a column address signal supplied to a second address terminal group and supplies the received row address signal and the received column address signal to the row decoder and the column decoder during a first operation mode. Further, the address switch circuit receives the row address signal supplied to the second address terminal group and thereafter receives the column address signal supplied to the second address terminal group and supplies the received row address signal and the received column address signal to the row decoder and the column decoder during a second operation mode.

In the second operation mode, the number of address terminals needed for receiving an address is smaller as compared to that in the first operation mode.

BRIEF DESCRIPTION OF THE DRAWINGS

FIG. 19 illustrates address signals supplied to address terminals AD.
FIG. 27 illustrates a relationship between terminals of a memory MEM and terminals of the SDRAM in a test mode (common interface mode).

DETAILED DESCRIPTION OF THE EMBODIMENTS

Figure 1:
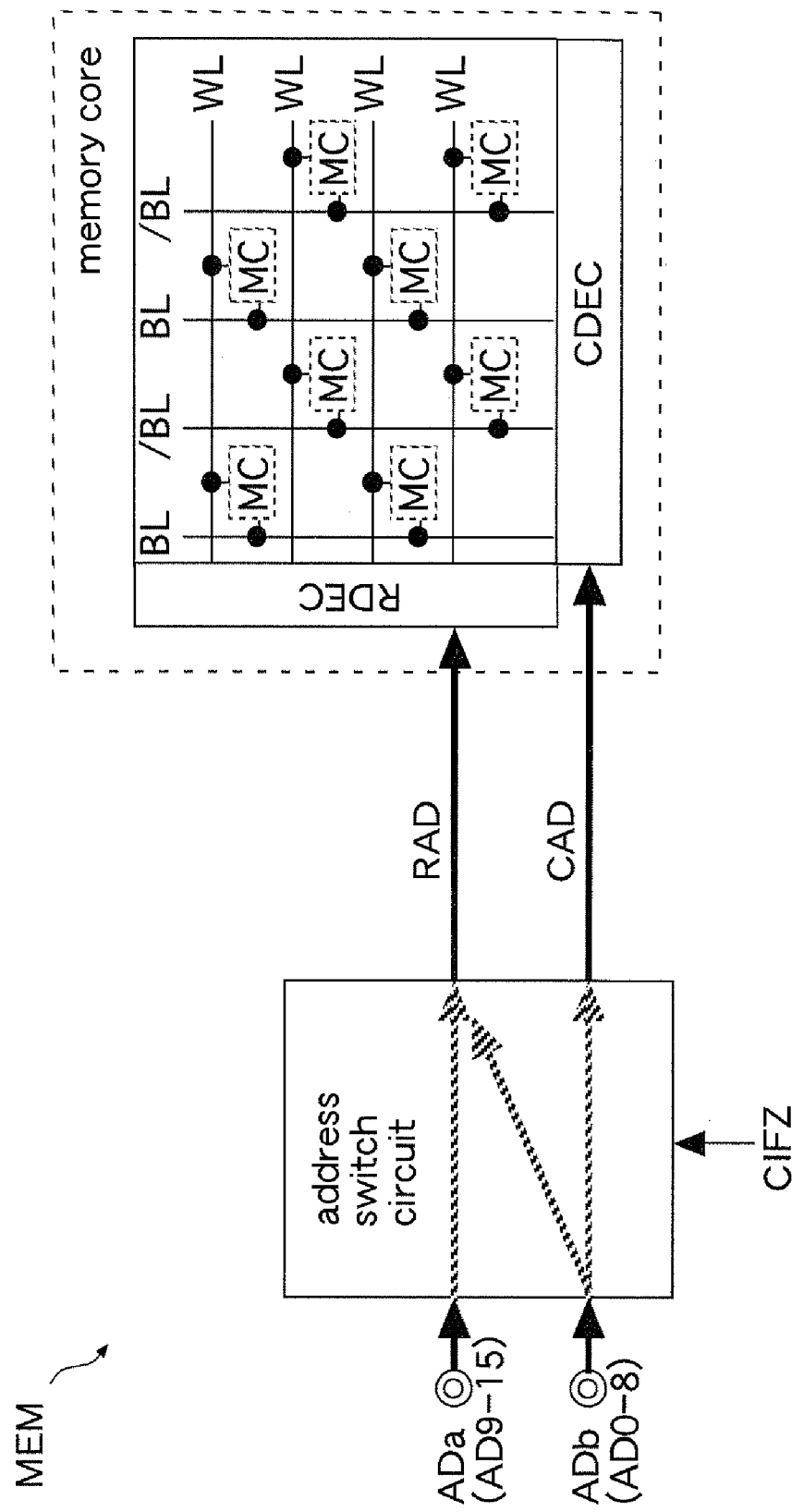
FIG. 1 illustrates a first embodiment.

Hereinafter, embodiments will be described, using the drawings. In the drawings, each signal line shown by the heavy line has a plurality of lines. Part of blocks to which the heavy lines are connected has a plurality of circuits. Each signal line through which the signal is transmitted is denoted by the same reference symbol as the signal name. Each signal starting with "/" and each signal ending with "X" represent negative logic. Each signal ending with "Z" represents positive logic. Each double circle in the drawings represents an external terminal. Each double square mark in the drawings represents a test terminal (test pad) from which the voltage is supplied when the semiconductor memory is a wafer state.

FIG. 1 illustrates a first embodiment. A semiconductor memory MEM is a pseudo SRAM for example. The pseudo SRAM has DRAM memory cells and an interface of SRAM. The semiconductor memory MEM has a memory core and an address switch circuit. The memory core has a plurality of memory cells MC, a plurality of word lines WL coupled to the memory cells MC, a plurality of bit lines BL, /BL coupled to the memory cells MC, a row decoder RDEC which selects a word line WL according to a row address signal RAD, and a column decoder CDEC which selects bit lines BL, /BL according to a column address signal CAD. The address switch circuit receives a row address signal RAD (AD9-15) supplied to a first address terminal group ADa and a column address signal CAD (AD0-8) supplied to a second address terminal group ADb when a mode signal CIFZ indicates a first operation mode, and supplies the received row address signal RAD and column address signal CAD to the row decoder RDEC and the column decoder CDEC. Further, the address switch circuit receives a row address signal RAD (AD0-8) supplied to the second address terminal group ADb when the mode signal CIFZ indicates a second operation mode, receives thereafter a column address signal CAD (AD0-8) supplied to the second address terminal group ADb, and supplies the received row address signal RAD and column address signal CAD to the row decoder RDEC and the column decoder CDEC. In the second operation mode, the number of address terminals needed for receiving an address AD is small.

Figure 25:
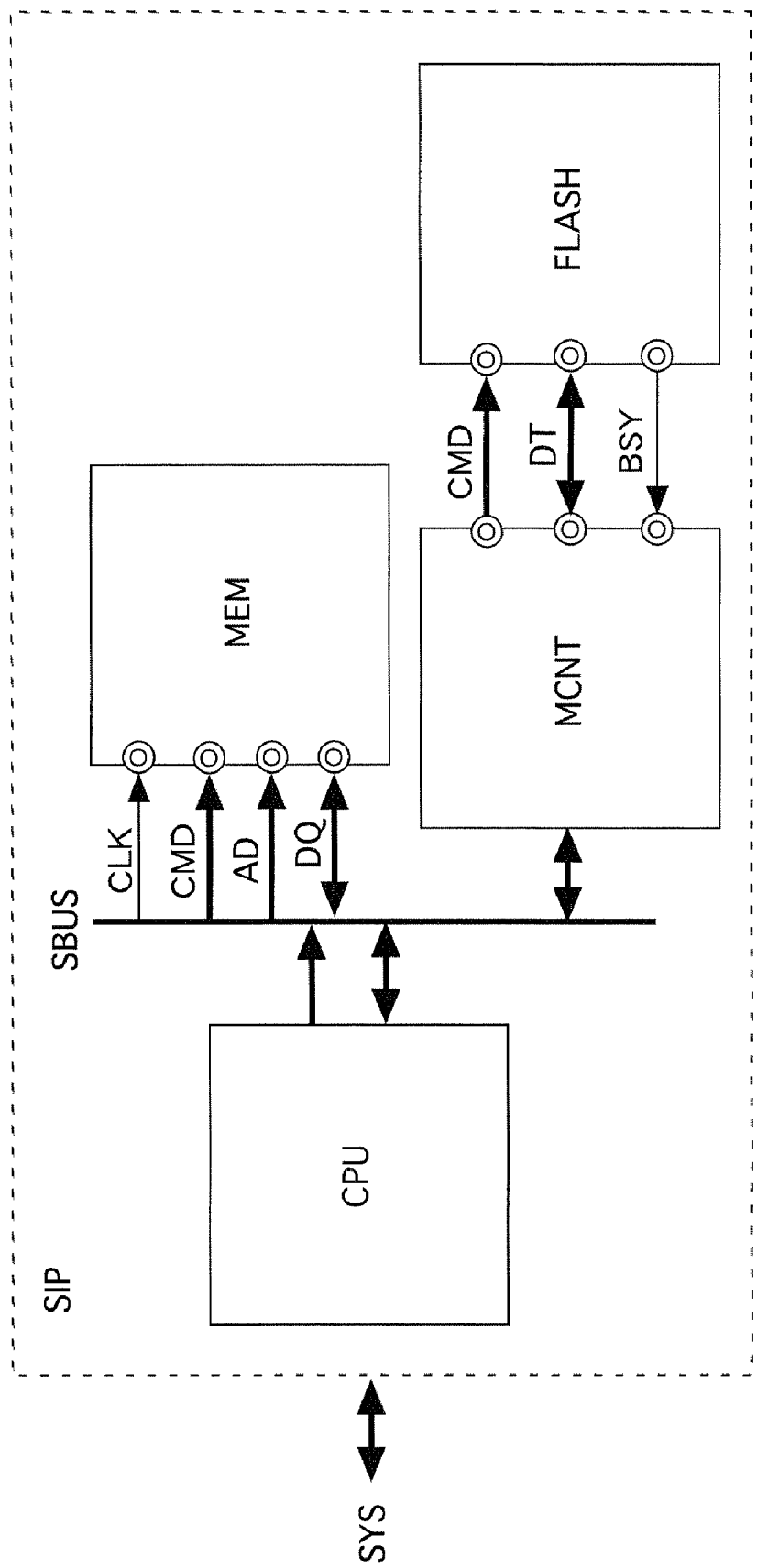
FIG. 25 illustrates a system of the fourth embodiment.

In the first embodiment, for example, the number of memories MEM that can be tested at once can be increased by executing the operation test of the memories MEM in the second operation mode. In addition, it becomes possible to test the memories MEM using test assets (such as test patterns) for a DRAM or the like which receive a row address signal RAD and a column address signal CAD sequentially at the same address terminal ADb to operate. Consequently, the test efficiency can be improved, and the test cost can be reduced. The test of the memories MEM is executed, for example, by a test system illustrated in FIG. 26. In the test of the memories MEM, first, the memories MEM are set to the second operation mode. Next, the row address signal RAD and the column address signal CAD are supplied sequentially to the second address terminal group ADb, and the operation test of the memories MEM is executed. For example, the first operation mode is a normal operation mode (pseudo SRAM interface mode), and the second operation mode is a test mode (SDRAM interface mode). A memory MEM forms a system together with a controller which accesses the memory MEM, as illustrated in FIG. 25 for example.

Figure 2:
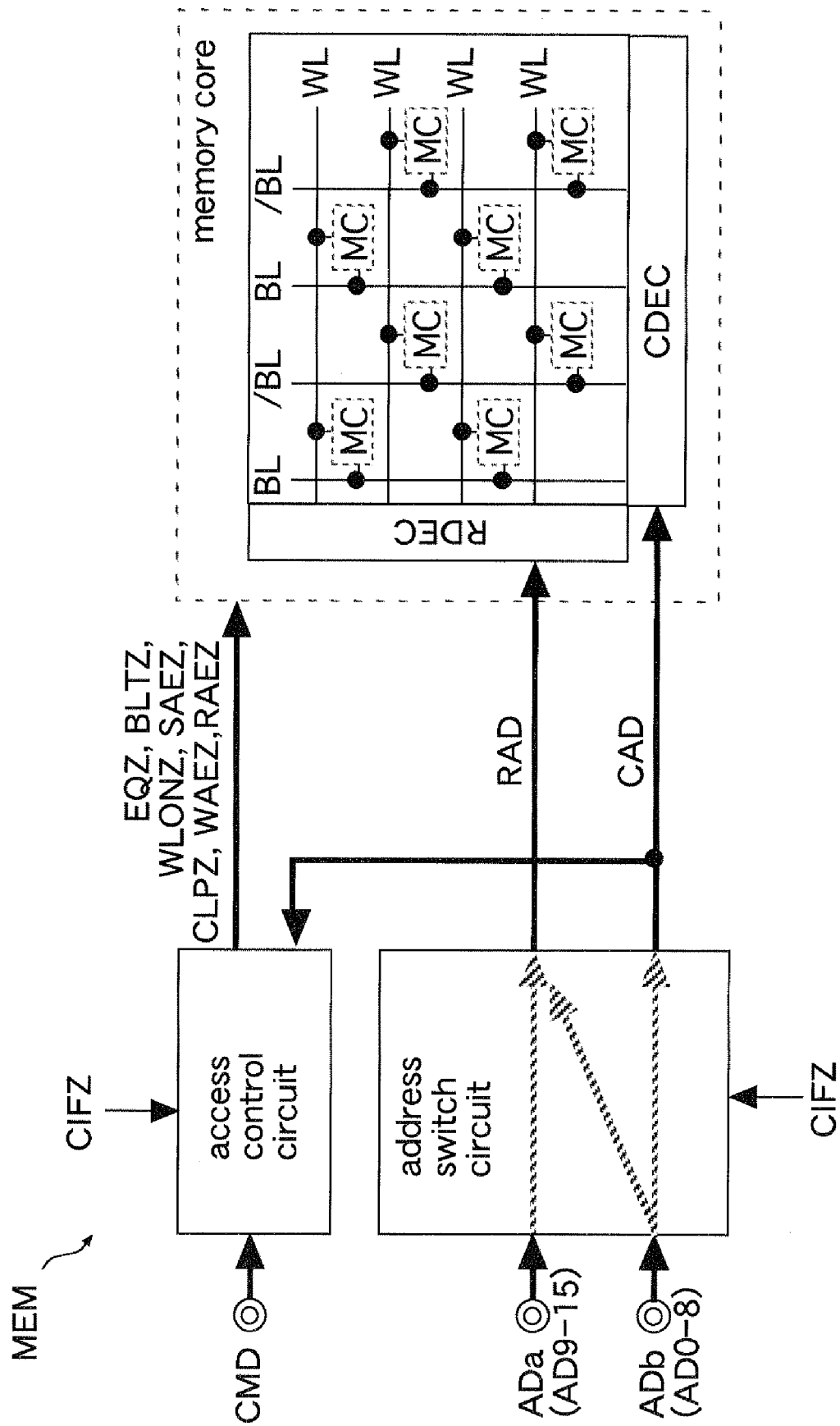
FIG. 2 illustrates a second embodiment.

FIG. 2 illustrates a second embodiment. Detailed explanations of the same elements as those in the first embodiment are omitted. The memory MEM has an access control circuit in addition to FIG. 1. The semiconductor memory MEM is a pseudo SRAM for example. The memory MEM forms a system together with a controller which accesses the memory MEM, as illustrated in FIG. 25 for example. The test of the memory MEM is executed by the test system illustrated in FIG. 26 for example.

Figure 4:
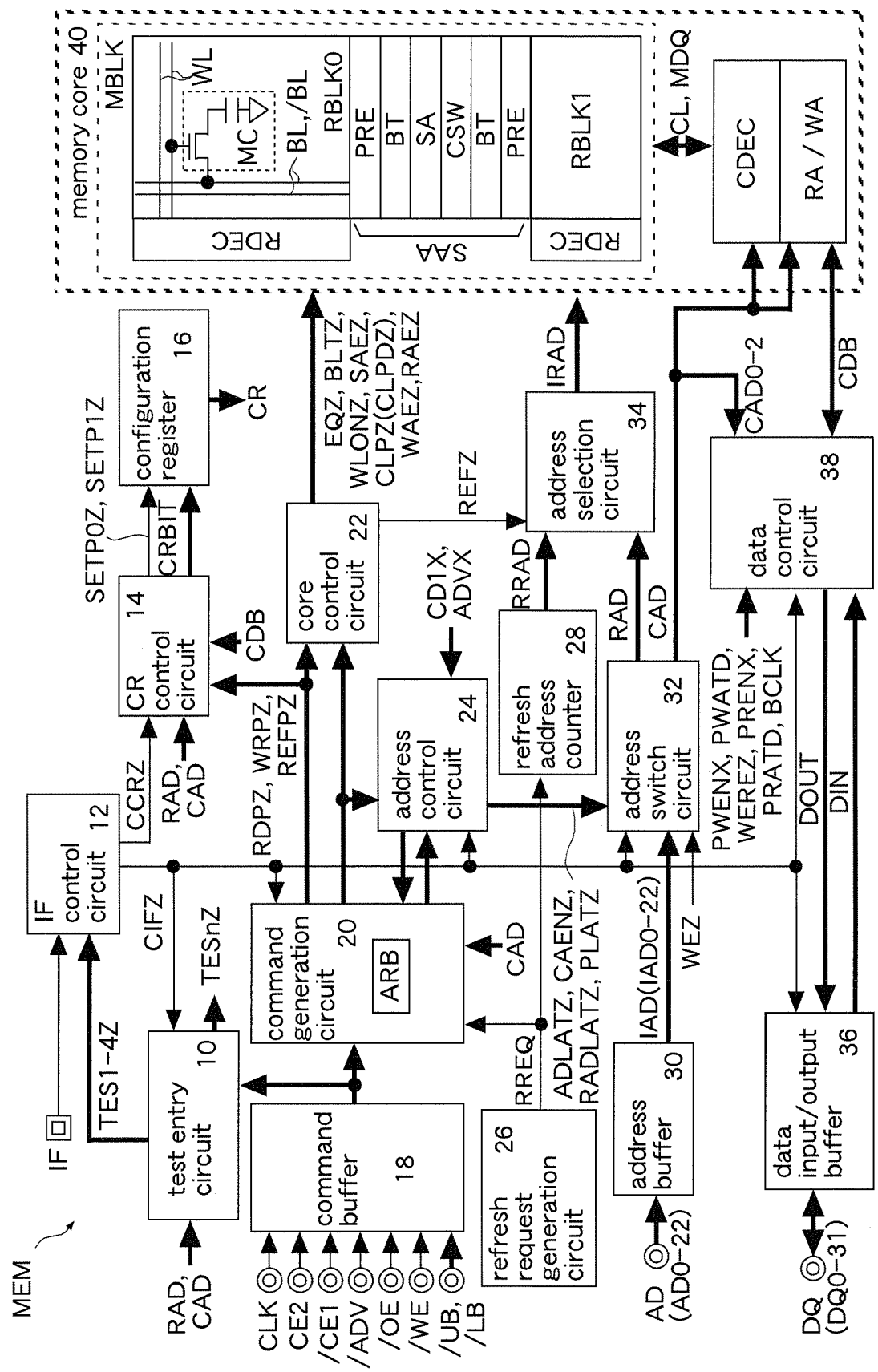
FIG. 4 illustrates a fourth embodiment.

When the mode signal CIFZ indicates the first operation mode, the access control circuit outputs to the memory core an access control signal for performing an access operation of the memory core (for example, equalizing signal EQZ, bit control signal BLTZ, word control signal WLONZ, sense amplifier control signal SAEZ, column control signal CLPZ, write amplifier control signal WAEZ, read amplifier control signal RAEZ, or the like illustrated in FIG. 4) in response to an access command CMD supplied together with a column address signal CAD and a row address signal RAD. Further, when the mode signal CIFZ indicates the second operation mode, the access control circuit outputs the access control signal to the memory core in response to supply of the column address signal CAD to the address switch circuit. Accordingly, in the second mode in which the column address signal CAD and the row address signal RAD are received at different timings, the memory core can be operated at a timing matched to supply of the column address signal CAD.

As above, also in the second embodiment, the same effects as those of the first embodiment can be obtained. Moreover, when test assets for a DRAM or the like of the address multiplex type are used to test the memory MEM, the operation timing of the memory core can be matched to the supply timing of an address, and hence the memory MEM can be operated properly. Consequently, the test efficiency can be improved and the test cost can be reduced.

Figure 3:
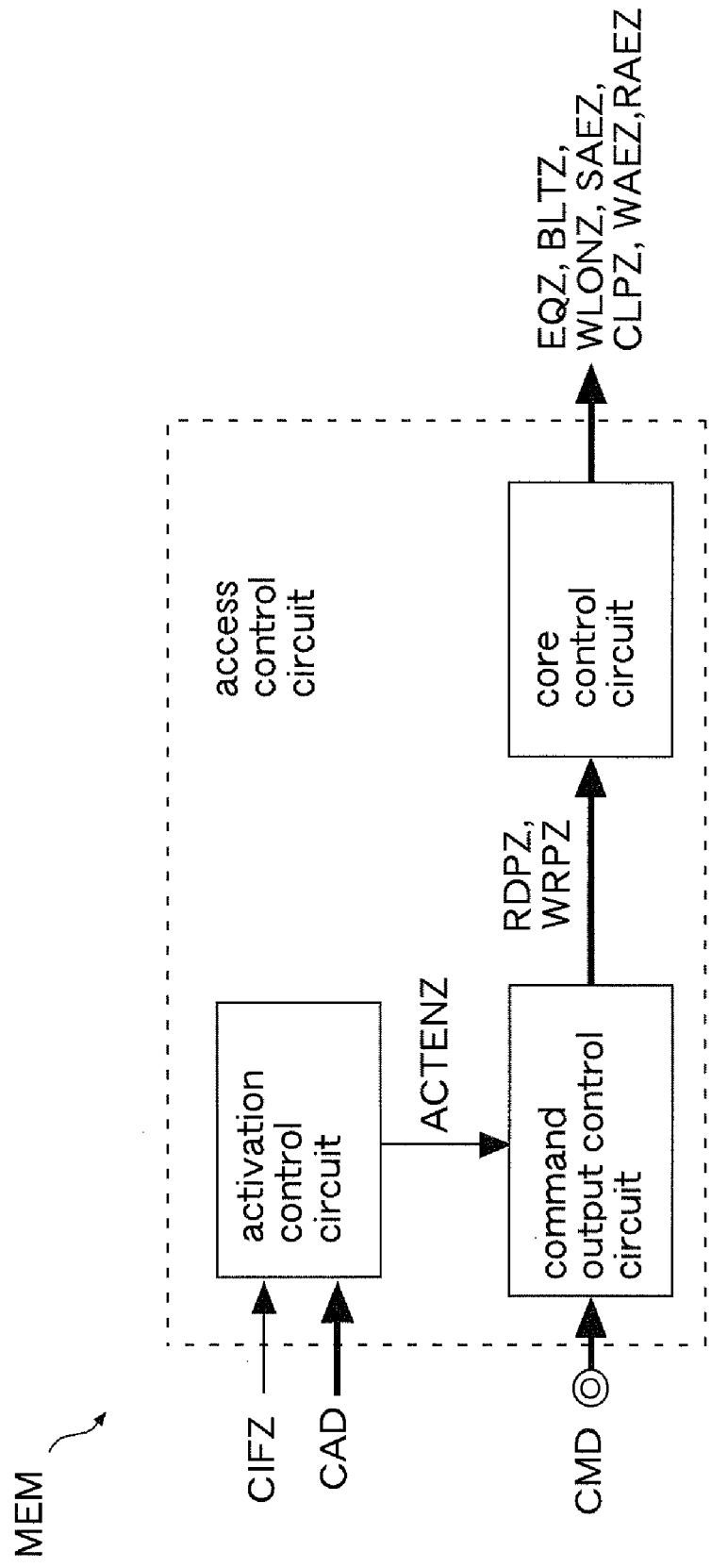
FIG. 3 illustrates a third embodiment.

FIG. 3 illustrates details of an access control circuit in a third embodiment. Detailed explanations of the same elements as in the first and second embodiments are omitted. The structure excluding the access control circuit is the same as in FIG. 2. Specifically, the semiconductor memory MEM is a pseudo SRAM for example. The memory MEM forms a system together with a controller which accesses the memory MEM, as illustrated in FIG. 25 for example. The test of the memory MEM is executed by the test system illustrated in FIG. 26 for example.

The access control circuit has an active control circuit, a command output control circuit and a core control circuit. The active control circuit keeps activating an active enable signal ACTENZ during the first operation mode, and activates the active enable signal ACTENZ in response to supply of the column address signal CAD during the second operation mode. The command output control circuit outputs the access command CMD as an access request signal RDPZ or WRPZ during activation of the active enable signal ACTENZ, and disables output of the access request signals RDPZ, WRPZ during inactivation of the active enable signal ACTENZ. The access request signal RDPZ is generated in response to a read command, and the access request signal WRPZ is generated in response to a write command. The core control circuit generates the access control signal according to the access request signal RDPZ or WRPZ so as to perform an access operation of the memory core.

In this embodiment, when the command output control circuit receives the access command CMD during inactivation of the active enable signal ACTENZ, the command output control circuit does not output the access request signal RDPZ or WRPZ until the active enable signal ACTENZ becomes active. Therefore, in the second operation mode, the access request signal RDPZ or WRPZ is output synchronously with activation of the active enable signal ACTENZ. Accordingly, the access control circuit can output an access control signal to the memory core in response to supply of the column address signal CAD.

As above, also in the third embodiment, the same effects as in the first and second embodiments can be obtained. Moreover, by enabling/disabling output of the access request signals RDPZ, WRPZ according to the active enable signal ACTENZ, a timing for the memory core to start an access operation can be changed according to the operation mode with a simple circuit. In other words, when test assets for a DRAM or the like of the address multiplex type are used to test the memory MEM, the memory MEM can be operated properly. Consequently, the test efficiency can be improved and the test cost can be reduced.

FIG. 4 illustrates a fourth embodiment. The semiconductor memory MEM is an FCRAM (Fast Cycle RAM) of pseudo SRAM type for example. This FCRAM has DRAM memory cells and an interface of SRAM. The memory MEM has a test entry circuit 10, an IF control circuit 12, a CR control circuit 14, a configuration register 16, a command buffer 18, a command generation circuit 20, a core control circuit 22, an address control circuit 24, a refresh request generation circuit 26, a refresh address counter 28, an address buffer 30, an address switch circuit 32, an address selection circuit 34, a data input/output buffer 36, a data control circuit 38 and a memory core 40.

Although not illustrated in particular, the memory MEM has a redundancy circuit for relieving a defective memory cell or the like, a redundancy fuse circuit for making the redundancy circuit become usable, and a redundancy control circuit. For example, the redundancy circuit has redundancy memory cells, a redundancy word line coupled to the redundancy memory cells, a redundancy word decoder coupled to the redundancy word line, a redundancy word driver, and so on. The redundancy fuse circuit stores a failure address. The redundancy control circuit detects a match of an address signal and the failure address, disables access to normal memory cells and enables access to the redundancy memory cells. Note that the memory MEM forms a system together with a CPU, as illustrated in FIG. 25, which will be described later.

Figure 6:
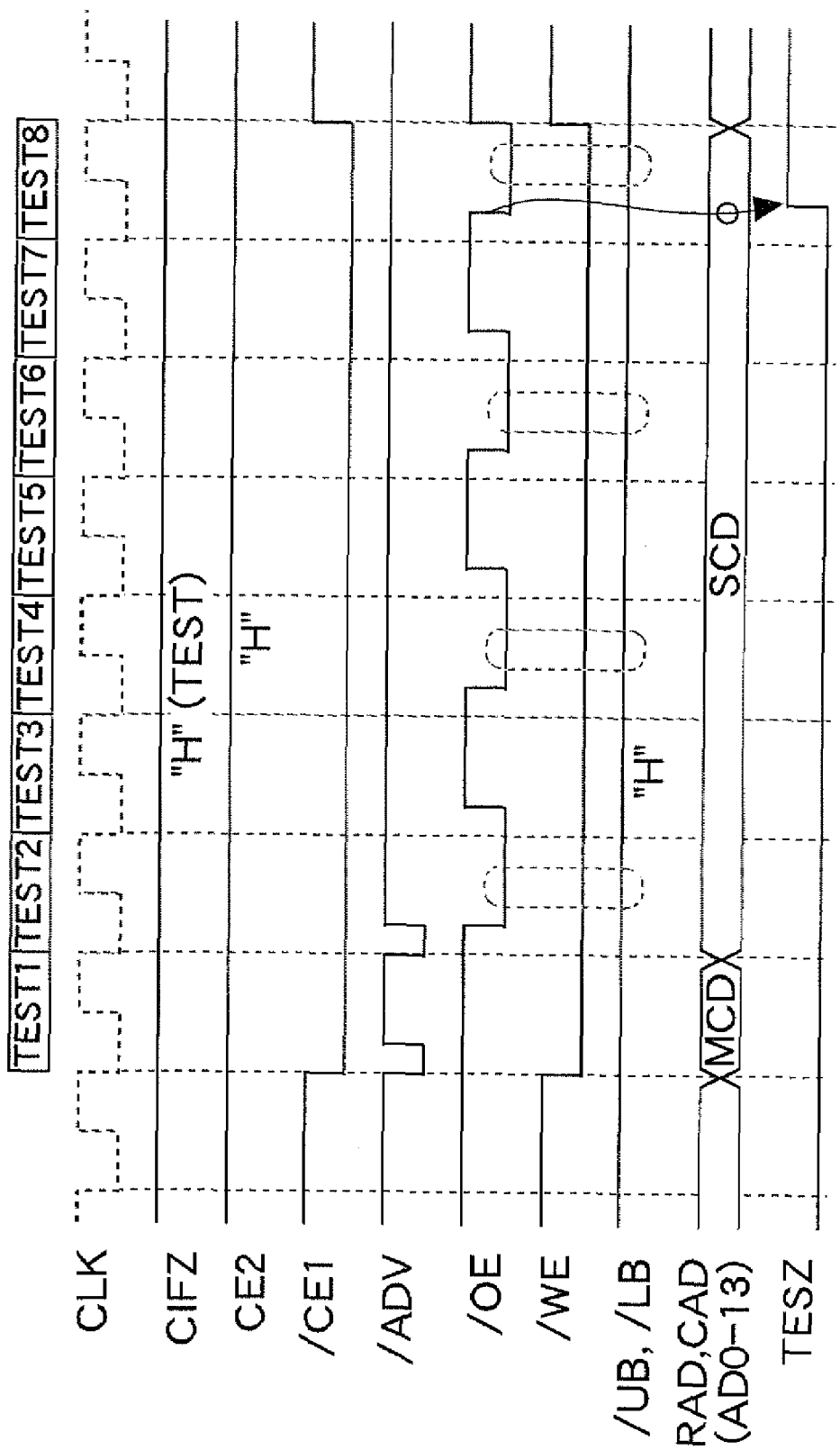
FIG. 6 illustrates an operation of a test entry circuit in a common interface mode.
Figure 7:
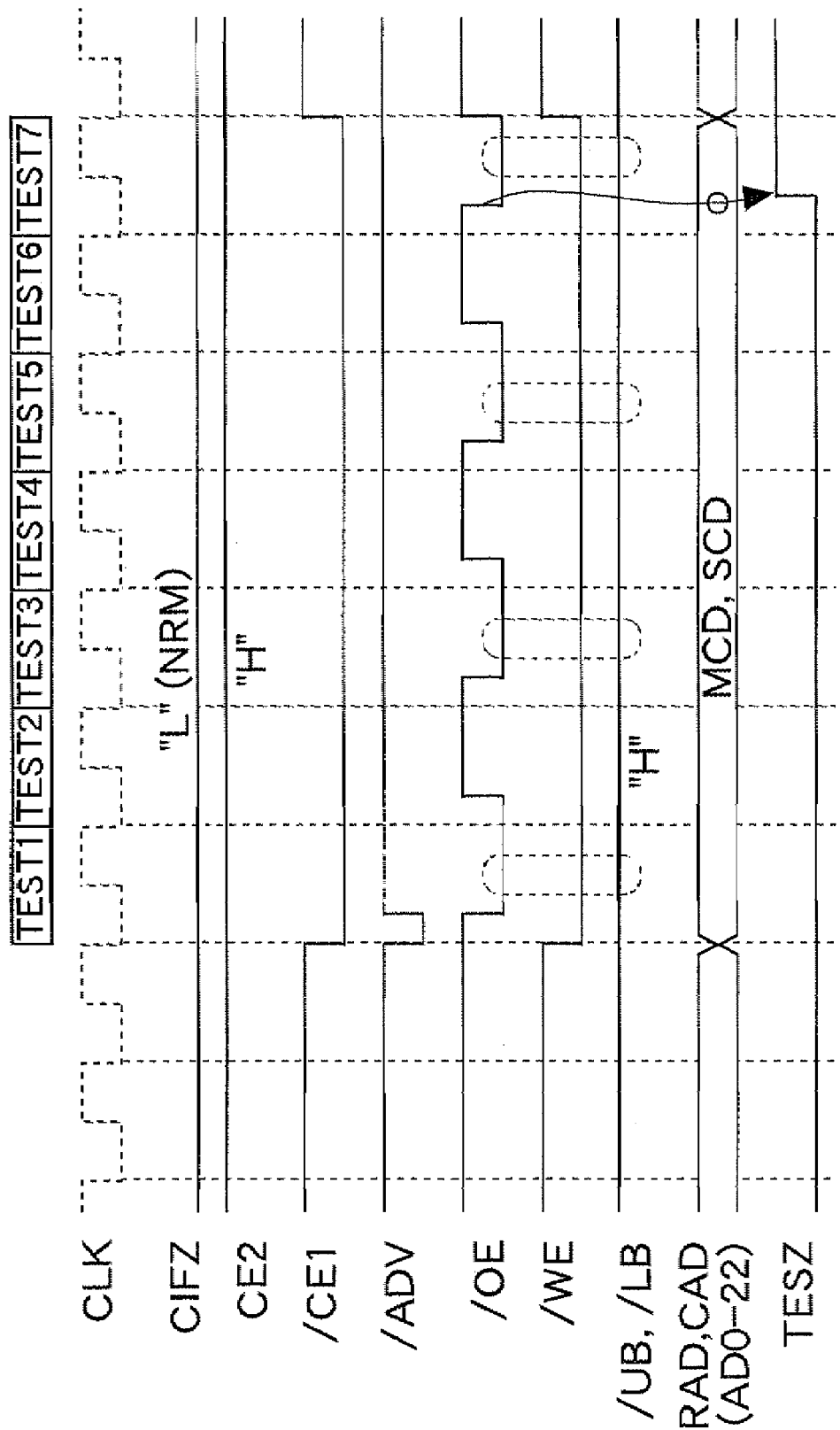
FIG. 7 illustrates an operation of the test entry circuit 10 in an FCRAM interface mode.
Figure 8:
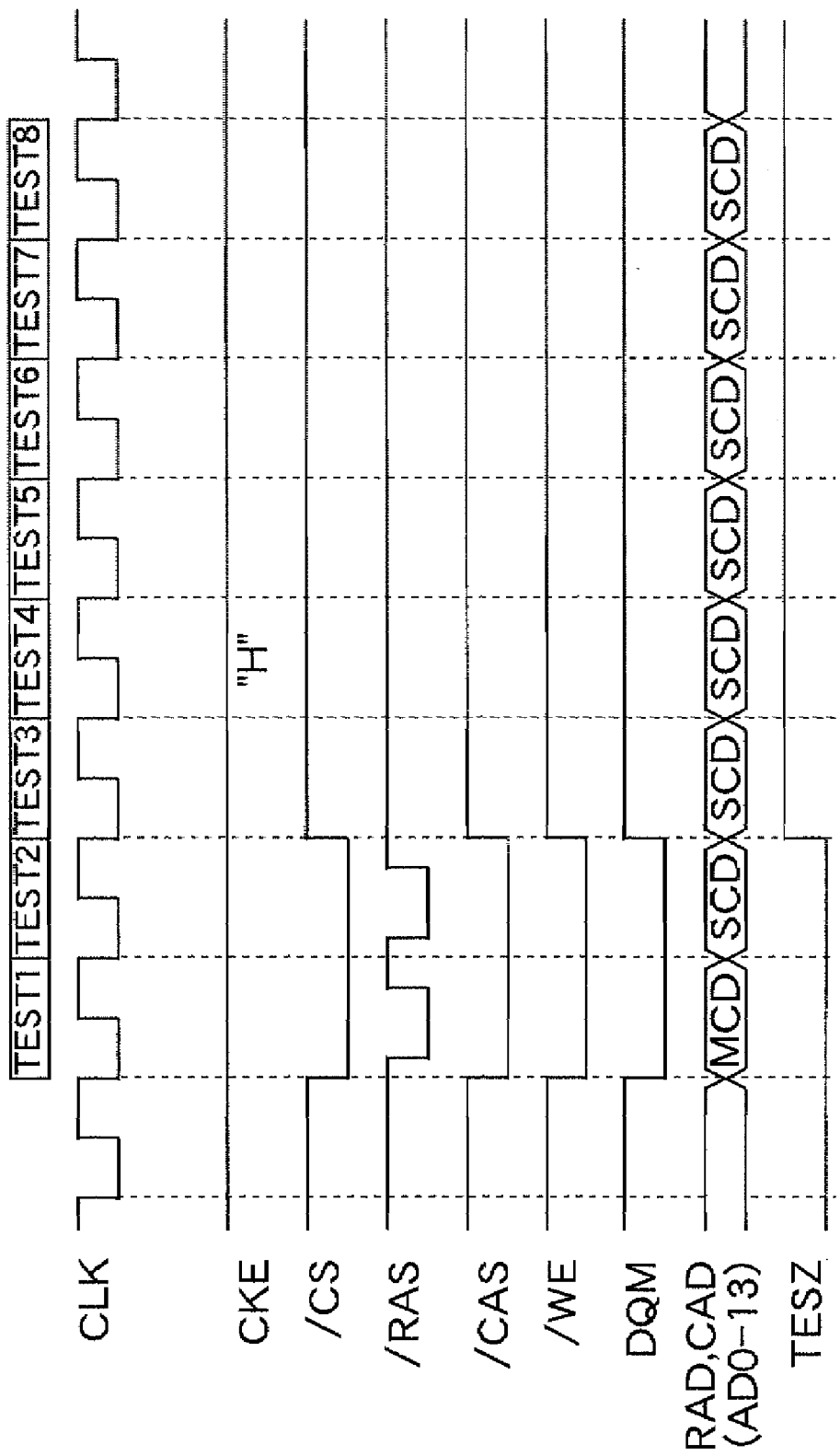
FIG. 8 illustrates test mode entry of an SDRAM.

The test entry circuit 10 generates a test signal TESZ (TES1Z, TES2Z, TES3Z, TES4Z, TEnZ) according to address signals RAD, CAD supplied together with a test command. The test command is supplied via the command buffer 18. A test circuit in the memory MEM operates according to the test command TESZ, and a test of the memory MEM is executed. Operations of the test entry circuit 10 are illustrated in FIG. 6, FIG. 7 and FIG. 8.

Figure 5:
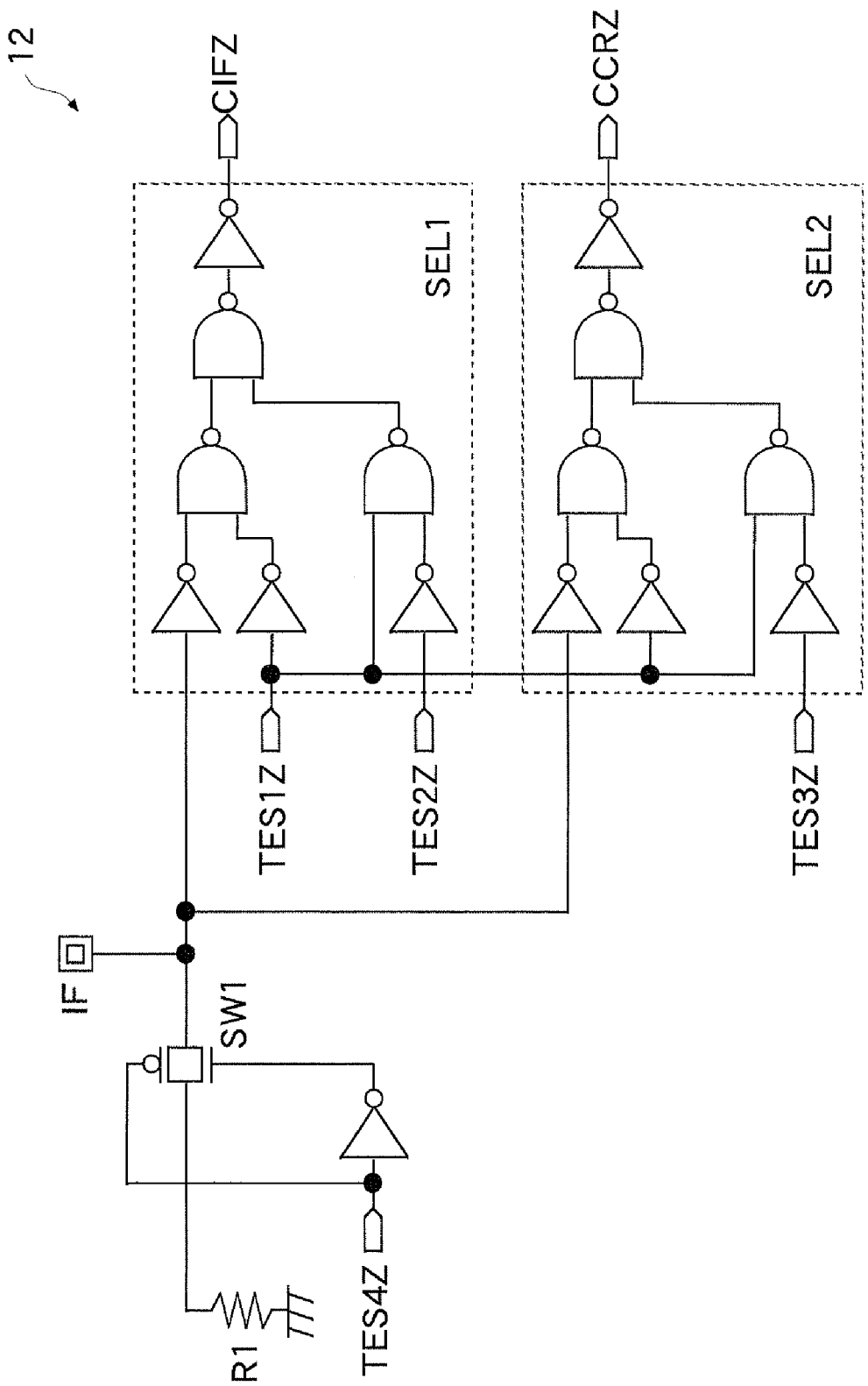
FIG. 5 illustrates details of an IF control circuit illustrated in FIG. 4.

The IF control circuit 12 outputs a common interface mode signal CIFZ (hereinafter also referred to as a mode signal), and a register set signal CCRZ according to a voltage value of a test pad IF (test terminal) and values of the test signals TES1-4Z. During a common interface mode in which the mode signal CIFZ is activated (test mode TEST; SDRAM interface mode; second operation mode), an input/output interface of the memory MEM is set to the interface specification of an SDRAM. Accordingly, as will be described later, a test pattern for the SDRAM can be used to test the memory MEM with an LSI tester. During a normal operation mode in which the mode signal CIFZ is inactivated (first operation mode; FCRAM interface mode), the input/output interface of the memory MEM is set to the interface specification of the general FCRAM (pseudo SRAM). Details of the IF control circuit 12 are illustrated in FIG. 5.

Figure 9:
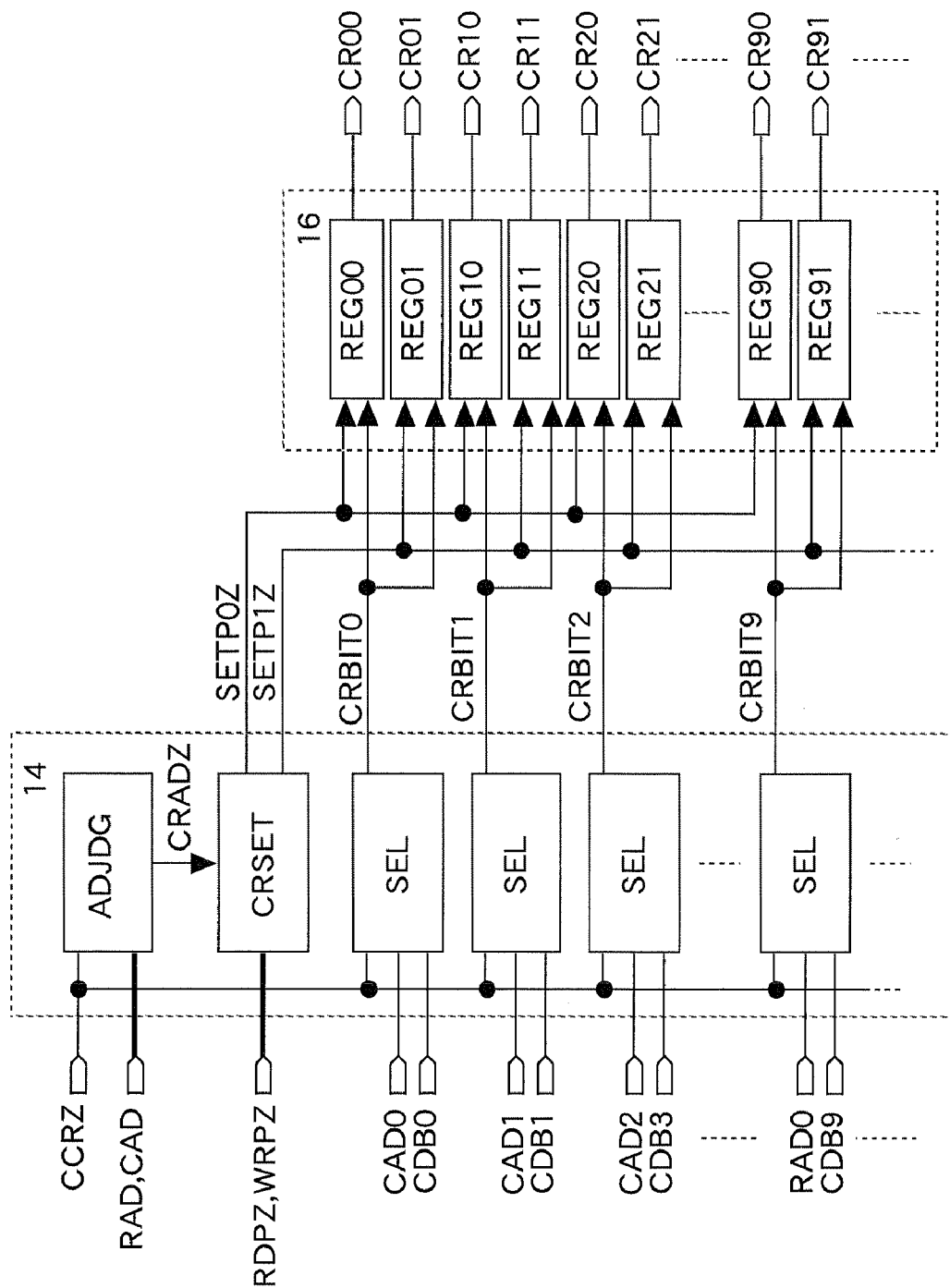
FIG. 9 illustrates details of a CR control circuit and a configuration register illustrated in FIG. 4.

The CR control circuit 14 (configuration register control circuit) outputs set signals SETP0Z, SETP1Z upon reception of a predetermined command and address signals RAD, CAD for setting the configuration register 16. When the register set signal CCRZ is activated to a high logic level, the CR control circuit 14 outputs values of the address signals RAD, CAD as a register set bit signal CRBIT. When the register set signal CCRZ is activated to a low logic level, the CR control circuit 14 outputs a value of data DQ (common data bus CDB) as a register set bit CRBIT. Details of the CR control circuit 14 are illustrated in FIG. 9.

The configuration register 16 receives the value of the register set bit CRBIT synchronously with the set signal SETP0Z or SETP1Z, stores the received value, and outputs the stored value as a register signal CR. For example, the register signal CR is output for setting a burst length, an operation mode, a read latency, or the like. The burst length is the number of times of data output from a data terminal DQ in response to one time of read command, and the number of times of data input to the data terminal DQ in response to one time of write command. The operation mode is either a synchronous mode in which a write operation or a read operation is performed synchronously with a clock signal CLK or an asynchronous mode in which a write operation or a read operation is performed asynchronously with the clock signal CLK. The read latency is the number of clock cycles from reception of a read command until output of first read data DQ. Details of the configuration register 16 are illustrated in FIG. 9.

The command buffer 18 receives a clock signal CLK and a command signal CMD (chip enable signals CE2, /CE1, an address valid signal /ADV, an output enable signal /OE, a write enable signal /WE, an upper byte control signal /UB, and a lower byte control signal /LB), and outputs the received signals to the command generation circuit 20 or the like as chip enable signals CE1Z, CE1X, address valid signals ADVZ, ADVX, an output enable signal OEZ, write enable signals WEZ, WEX, an upper byte control signal UBZ, and a lower byte control signal LBZ.

The command generation circuit 20 outputs a read signal RDPZ for performing a read operation, a write signal WRPZ for performing a write operation or a refresh signal REFPZ for performing a refresh operation according to a signal (external access request) from the command buffer 18 or a refresh request from the refresh request circuit 26. An arbiter ARB of the command generation circuit 20 determines the order of priority between a read command and a write command and a refresh request RREQ. For example, when receiving a refresh request RREQ a little earlier than a read command, the arbiter ARB gives priority to the refresh request RREQ. Output of the read signal RDPZ in response to the read command is suspended until the refresh operation in response to the refresh request RREQ is completed. Conversely, when the refresh request RREQ is supplied during a read operation, output of the refresh signal REFPZ in response to the refresh request RREQ is suspended temporarily until the read operation is completed.

Figure 13:
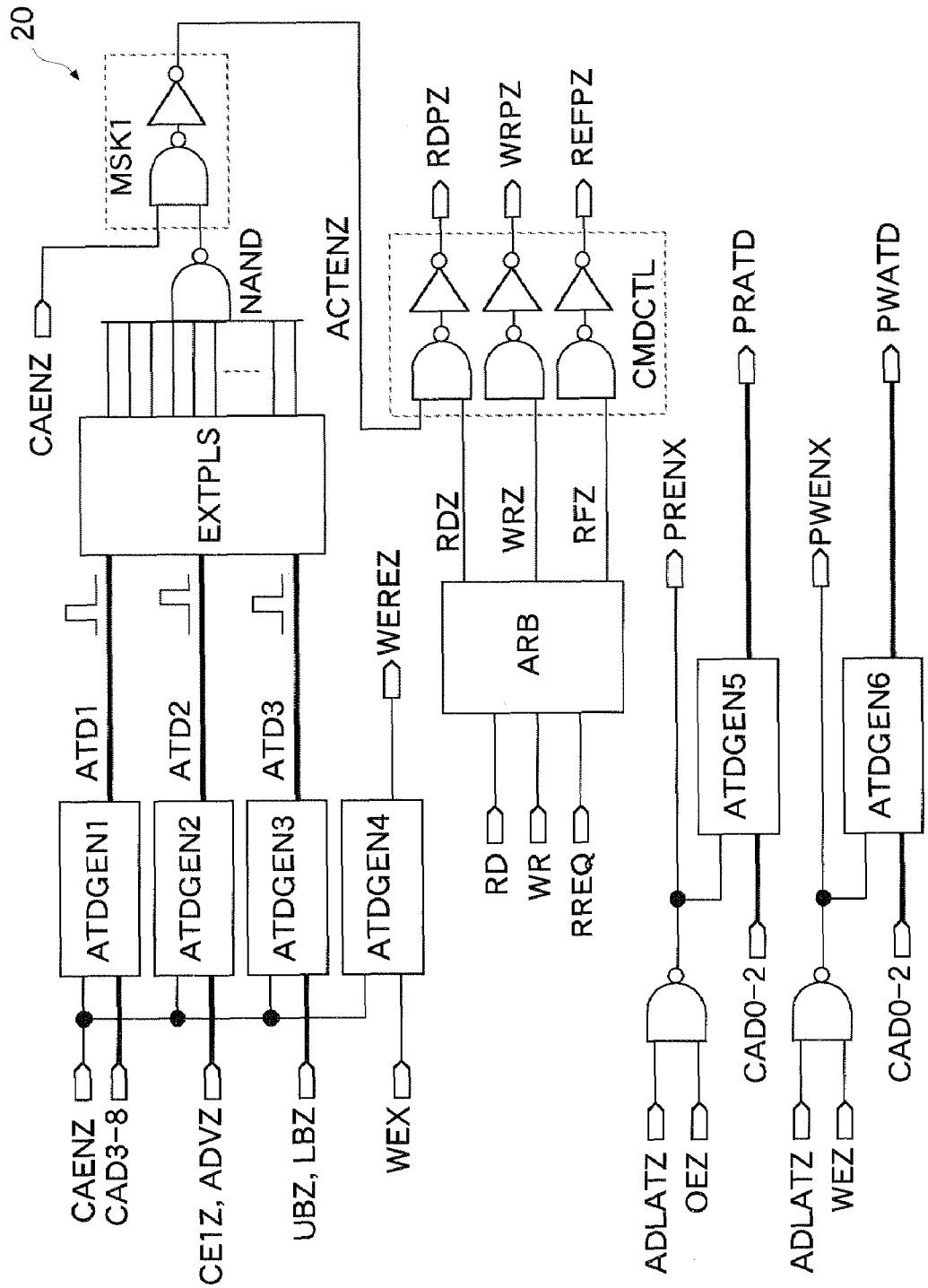
FIG. 13 illustrates details of a command generation circuit illustrated in FIG. 4.

Further, the command generation circuit 20 outputs control signals PRENX, PRATD, PWENX, PWATD, ACTENZ, REREZ, and so on, which will be described later, for performing an access operation (read operation, write operation and refresh operation). Note that the command generation circuit 20 changes the output timing of part of control signals during the common interface mode and the normal operation mode. Details of the command generation circuit 20 are illustrated in FIG. 13.

Figure 17:
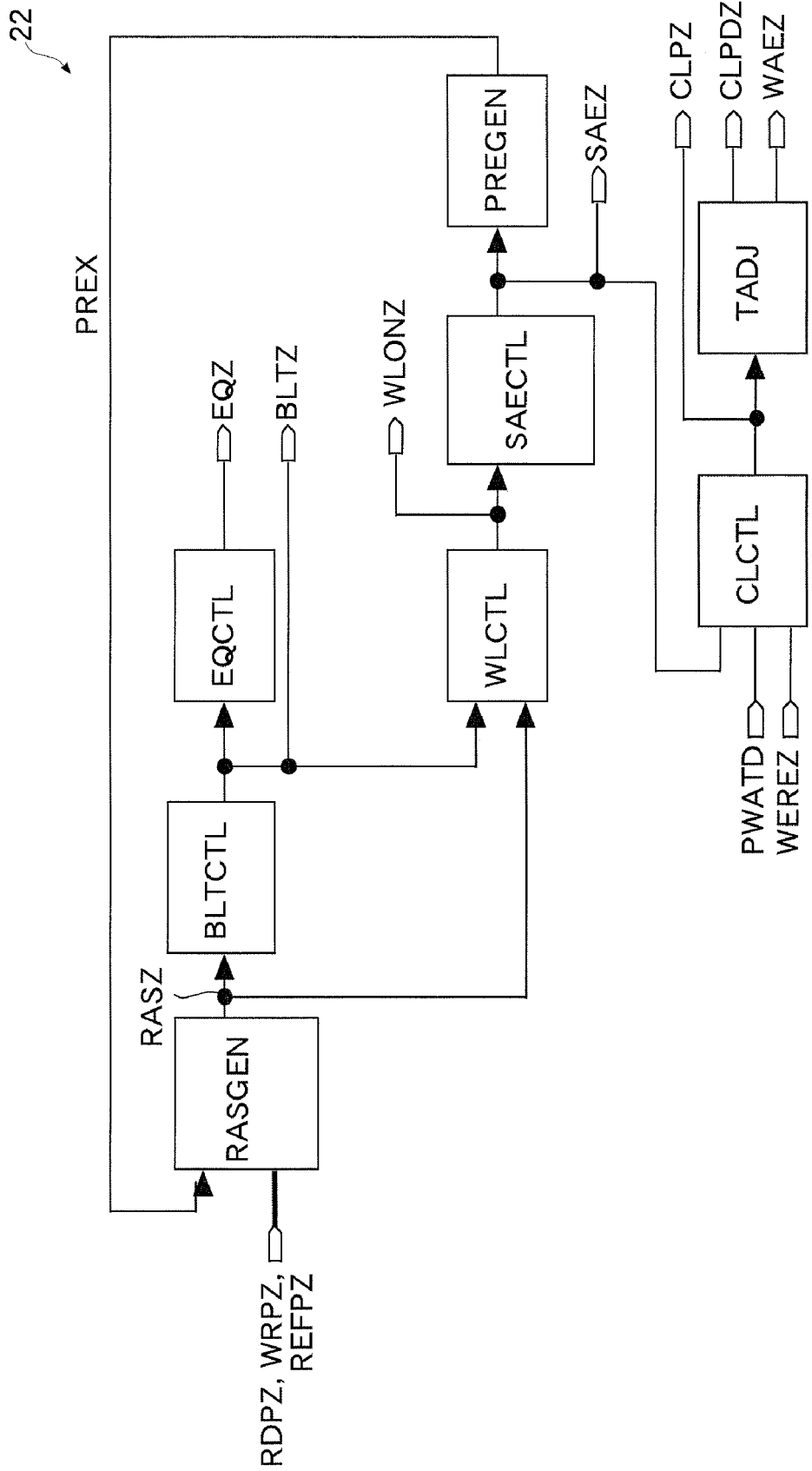
FIG. 17 illustrates details of a core control circuit illustrated in FIG. 4.

The core control circuit 22 changes the refresh signal REFZ to a high logic level when performing a refresh operation, and changes the refresh signal REFZ to a low logic level when not performing a refresh operation. In response to the read signal RDPZ, the write signal WRPZ or the refresh signal REFPZ, the core control circuit 22 outputs an access control signal (equalizing signal EQZ, bit control signal BLTZ, word control signal WLONZ, sense amplifier control signal SAEZ, column control signal CLPZ (CLPDZ), write amplifier control signal WAEZ, read amplifier control signal RAEZ, or the like) so as to control an access operation (read operation, write operation or refresh operation) of the memory core 40. Details of the core control circuit 22 are illustrated in FIG. 17.

The equalizing signal EQZ is a timing signal for precharging the bit lines BL, /BL. The bit control signal BLTZ is a timing signal for coupling a bit line pair BL, /BL to a sense amplifier SA. The word control signal WLONZ is a timing signal for activating the word lines WL. The sense amplifier control signal SAEZ is a timing signal for activating the sense amplifier SA. The column control signal CLPZ (CLPDZ) is a timing signal for turning on a column switch CSW for coupling a bit line pair BL, /BL to a data bus MDQ. The write amplifier control signal WAEZ is a timing signal for operating a write amplifier WA. The read amplifier control signal RAEZ is a timing signal for operating a read amplifier RA.

As illustrated in FIG. 15, FIG. 16, FIG. 28, FIG. 30 and so on, the command generation circuit 20 and the core control circuit 22 operate as an access control circuit which outputs to the memory core 40, during the normal operation mode, an access control signal for performing an access operation of the memory core 40 in response to access commands RD, WR supplied together with a column address signal CAD and a row address signal RAD, and outputs to the memory core 40, during the common interface mode, an access control signal in response to supply of column address signals IAD0-8 to the address switch circuit 32.

Figure 14:
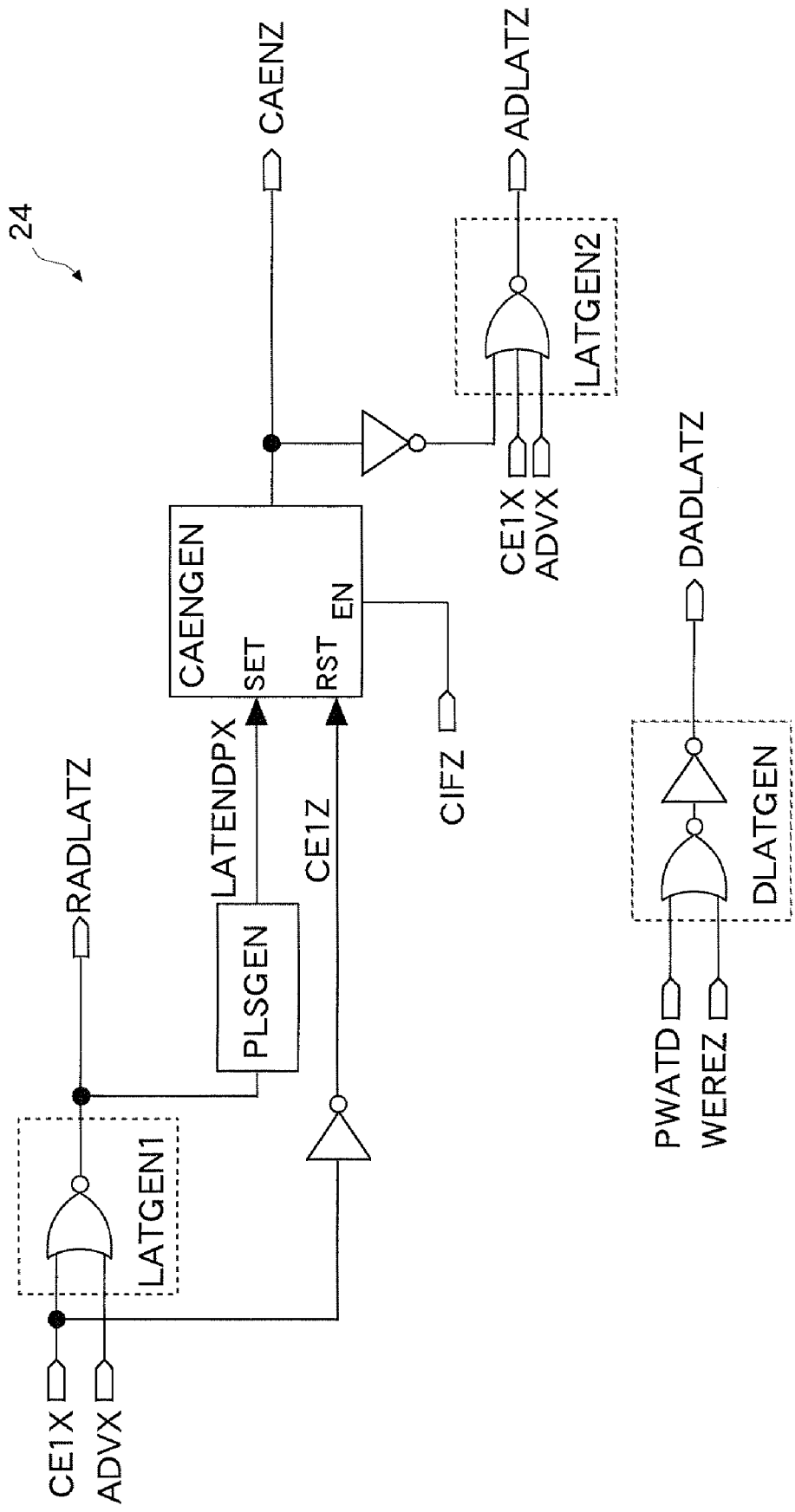
FIG. 14 illustrates details of an address control circuit illustrated in FIG. 4.

The address control circuit 24 outputs address latch signals ADLATZ, RADLATZ, PALATZ and a column address enable signal CAENZ for controlling the operation of the address switch circuit 32 according to the mode signal CIFZ and the chip enable signal CE1X, the address valid signal ADVX, or the like from the command buffer 18. The address latch signal ADLATZ and the column address enable signal CAENZ are also output to the command generation circuit 20. Details of the address control circuit 24 are illustrated in FIG. 14.

The refresh request generation circuit 26 has, for example, an oscillator which outputs an oscillating signal at a predetermined cycle. The refresh request generation circuit 26 divides the frequency of the oscillating signal to generate the refresh request signal RREQ (internal access request). The refresh request generation circuit 26 stops generation of the refresh request RREQ upon reception of a not-shown refresh disable signal when a refresh disable test command is supplied. Thus the refresh operation is disabled. Note that for disabling the refresh operation, the refresh disable signal may be supplied to the command generation circuit 20 so as to disable acceptance of the refresh request RREQ by the command generation circuit 20. The refresh address counter 28 sequentially generates a refresh address signal RRAD synchronously with the refresh request RREQ. The refresh address signal RRAD is a row address signal for selecting a word line WL.

The address buffer 30 receives an address signal AD (AD0-22) supplied to an address terminal AD as a row address signal RAD or a column address signal CAD, and outputs the received address signal as an internal address signal IAD (IAD0-22). As will be described later, in the normal operation mode, this memory MEM operates in an address non-multiplex mode in which the row address signal RAD and the column address signal CAD are received simultaneously at address terminals AD which are different from each other. Further, the memory MEM operates in the address multiplex mode in which the row address signal RAD and the column address signal CAD are received sequentially at a common address terminal AD during the common interface mode. The row address signal RAD is supplied for selecting a word line WL. The column address signal CAD is supplied for selecting a bit line pair BL, /BL.

Figure 18:
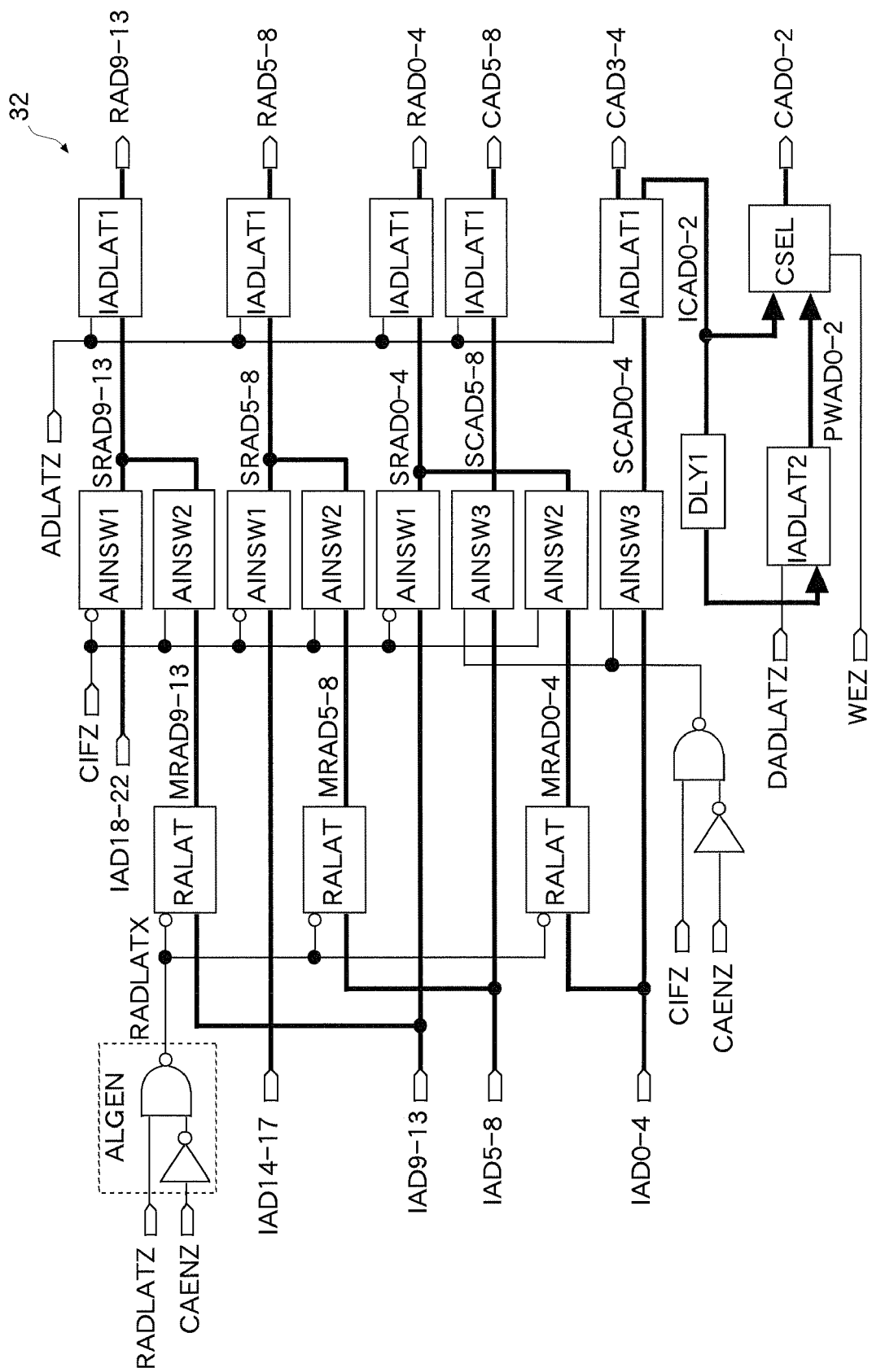
FIG. 18 illustrates details of an address switch circuit illustrated in FIG. 4.

During the normal operation mode, the address switch circuit 32 outputs an address signal supplied to address terminals AD0-8 as a column address signal CAD, and outputs an address signal supplied to the address terminals AD9-22 as a row address signal RAD. During the common interface mode, the address switch circuit 32 outputs an address signal which is supplied first to address terminals AD0-13 as a row address signal RAD, and outputs an address signal supplied next to the address terminals AD0-8 as a column address signal CAD. Details of the address switch circuit 32 are illustrated in FIG. 18.

The address selection circuit 34 selects the refresh address signal RRAD (REFZ=high level) when performing the refresh operation or selects the row address signal RAD (REFZ=low level) when not performing the refresh operation, and outputs the selected signal to the memory core 30 as an internal row address signal IRAD. The data input/output buffer 36 receives a write data signal via the data terminal DQ (of 16 bits for example), and outputs the received data signal to the data bus DB. Further, the data input/output buffer 36 receives a read data signal from later described memory cells MC via the data bus DB, and outputs the received data signal to the data terminal DQ.

Figure 22:
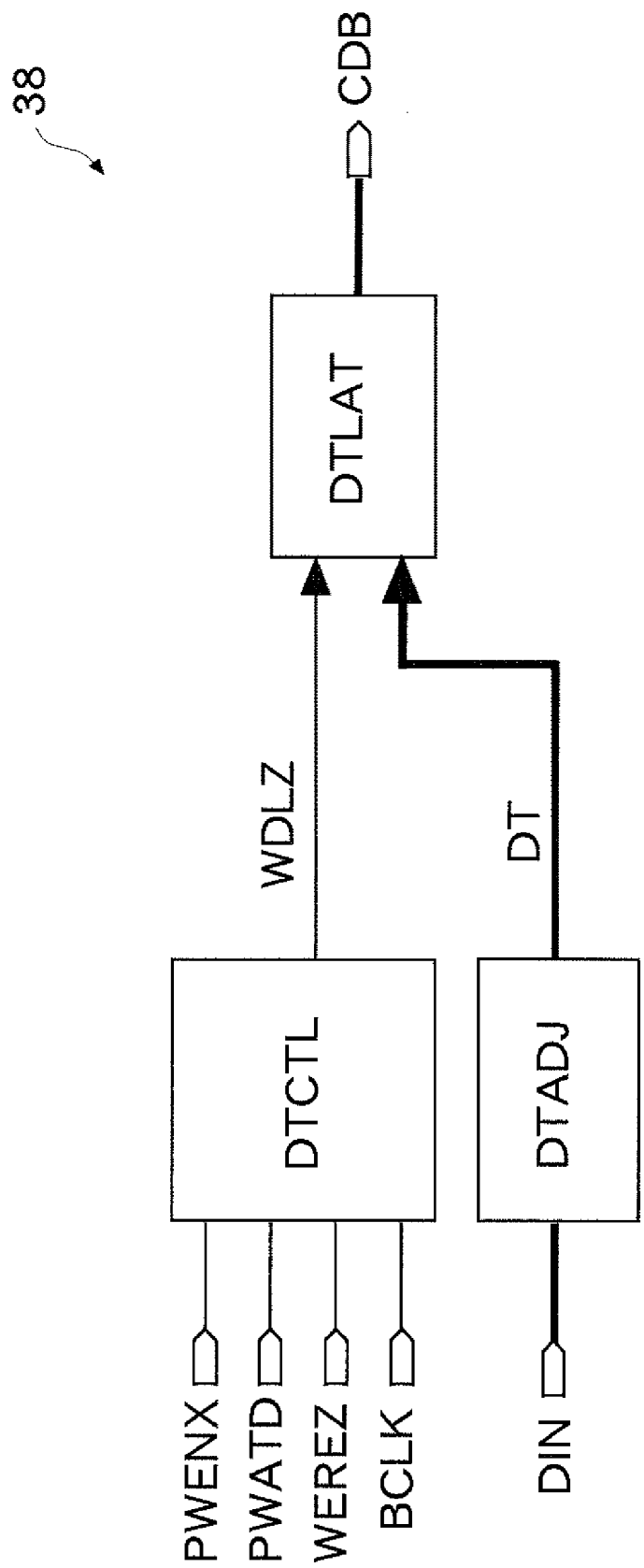
FIG. 22 illustrates details of a data control circuit illustrated in FIG. 4.

The data control circuit 38 outputs a write data signal DIN to the data bus DB corresponding to column address signals CAD0-2 upon a write operation. The data control circuit 38 selects read data on the data bus DB according to the column address signals CAD0-2 upon a read operation, and outputs the data as a read data signal DOUT. Details of the data control circuit 38 are illustrated in FIG. 22.

The memory core 40 has a memory block MBLK, a column decoder CDEC, a read amplifier RA and a write amplifier WA. The memory block MBLK has row blocks RBLK (RBLK0-1; memory blocks), row decoders RDEC corresponding to the row blocks RBLK0-1, and a sense amplifier area SAA arranged between the row blocks RBLK0-1. Note that the number of row blocks RBLK may be four, eight, ten, or the like. The row decoder RDEC selects a word line WL according to the row address signal RAD. The sense amplifier area SAA has precharge circuits PRE and coupling switches BT corresponding respectively to the row blocks RBLK0-1 as well as a sense amplifier SA and a column switch CSW shared by the row blocks RBLK0-1.

Figure 23:
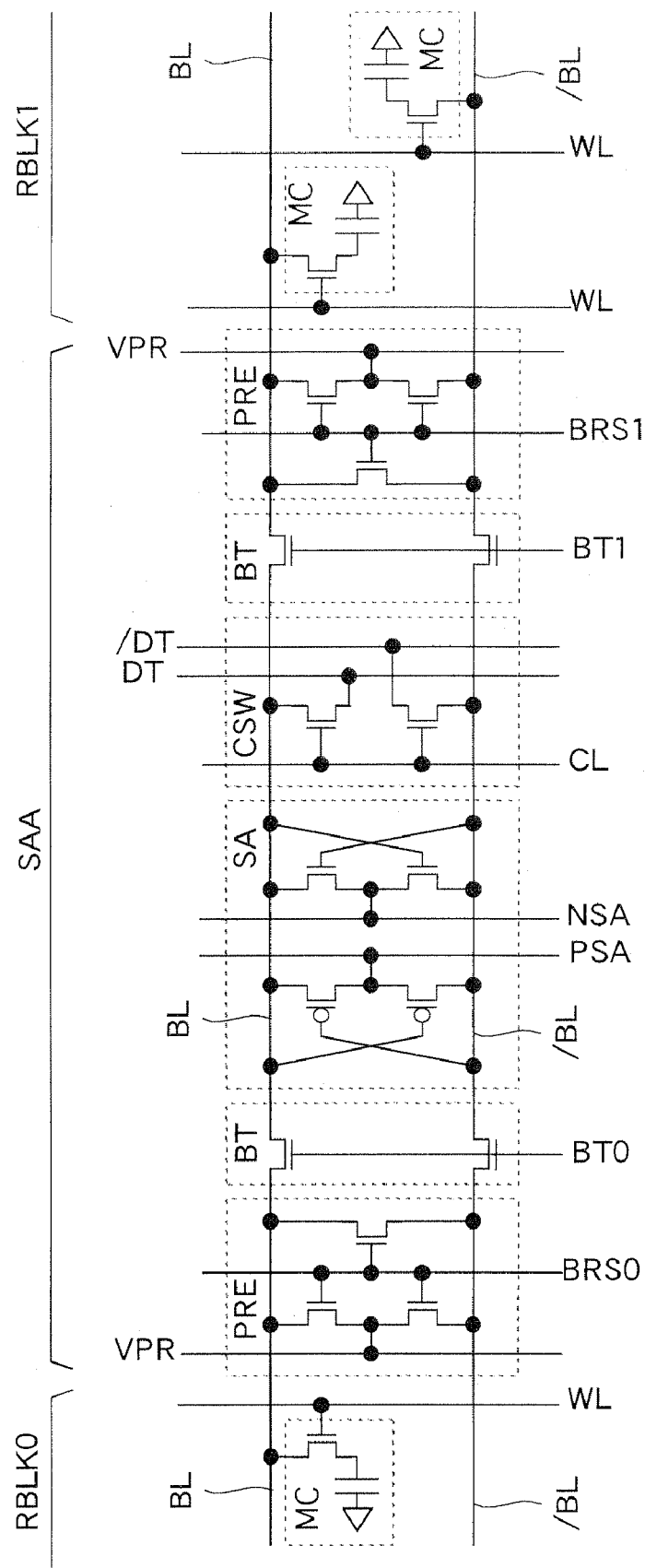
FIG. 23 illustrates details of a substantial part of a memory core illustrated in FIG. 4.

The column decoder CDEC selects the bit lines BL, /BL according to the column address signal CAD. Specifically, the column decoder CDEC decodes column address signals CAD3-8 so as to select a number of bit line pairs BL, /BL corresponding to the maximum burst length. The read amplifier RA amplifies complementary read data which are output to the data bus MDQ via the column switch CSW upon a read access operation. The write amplifier WA amplifies complementary write data supplied via the common data bus DB upon a write access operation, and supplies the amplified data to the bit line pair BL, /BL. Details of the memory core 40 are illustrated in FIG. 23.

Figure 36:
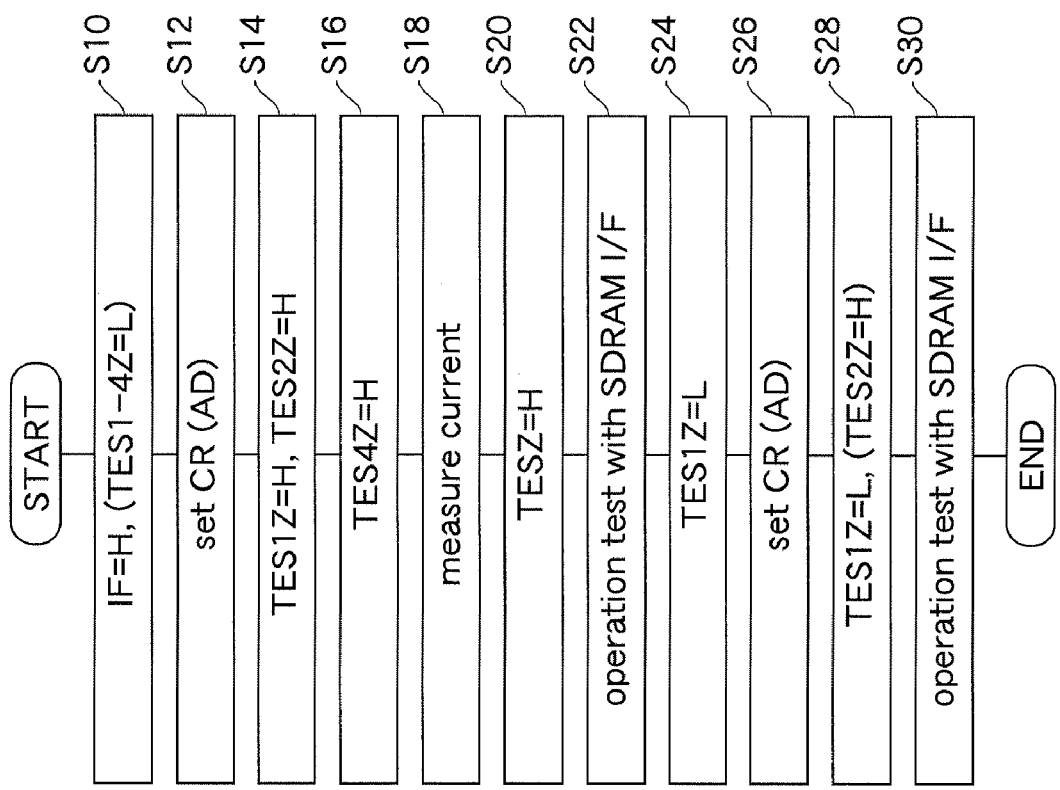
FIG. 36 illustrates a test method of memories using the common interface mode.

FIG. 5 illustrates details of the IF control circuit 12 illustrated in FIG. 4. The IF control circuit 12 has selectors SEL1, SEL2, a resistor R1 and a switch circuit SW1. The selector SELL outputs the value of the test pad IF as the mode signal CIFZ when a test signal TES1Z (mode selection control signal) is at a low logic level, and outputs the value of a test signal TES2Z (mode switch signal) as the mode signal CIFZ when the test signal TES1Z is at a high logic level. Accordingly, when the test pad IF is coupled to a power supply line or the like, the operation mode of the memory MEM can be changed as illustrated in FIG. 36 and so on, which will be described later.

The selector SEL2 outputs the value of the test pad IF as the register set signal CCRZ when the test signal TES1Z is at a low logic level, and outputs the value of the test signal TES3Z (register switch signal) as the register set signal CCRZ when the test signal TES1Z is at a high logic level. Accordingly, when the test pad IF is coupled to a power supply line or the like, a setting method for the configuration register 16 can be changed as illustrated in FIG. 36 and so on, which will be described later.

The switch circuit SW1 turns on when the test signal TES4Z (cut-off signal) is at a low logic level, and couples the test pad IF to a ground line (voltage line to which a predetermined voltage is supplied). The switch circuit SW1 turns off when the test signal TES4Z is at a high logic level, and sets the test pad IF to a floating state. By turning off the switch circuit SW1, it is possible to prevent flow of leak current from the test pad IF to the ground line when the test pad IF is coupled to a power supply line or the like. Therefore, a current value can be measured precisely in the test of the memory MEM.

FIG. 6 illustrates an operation of the test entry circuit 10 during the common interface (IF) mode. The clock signal CLK shown by a dashed line is not actually supplied to the memory MEM, but denotes a cycle generated by the command signals /CE1, /ADV, /WE, /OE. The test entry circuit 10 operates without receiving the clock signal CLK at the clock terminal CLK. In the common interface mode (CIFZ=H level), test commands TEST1-TEST8 (test patterns) used for test mode entry of the SDRAM illustrate in FIG. 8 are supplied to the memory MEM. In FIG. 6, a /UB signal and a /LB signal are inactivated to a high logic level, and hence the command signal supplied to the memory MEM is an illegal command that is not used for a normal access operation.

During the common interface mode, the test entry circuit 10 receives column address signals CAD0-8 (AD0-8; sub-test code SCD) synchronously with the fourth falling edge of the /OE signal, when the test commands TEST1-8 are correct. When row address signals RAD0-13 (AD0-13; main test code MCD) supplied together with the first test command TEST1 and the sub-test code SCD indicate a set of test signals TESZ, the test entry circuit 10 activates the corresponding test signal TESZ for testing the internal circuit of the memory core 40 or the like, and thereby enters the test mode for testing the memory MEM. In this manner, during the common interface mode, the test entry circuit 10 receives sequentially the main test code MCD and the sub-test code SCD as the row address signal RAD and the column address signal CAD (address multiplex).

Although not illustrated in the drawings, when the main test code MCD and the sub-test code SCD indicate reset of the test signal TESZ, the test entry circuit 10 inactivates the corresponding test signal TESZ.

FIG. 7 illustrate an operation of the test entry circuit 10 during the FCRAM interface (IF) mode (normal operation mode). In the normal operation mode, the main test code MCD and the sub-test code SCD are received at once as the row address signals RAD0-13 (AD9-22) and the column address signals CAD0-8 (AD0-8). Accordingly, the test patterns for activating the test signal TES1Z or the like are one less than in FIG. 6. The other operation is the same as in FIG. 6.

FIG. 8 illustrates test mode entry of the SDRAM. In the SDRAM, for example, the test signal TESZ is activated according to the row address signals RAD0-13 (AD0-13; main test code MCD) supplied together with twice of illegal commands and the column address signals CAD0-8 (AD0-8; sub-test code SCD). Thereafter, a dummy sub-test codes DSCD is supplied six times.

In the common interface mode illustrated in FIG. 6, similarly to the SDRAM, the main test code MCD and the sub-test code SCD are received by the address multiplex type, which allow to enter the test mode or exit the test mode. Accordingly, when the memory MEM is tested, the address terminals AD14-22 can be left unused, and thus the number of memories MEM that can be tested by an LSI tester at once can be increased. Further, the test patterns TEST1-TEST8 supplied for test mode entry can be made common to those of the SDRAM. Therefore, except a definition file that defines timings of signals supplied to respective terminals, the test program can be made common to that for the SDRAM.

FIG. 9 illustrates details of the CR control circuit 14 and the configuration register 16 illustrated in FIG. 4. The CR control circuit 14 has an address judge circuit ADJDG, a CR-set control circuit CRSET and a plurality of selectors SEL corresponding to bits REG of the configuration register 16. When the register set signal CCRZ is at a low logic level, the address judge circuit ADJDG changes the address decision signal CRADZ to a high logic level when the address signals RAD, CAD are all at a high logic level, and changes the address decision signal CRADZ to a low logic level when any one bit of the address signals RAD, CAD is at a low logic level. Further, when the register set signal CCRZ is at a high logic level, the address judge circuit ADJDG sets the address decision signal CRADZ to a high logic level regardless of the values of the address signals RAD, CAD.

The CR-set control circuit CRSET detects a read command and a write command supplied from the outside of the memory MEM as a read signal RDPZ and a write signal WRPZ. The CR-set control circuit CRSET sequentially outputs the set pulse signals SETP0Z, SETP1Z when the address decision signals CRADZ corresponding to the detected commands are all at a high logic level and the supply sequence of the commands and the number of times of supply are the same as rules which are defined in advance. When the register set signal CCRZ is at a low logic level, the selector SEL outputs a data signal DQ supplied to the common data bus CDB as a register set bit CRBIT. When the register set signal CCRZ is at a high logic level, the selector SEL outputs the values of the address signals RAD, CAD as register set bits CRBIT.

The configuration register 16 has two registers REG0 (REG00, REC10, REG20, . . . ) and REG1 (REG01 REG1, REG21, . . . ) for each of the register set bits CRBIT. The register REG0 stores the value of the register set bit CRBIT synchronously with the set pulse signal SETP0Z, and outputs it as a register signal CR0 (CR00, CR10, CR20, . . . ). The register REG1 stores the value of the register set bit CRBIT synchronously with the set pulse signal SETP1Z, and outputs it as a register signal CR1 (CR01, CR11, CR21, . . . ).

Figure 10:
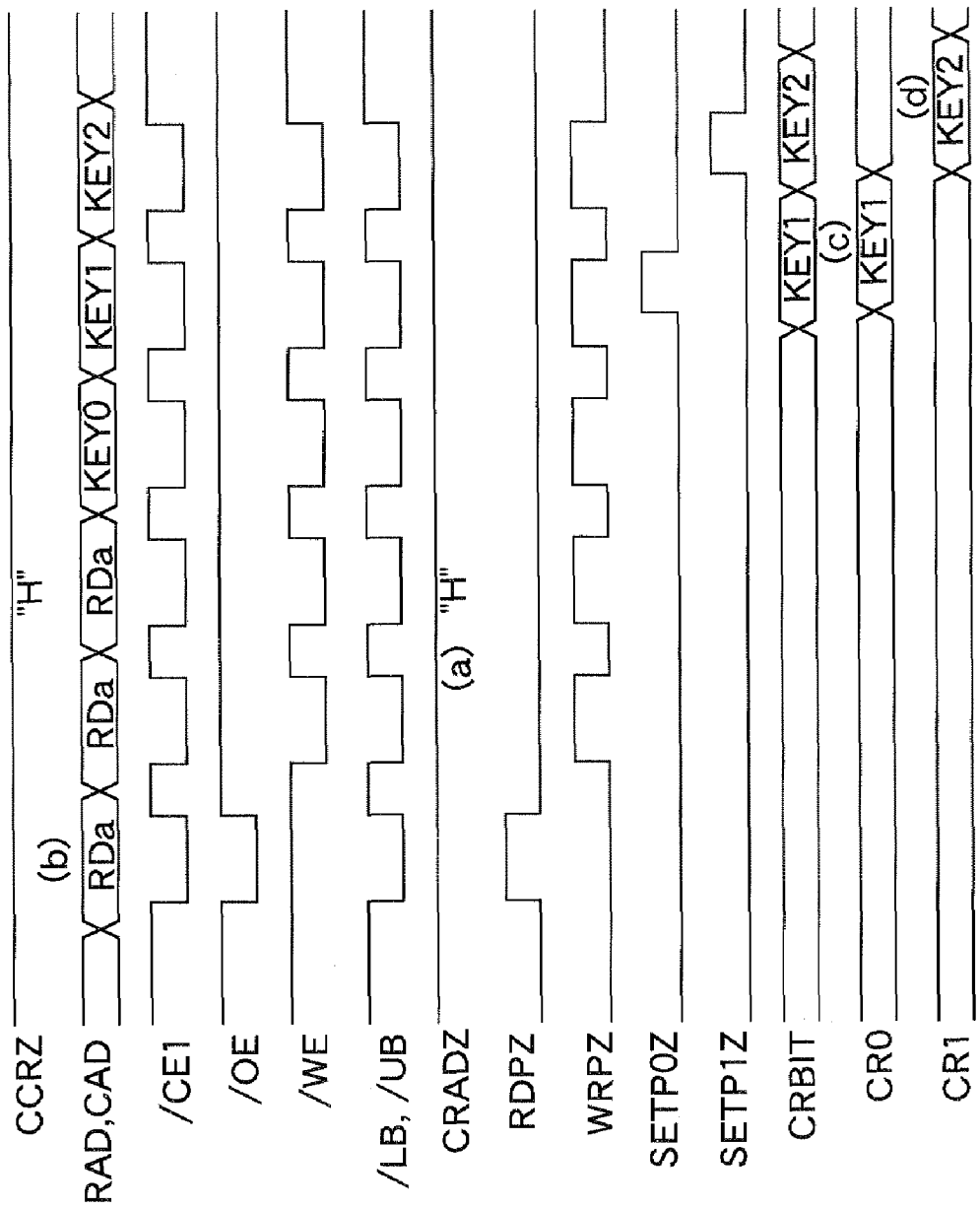
FIG. 10 illustrates operations of the CR control circuit and the configuration register in the common interface mode.

FIG. 10 illustrates operations of the CR control circuit 14 and the configuration register 16 in the common interface mode. In the common interface mode, the address decision signal CRADZ is fixed to a high logic level H regardless of the address signals RAD, CAD (FIG. 10 (a)). Accordingly, the address signals RAD, CAD can be supplied sequentially with the same values (RDa, RDa, RDa, KEY0-2) as the data signal DQ illustrated in FIG. 12 (FIG. 10 (b)). In other words, during the common interface mode, the same test patterns as those for the mode register setting of the SDRAM which is set using address signals can be used to set the configuration register 16.

When the memory MEM is supplied with a read command RD once and a write command WR five times continuously, the CR control circuit 14 writes values of the address signals RAD, CAD supplied together with last two times of the write commands WR as codes KEY1, KEY2 respectively to the register REG0, REG1 of the configuration register 16 (FIG. 10 (c, d)). Then, the configuration register 16 outputs the register signals CR0, CR1 corresponding to the written values. Note that regarding the code KEY0, for example, a set operation of the configuration register 16 is performed when the least significant bit is a high logic level, and a verify operation of the configuration register 16 is performed when the least significant bit is a low logic level.

Figure 11:
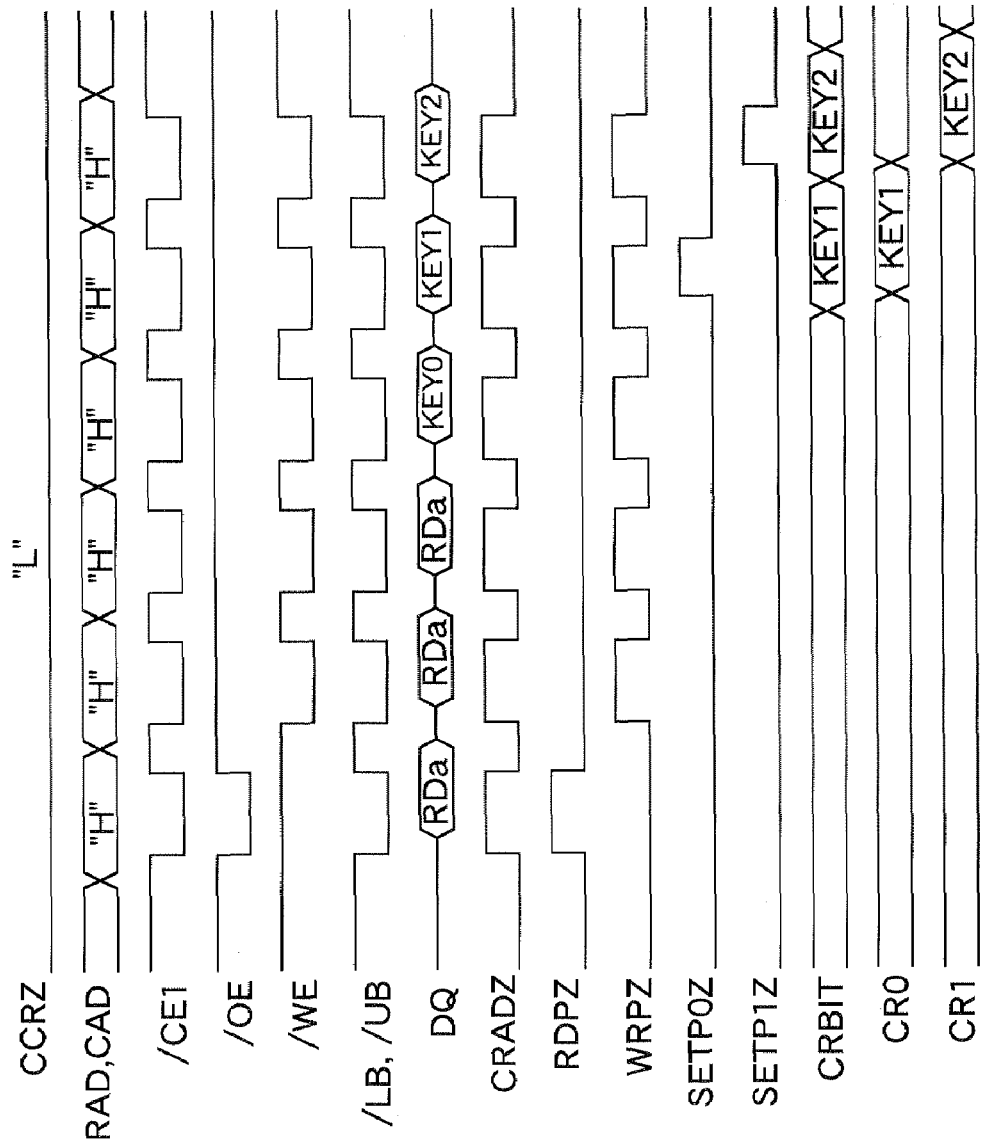
FIG. 11 illustrates operations of the CR control circuit and the configuration register in the FCRAM interface mode.

FIG. 11 illustrates operations of the CR control circuit 14 and the configuration register 16 during the FCRAM interface (IF) mode. In the normal operation mode, the CR control circuit 14 outputs the set pulse signals SETP0Z, SETP1Z sequentially when values of the address signals RAD, CAD are all at a high logic level H (FIG. 11 (a)). Then, the CR control circuit 14 writes values of the data signal DQ supplied together with the last two times of the write commands WR as codes KEY1, KEY2 respectively to the registers REG0, REC1 of the configuration register 16 (FIG. 11 (b, c)). Except that the setting of the registers REG0, REG1 is performed using the value of the data signal DQ, the operation in FIG. 11 is the same as in FIG. 10.

Figure 12:
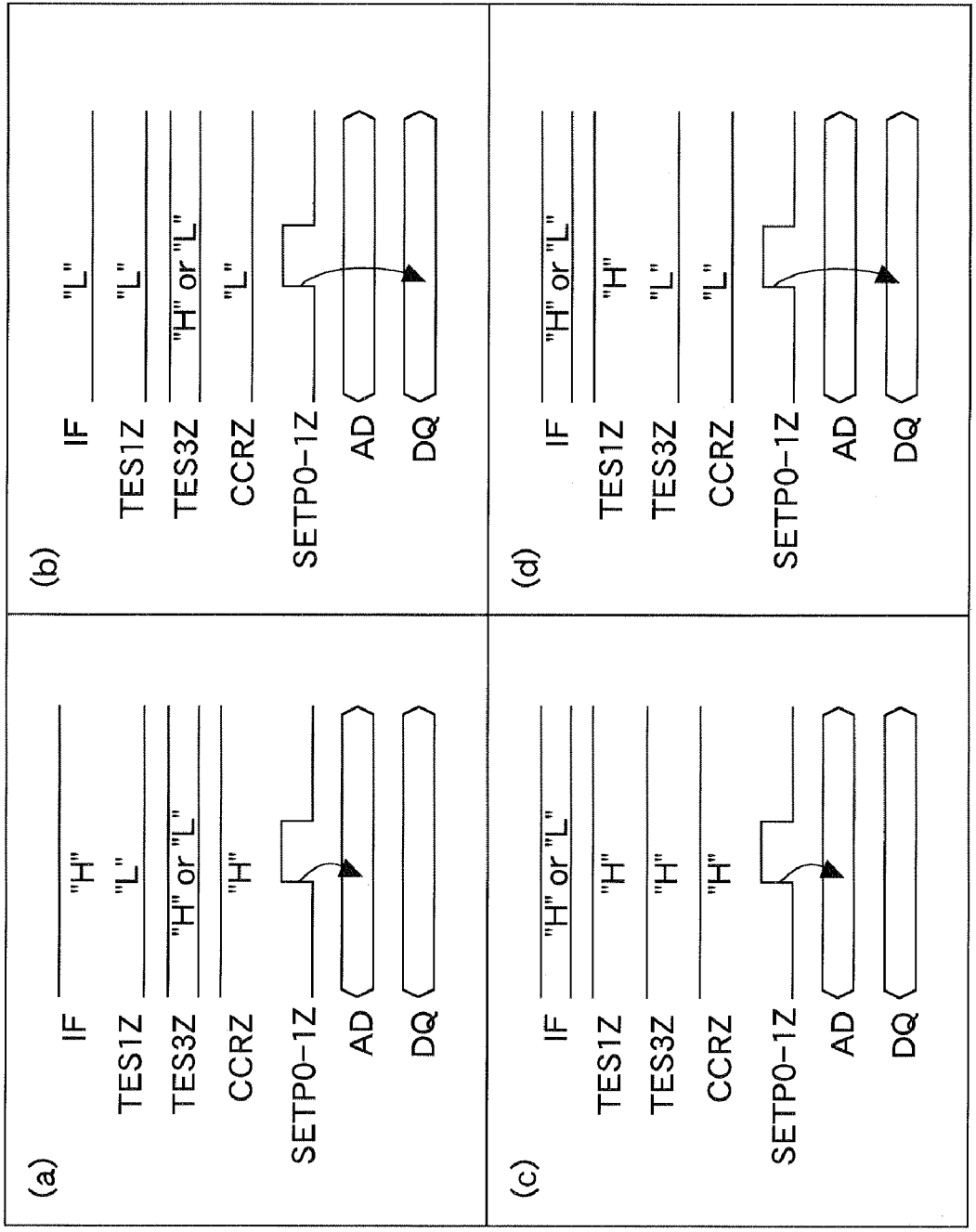
FIG. 12 illustrates an overview of operations of the CR control circuit and the configuration register illustrated in FIG. 9.

FIG. 12 illustrates an overview of operations of the CR control circuit 14 and the configuration register 16 illustrated in FIG. 9. When the test signal TES1Z is set to a low logic level L, the logic of the register set signal CCRZ is the same as the logic of the test pad IF (FIG. 12 (a, b)). When the test pad IF is supplied with a high logic level H, the configuration register 16 is set according to the address signal AD (FIG. 12 (a)). When the test pad IF is supplied with a low logic level L, the configuration register 16 is set according to the data signal DQ (FIG. 12 (b)).

On the other hand, when the test signal TES1Z is set at a high logic level H, the logic of the register set signal CCRZ is the same as the logic of the test signal TES3Z (FIG. 12 (c, d)). When the test signal TES3Z is supplied with a high logic level H, the configuration register 16 is set according to the address signal AD (FIG. 12 (c)). When the test signal TES3Z is supplied with a low logic level L, the configuration register 16 is set according to the data signal DQ (FIG. 12 (d)).

FIG. 13 illustrates details of the command generation circuit 20 illustrated in FIG. 4. The command generation circuit 20 has transition edge detectors ATDGEN1-6 which detect a transition edge of an input signal, a pulse extension circuit EXTPLS, a NAND gate, a mask circuit MSK1, an arbiter ARB and a command output control circuit CMDCTL.

The transition edge detector ATDGEN1 operates during activation of the column address enable signal CAENZ, and outputs a detection pulse ADT1 when it detects a transition edges of each of the address signals CAD3-8. The transition edge detectors ATDGEN2 operates during activation of the column address enable signal CAENZ, and outputs a detection pulse ADT2 when it detects a rising edge (assert timing) of each of the chip enable signal CE1Z and the address valid signal ADVZ. The transition edge detector ATDGEN3 operates during activation of the column address enable signal CAENZ, and outputs a detection pulse ADT3 when it detects a rising edge (assert timing) of each of the upper byte control signal UBZ and the lower byte control signal LBZ.

The transition edge detector ATDGEN4 operates during activation of the column address enable signal CAENZ, and outputs a pulsed write end signal WEREZ when it detects a rising edge (negate timing) of the write enable signal WEX. The transition edge detector ATDGEN5 (write transition edge detector) outputs a pulsed read address transition signal PRATD when it detects transition edges of the column address signals CAD0-2 in a period in which the address latch signal ADLATZ is at a high logic level during a read operation (OEZ signal=high logic level). The transition edge detector ATDGEN6 outputs a write detection pulse PWATD when it detects transition edges of the column address signals CAD0-2 in a period in which the address latch signals ADLATZ is at a high logic level during a write operation (while the write command signal WEZ is at a high logic level).

The pulse extension circuit EXTPLS delays falling edges of the detection pulses ATD1-3 and extends pulse widths and inverts thereof so as to perform a logical operation in the NAND gate. Then, the mask circuit MSK1 generates the active enable signal ACTENZ synchronously with the detection pulses ATD1-3 having latest rising edges while it receives the mode signal CAENZ at a high logic level (namely, during row address are latched in the common interface mode, or during the normal interface mode). Accordingly, an access operation can be started after all the necessary signals for the access operation are gathered, and hence a malfunction of the memory core 40 can be prevented. The mask circuit MSK1 stops masking of ATD signal and transmits it to the active enable signal ACTENZ while the mode signal CIFZ is at a low logic level (namely, during the normal operation mode). The active enable signal ACTENZ is a trigger signal for starting an access operation of the memory core 40.

When a read command RD and a write command WR conflict with a refresh request RREQ, the arbiter ARB determines the order of priority thereof as described above, and outputs a read signal RDZ, a write signal WRZ or a refresh signal RFZ according to the determined order of priority. The activated state of the read signal RDZ, the write signal WRZ or the refresh signal RFZ is held in the arbiter ARB until the read signal RDPZ, the write signal WRPZ or the refresh signal REFPZ is output from the command output control circuit CMDCTL.

The command output control circuit CMDCTL outputs the read signal RDPZ, the write signal WRPZ (access request signal) or the refresh signal REFPZ in response to activation of the read signal RDZ, the write signal WRZ (access command) or the refresh signal RFZ during activation of the active enable signal ACTENZ. The command output control circuit CMDCTL disables output of the read signal RDPZ, the write signal WRPZ or the refresh signal REFPZ during inactivation of the active enable signal ACTENZ, and outputs the read signal RDPZ, the write signal WRPZ or the refresh signal REFPZ synchronously with a rising edge of the active enable signal ACTENZ.

The transition edge detectors ATDGEN1-3, the pulse extension circuit EXTPLS and the mask circuit MSK1 keeps activating the active enable signal ACTENZ during the normal operation mode, and operates during the common interface mode as an active control circuit which activates the active enable signal ACTENZ in response to supply of the column address signals CAD3-8. Note that ATDGEN1s are also used for AD14-22 during the normal interface mode, which is not shown in FIG. 13.

FIG. 14 illustrates details of the address control circuit 24 illustrated in FIG. 4. The address control circuit 24 has latch signal generators LATGEN1, LATGEN2, a pulse generator PLSGEN, a CA-enable generator CAENGEN (flip-flop circuit) and a delay latch generator DLATGEN. The latch signal generator LATGEN1 activates the row address latch signal RADLATZ when the chip enable signal CE1X and the address valid signal ADVX are both activated. The latch signal generator LATGEN2 activates the address latch signal ADLATZ when the chip enable signal CE1X and the address valid signal ADVX are both activated during activation of the column address enable signal CAENZ.

The pulse generator PLSGEN generates a latch enable signal LATENDPX synchronously with a falling edge of the row address latch signal RADLATZ. The CA-enable generator CAENGEN operates during activation of the mode signal CIFZ (during the common interface mode), and is set synchronously with the latch enable signal LATENDPX to activate the column address enable signal CAENZ, and inactivates the column address enable signal CAENZ synchronously with a falling edge of the chip enable signal CE1Z. Further, the CA-enable generator CAENGEN stops to operate during inactivation of the mode signal CIFZ (during the normal operation mode), and fixes the column address enable signal CAENZ to an activated level (high logic level). The delay latch generator DLATGEN activates a delayed address latch signal DADLATZ synchronously with the write detection pulse PWATD or the write end signal WEREZ.

Figure 15:
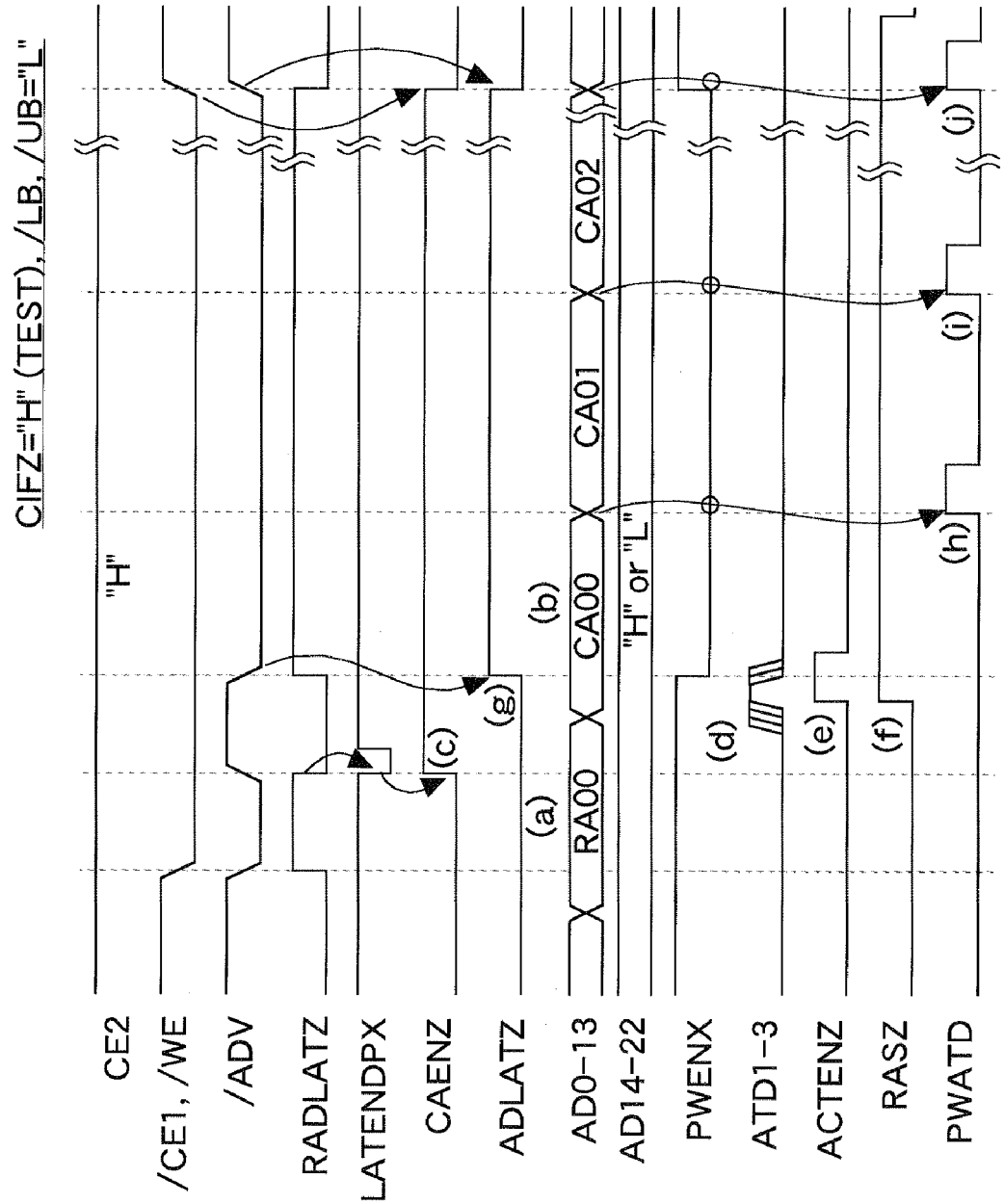
FIG. 15 illustrates operations of the address control circuit and the command generation circuit in a write operation during the common interface mode.

FIG. 15 illustrates operations of the address control circuit 24 and the command generation circuit 20 in a write operation during the common interface mode. In the common interface mode, the memory MEM operates with the same interface specification as that of the SDRAM. Accordingly, a row address RA00 (AD0-13) are supplied synchronously with a first address valid signal /ADV, and a column address signal CA00 (AD0-8) is supplied synchronously with a next address valid signal /ADV (FIG. 15 (a, b)). The address terminals AD14-22 are open during the common interface mode (test mode), and values of address signals AD14-22 are indefinite (H level or L level).

Figure 24:
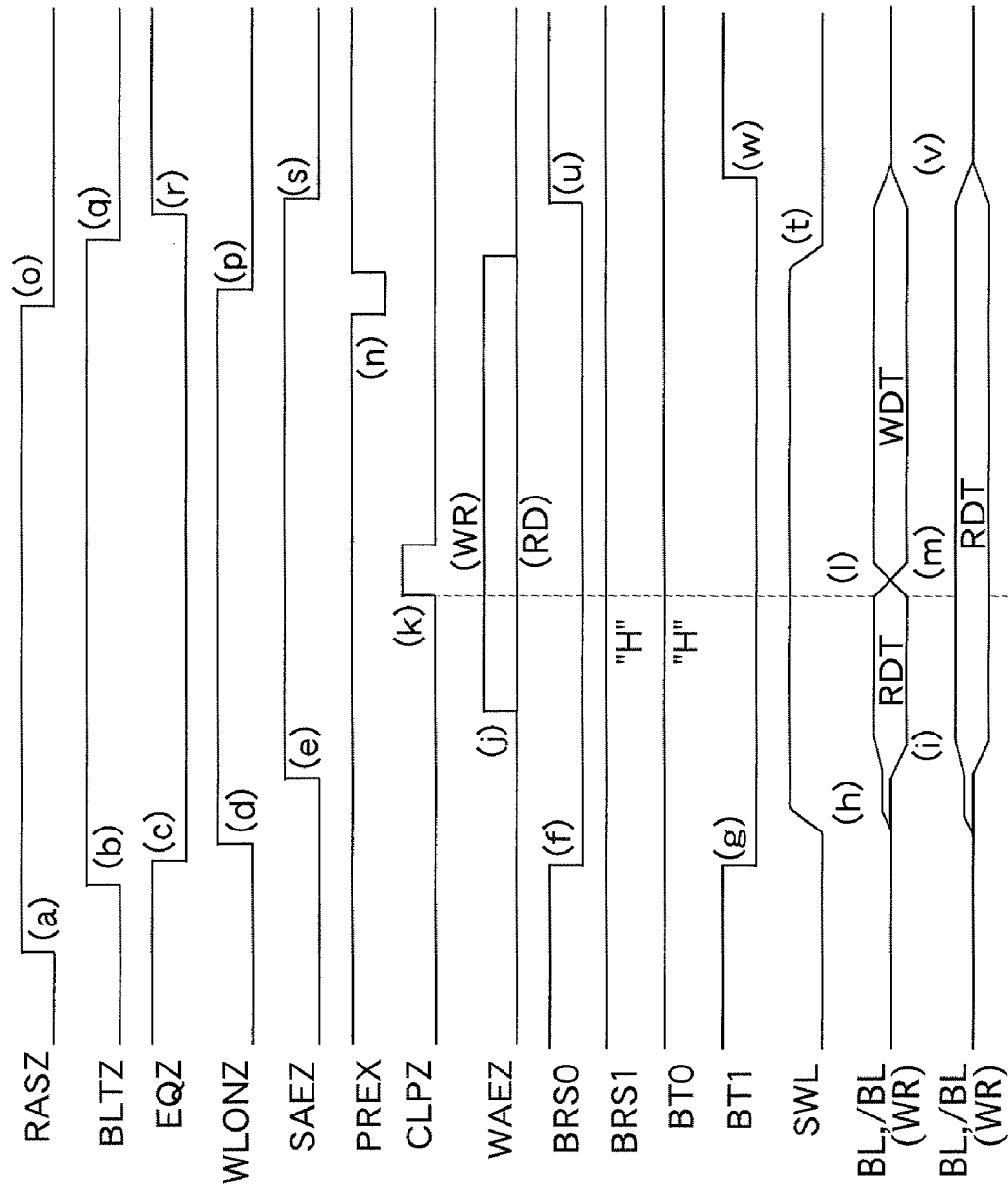
FIG. 24 illustrates operations of the core control circuit illustrated in FIG. 17 and the memory core illustrated in FIG. 23.

The latch enable signal LATENDPX is generated synchronously with a rising edge of the first address valid signal /ADV, and the column address enable signal CAENZ becomes active (FIG. 15 (c)). Accordingly, the transition edge detectors ATDGEN1-4 start to operate, the detection pulses ADT1-3 are output (FIG. 15 (d)), and the active enable signal ACTENZ is output (FIG. 15 (e)). Note that a RAS generation circuit RASGEN in FIG. 17 outputs a basic timing signal RASZ corresponding to the read signal RDPZ, the write signal WRPZ or the refresh signal REFPZ so as to perform an access operation only when the active enable signal ACTENZ is at a high level (FIG. 15 (f)). Then, as illustrated in FIG. 24, the access operation (activation of the word line WL) is started.

Figure 28:
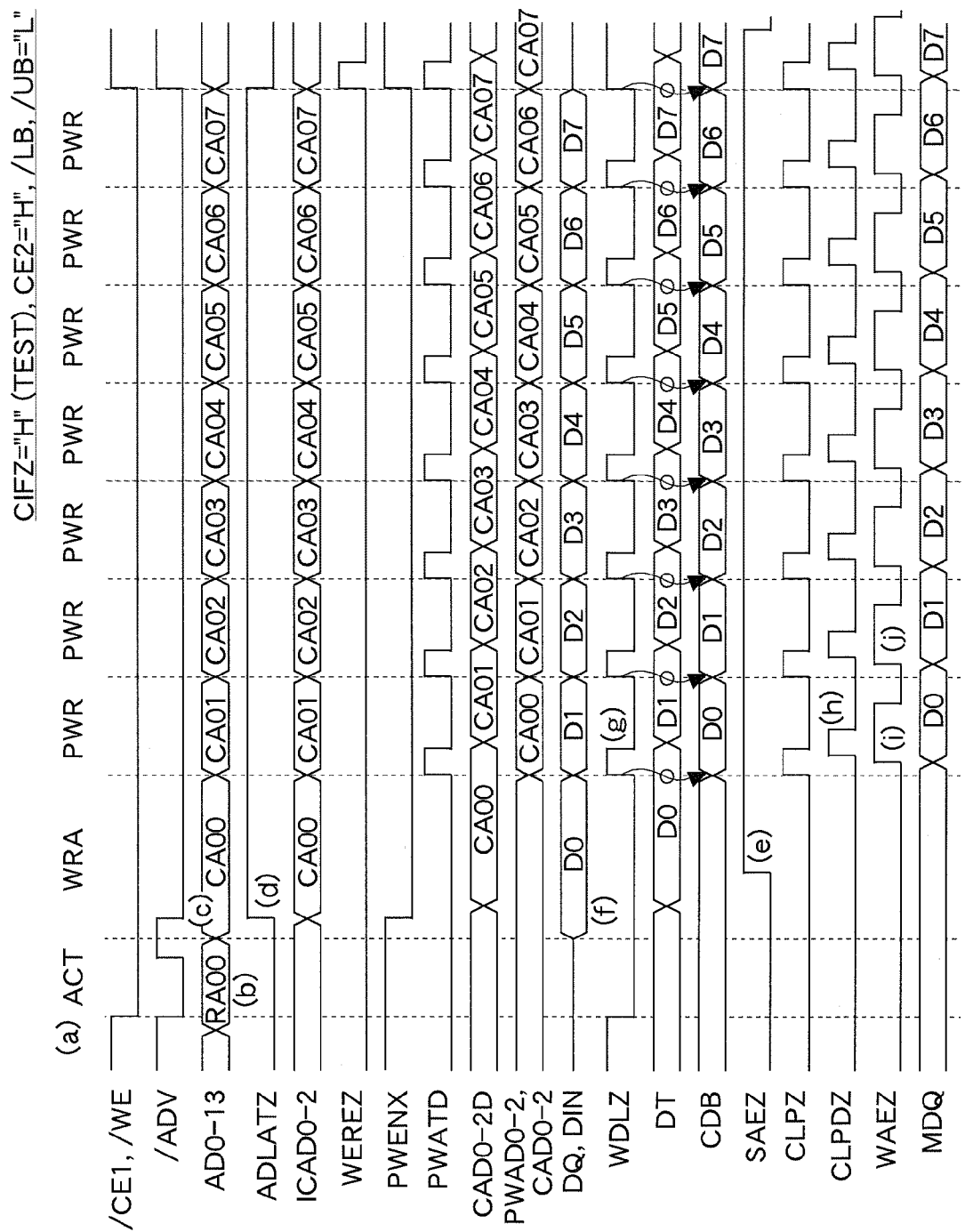
FIG. 28 illustrates a write operation in the common interface mode.

During activation of the column address enable signal CAENZ, the address control circuit 24 synchronizes with the address valid signal /ADV to activate an address latch signal ADLATZ (FIG. 15 (g)). The transition edge detector ATDGEN6 outputs a write detection pulse PWATD synchronously with changes of the column address signals CAD0-2 so as to perform a page write operation (FIG. 15 (h, i, j)). The page write operation is illustrated in FIG. 28. In this embodiment, by generating the write detection pulse PWATD according to a change of the column address signal CAD, the page write operation can be performed without using the clock signal CLK. In other words, a test pattern for a burst write operation of the SDRAM can be used to test the memory MEM.

Figure 16:
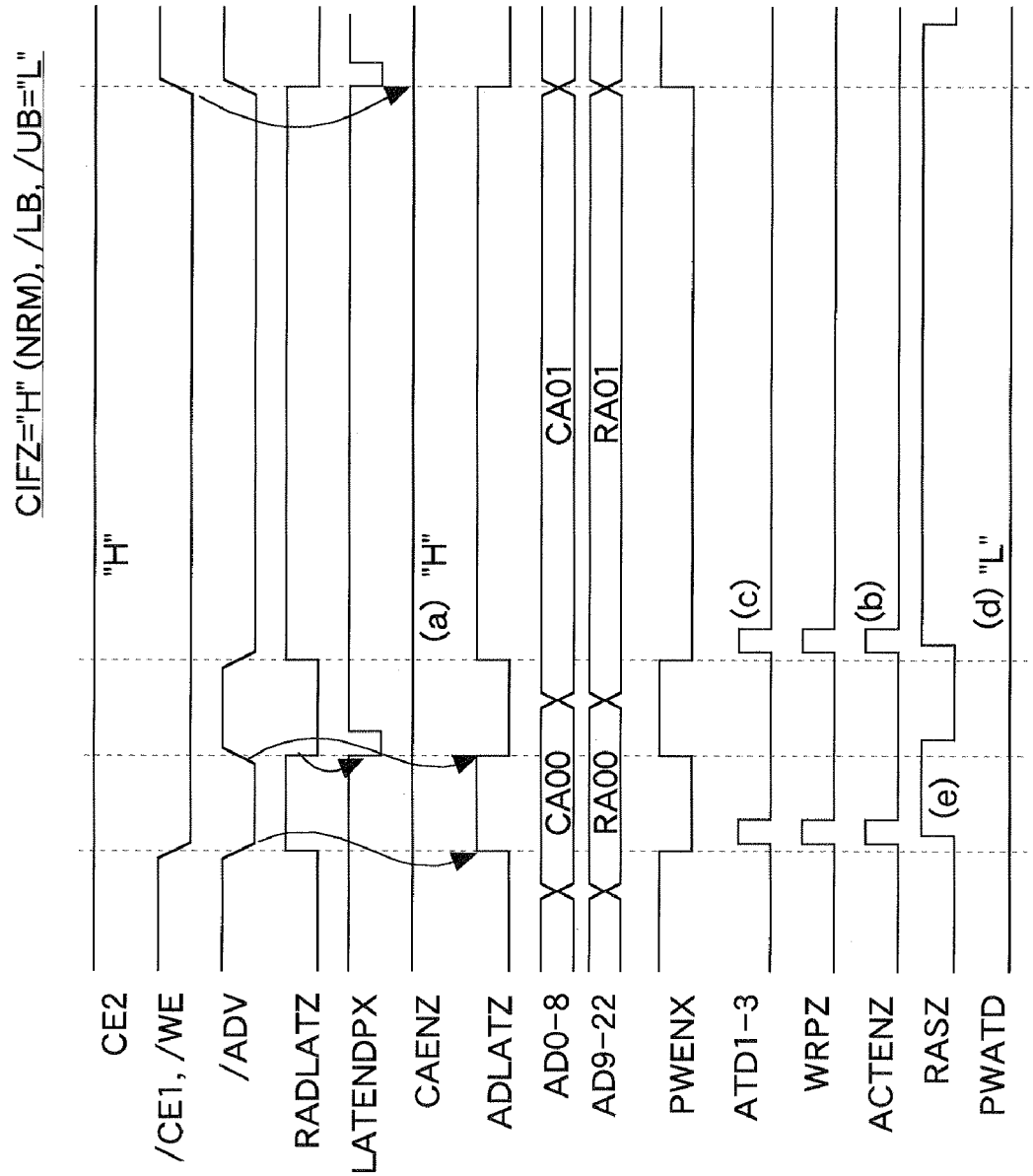
FIG. 16 illustrates operations of the address control circuit and the command generation circuit in a write operation during the FCRAM interface mode.

FIG. 16 illustrates operations of the address control circuit 24 and the command generation circuit 20 in a write operation during the normal operation mode. In the normal operation mode, the column address enable signal CAENZ and the active enable signal ACTENZ are asserted synchronously when the detection pulses ATD1-3 are generated (FIG. 16 (a, b, c)). The column address signals CAD0-2 change only during a low level period of the address latch signal ADLATZ, and hence the write detection pulse PWATD is not generated (FIG. 16 (d)). Since the active enable signal ACTENZ is at the high level, the RAS generation circuit RASGEN in FIG. 17 outputs a basic timing signal RASZ synchronously with the read signal RDPZ, the write signal WRPZ or the refresh signal REFPZ, so as to perform the access operation (FIG. 16 (e)). Then, as illustrated in FIG. 24, the access operation (activation of the word line WL) is started.

FIG. 17 illustrates details of the core control circuit 22 illustrated in FIG. 4. The core control circuit 22 has a RAS generation circuit RASGEN, a bit control circuit BLTCTL, an equalization control circuit EQCTL, a word control circuit WLCTL, a sense amplifier control circuit SAECTL, a precharge control circuit PREGEN, a column control circuit CLCTL and a timing adjustment circuit TADJ.

The RAS generation circuit RASGEN generates a basic timing signal RASZ in response to the read signal RDPZ, the write signal WRPZ or the refresh signal REFPZ. The bit control circuit BLTCTL generates the bit control signal BLTZ according to the basic timing signal RASZ. The equalization control circuit EQCTL generates the equalization control signal EQZ according to the bit control signal BLTZ. The word control circuit WLCTL generates the word control signal WLONZ according to the bit control signal BLTZ and the basic timing signal RASZ. The sense amplifier control circuit SAECTL generates the sense amplifier control signal SAEZ according to the word control signal WLONZ. The precharge control circuit PREGEN generates a precharge control signal PREX according to the sense amplifier control signal SAEZ. The precharge control signal PREX is used for inactivating the basic timing signal RASZ.

The column control circuit CLCTL generates the column control signal CLPZ according to the write detection pulse PWATD and the write end signal WEREZ in an activation period of the sense amplifier control signal SAEZ upon a write operation. The column control circuit CLCTL generates the column control signal CLPZ synchronously with activation of the sense amplifier control signal SAEZ upon a read operation. The timing adjustment circuit TADJ generates the delayed column control signal CLPDZ and the write amplifier control signal WAEZ according to the column control signal CLPZ. The write amplifier control signal WAEZ is generated only upon a write operation. An operation of the core control circuit 22 is illustrated in FIG. 24.

FIG. 18 illustrates details of the address switch circuit 32 illustrated in FIG. 4. The address switch circuit 32 outputs, as the row address signals RAD0-13 and the column address signals CAD0-8, address signals AD0-13 (IAD0-13) and address signals AD0-8 (IAD0-8) which are supplied sequentially during the common interface mode (address multiplex mode), and outputs address signals AD0-22 (IAD0-22) as the row address signals RAD0-13 and the column address signals CAD0-8 during the normal operation mode (address non-multiplex mode). For this purpose, the address switch circuit 32 has an address latch generator ALGEN, row address latches RALAT, address input switches AINSW1-3, internal address latches IADLAT1, IADLAT2, delay circuit DLY1 and a column selector CSEL.

The address latch generator ALGEN generates a row address latch signal RADLATX synchronously with the row address latch signal RADLATZ during inactivation of the column address enable signal CAENZ. The row address latches RALAT latch values of internal address signals IAD0-4, 5-8, 9-13 respectively synchronously with the row address latch signal RADLATX, and output the latched values as row address signals MRAD0-4, 5-8, 9-13.

The address input switch AINSW1 turns on during the normal operation mode in which the mode signal CIFZ is inactivated, and outputs internal address signals IAD9-13, 14-17, 18-22 as row address signals SRAD0-4, 5-8, 9-13. The address input switch AINSW2 turns on during the common interface mode in which the mode signal CIFZ is activated, and outputs the row address signals MRAD0-4, 5-8, 9-13 as the row address signals SRAD0-4, 5-8, 9-13. The address input switch AINSW3 turns on during the normal operation mode (CIFZ=low logic level) or turns on when the column address enable signal CAENZ is activated during the common interface mode (CIFZ=high logic level), and outputs the internal address signals IAD0-4, 5-8, as column address signals SCAD0-4, 5-8.

The internal address latch IADLAT1 (address latch circuit) latches the column address signals SCAD0-4, 5-8 and the row address signals SRAD0-4, 5-8, 9-13 respectively synchronously with the address latch signal ADLATZ generated during activation of the column address enable signal CAENZ, and outputs them as column address signals ICAD0-2, CAD3-8 and the row address signals RAD0-13 to the memory core 40. Specifically, the column address signals CAD3-8 and the row address signals RAD0-13 are output simultaneously to the memory core 40. Therefore, in the common interface mode, supply timings of the column address signals CAD3-8 and the row address signals RAD0-13 to the memory core 40 can be the same as in the normal operation mode. Consequently, the access operation can be performed without causing the memory core 40 to malfunction. Note that since the column address CAD0-2 is supplied to the data control circuit 38 as illustrated in FIG. 4, it is not necessary to match them with supply timings of the column address signals CAD3-8 to the memory core 40.

The delay circuit DLY1 delays the column address signals ICAD0-2 and supplies them to the internal address latch IADLAT2. The internal address latch IADLAT2 latches the delayed column address signals ICAD0-2 synchronously with the delayed address latch signal DADLATZ, and outputs them as page write address signals PWAD0-2. The column selector CSEL outputs the page write address signals PWAD0-2 as the column address signals CAD0-2 during activation of the write enable signal WEZ, and outputs the column address signals ICAD0-2 as the column address signals CAD0-2 during inactivation of the write enable signal WEZ (namely, during a read operation).

FIG. 19 illustrates address signals supplied to the address terminals AD. As described above, during the normal operation mode NRLMD, the address signals AD, which are supplied to the address terminals AD0-8 (second address terminal group), AD9-13 (third address terminal group), AD14-22 (first address terminal group), are supplied to the internal circuit of the decoder or the like as the column address signals CAD0-8 and the row address signals RAD0-13. On the other hand, during the common interface mode CIFMD, address signals supplied to the address terminals AD0-8 synchronously with a first address valid signal /ADV are supplied to the internal circuit as the row address signals RAD0-13. Address signals supplied to the address terminals AD0-8 synchronously with a next address valid signal /ADV are supplied to the internal circuit as the column address signals CAD0-8. The first address valid signal /ADV corresponds to a row address strobe signal /RAS of the SDRAM. The next address valid signal /ADV corresponds to a column address strobe signal /CAS of the SDRAM. The bit number (0-4 or 9-13) of the address signal RAD received at the address terminals AD9-13 is different between the normal operation mode NRLMD and the common interface mode CIFMD. Accordingly, even when the number of bits of the row address signal RAD is larger than the number of bits of the column address signal CAD, the address signal AD can be switched properly by the address switch circuit 32 during the common interface mode.

Figure 20:
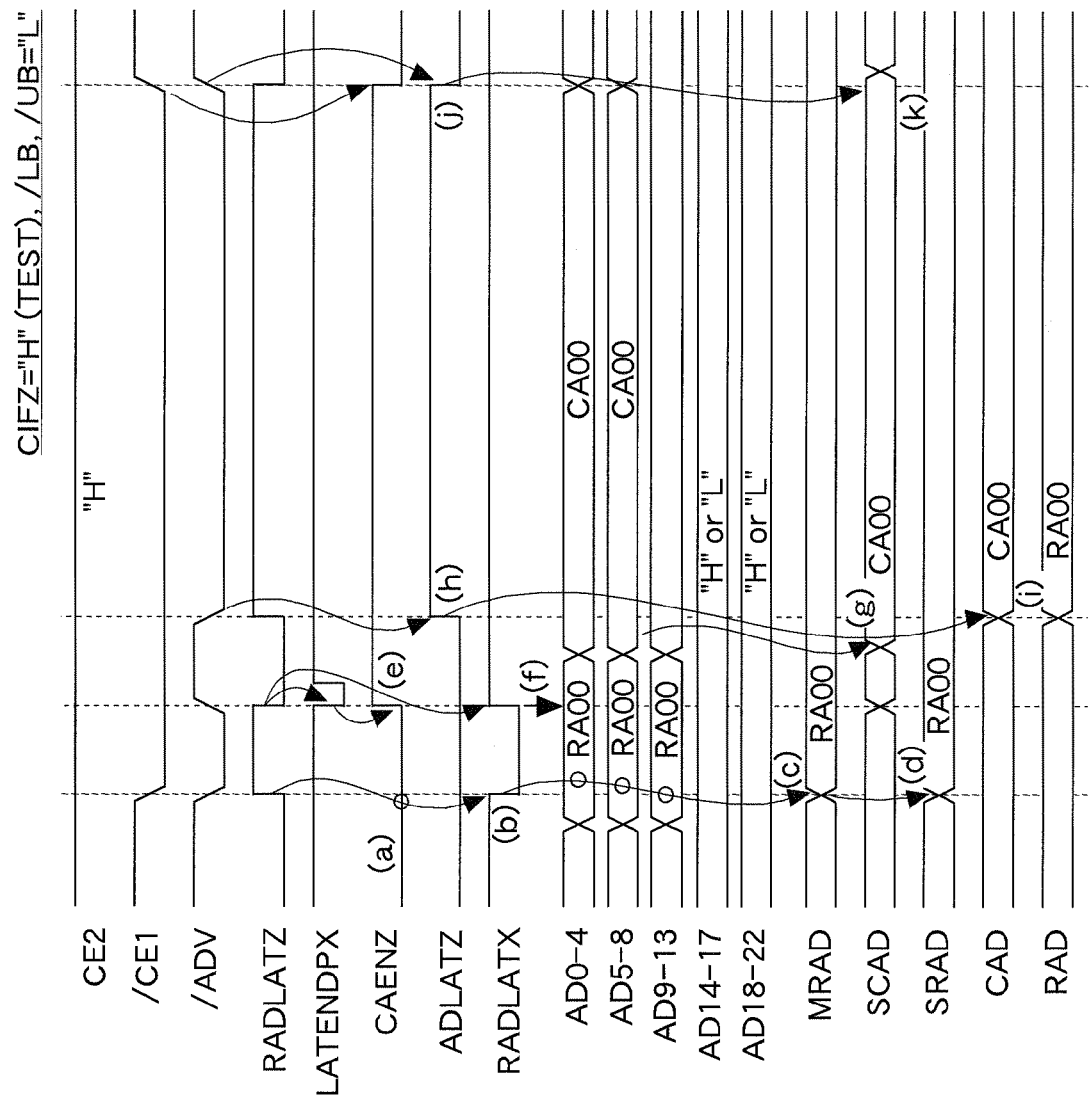
FIG. 20 illustrates operations of the address control circuit and the address switch circuit during the common interface mode.

FIG. 20 illustrates operations of the address control circuit 24 and the address switch circuit 32 during the common interface mode. In the common interface mode, the address terminals AD14-22 are not used. In the common interface mode, when the first address valid signal /ADV is supplied, the column address enable signal CAENZ is at a low logic level (FIG. 20 (a)). Accordingly, the row address latch signal RADLATX is generated synchronously with the row address latch signal RADLATZ (FIG. 20 (b)). The row address signal RA00 supplied to the address terminals AD0-13 is output as a row address signal MRA0 via the row address latch RALAT in a low logic level period of the row address latch signal RADLATX (FIG. 20 (c)). The row address signal MRAD is output as the row address signal SRAD via the address input switch AINSW2 (FIG. 20 (d)).

The column address enable signal CAENZ is activated synchronously with a rising edge of the first address valid signal /ADV (FIG. 20 (e)). Synchronously with the activation of the column address enable signal CAENZ, the row address latch signal RADLATX is inactivated, and the row address signal RA00 is latched by the row address latch RALAT (FIG. 20 (f)).

By the activation of the column address enable signal CAENZ, the address input switch AINSW3 illustrated in FIG. 18 turns on, and the address signals AD0-8 are output as the column address signal SCAD (FIG. 20 (g)). Synchronously with a failing edge of the next address valid signal /ADV, the address latch signal ADLATZ is activated (FIG. 20 (h)). The address signals SCAD, SRAD are output as the column address signals CAD0-8 and the row address signals RAD0-1 via the internal address latch IADLAT1 during the high logic level period of the address latch signal ADLATZ (FIG. 20 (i)). Synchronously with rising edges of the chip enable signal /CE1 and the address valid signal /ADV, the column address enable signal CAENZ and the address latch signal ADLATZ are inactivated (FIG. 20 (j)). The address signals SCAD, SRAD are latched by the internal address latch IADLAT1 synchronously with the inactivation of the address latch signal ADLATZ (FIG. 20 (k)).

Figure 21:
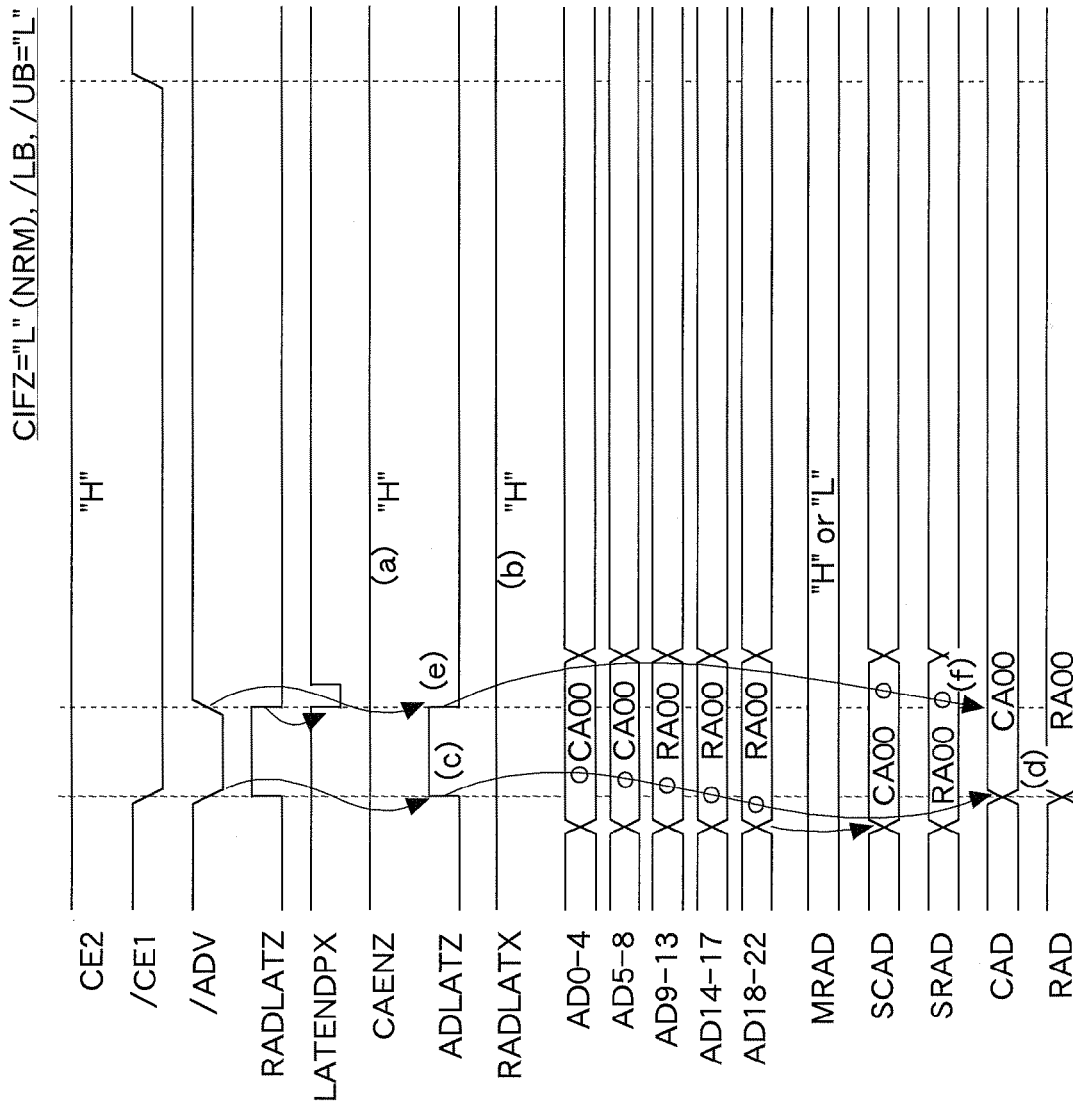
FIG. 21 illustrates operations of the address control circuit and the address switch circuit during the FCRAM interface mode.

FIG. 21 illustrates operations of the address control circuit 24 and the address switch circuit 32 during the normal operation mode. In the normal operation mode, the column address enable signal CAENZ and the row address latch signal RADLATX are fixed to a high logic level H (FIG. 21 (a, b)). Accordingly, the address input switch AINSW2 illustrated in FIG. 18 turns off, and the address input switch AINSW1 turns on. The address latch signal ADLATZ is activated synchronously with the address valid signal /ADV (FIG. 21 (c)).

The row address RA00 and the column address CA00 supplied via the address input switch AINSW1 are output as a row address signal RAD and a column address signal CAD via the internal address latch IADLAT1 during the high logic level period of the address latch signal ADLATZ (FIG. 21 (d)). Synchronously with a rising edge of the address valid signal /ADV, the address latch signal ADLATZ is inactivated (FIG. 21 (e)). Synchronously with the inactivation of the address latch signal ADLATZ, the address signals SCAD, SRAD are latched by the internal address latch IADLAT1 (FIG. 21 (f)).

FIG. 22 illustrates details of the data control circuit 38 illustrated in FIG. 4. Particularly, FIG. 22 illustrates only the circuits related to the write operation. The data control circuit 38 has a data control circuit DTCTL, a data adjustment circuit DTADJ and a data latch DTLAT. The data control circuit DTCTL outputs a write data latch signal WDLZ synchronously with the write detection pulse PWATD, outputs a write data latch signal WDLZ synchronously with the write end signal WEREZ, or outputs a write data latch signal WDLZ synchronously with a burst clock signal BCLK, during activation of a write enable signal PWENX.

The data adjustment circuit DTADJ adjusts a timing (set up time and hold time) of a write data signal DIN, and outputs it as a data signal DT. The data latch DTLAT latches the data signal DT synchronously with the write data latch signal WDLZ, and outputs it to the memory core 40 via the common data bus CDB.

FIG. 23 illustrates details of a substantial part of the memory core 30 illustrated in FIG. 4. Note that for convenience, in FIG. 23, data lines coupled to the bit lines BL, /BL via a coupling switch BT are also referred to as bit lines BL, /BL. Each of the row blocks RBLK0-1 has a plurality of memory cells MC arranged in a matrix form, word lines WL each coupled to memory cells MC arranged in the vertical direction of the diagram, and bit lines BL, /BL coupled to memory cells MC arranged in the horizontal direction of the diagram. The structure of each of the row blocks RBLK0-1 is the same as the memory cell array in FIG. 1. Each memory cell MC has a capacitor (storage part) for retaining data as a charge, and a transfer transistor for coupling one end of this capacitor to the bit line BL (or /BL). The other end of the capacitor is coupled to a cell-plate voltage line VCP (not shown). A gate of the transfer transistor is coupled to a word line WL. By selecting a word line WL (activation to a high level), one of read operation, write operation, and refresh operation is performed. The memory cells MC coupled to the word line WL is coupled to one of the bit lines BL, /BL. Accordingly, when accessing a memory cell MC coupled to the bit line BL for example, the bit line /BL functions as a reference voltage line (precharge voltage VPR).

Each coupling switch BT is formed by an nMOS transistor (switch). One of source/drain of the nMOS transistor is coupled to the bit line BL (or /BL), and the other of the source/drain of the nMOS transistor is coupled to the sense amplifier SA. A gate of the nMOS transistor receives a switch control signal BT (BT0, BT1). The coupling switch BT couples the bit lines BL, /BL of the row block RBLK to the sense amplifier SA while receiving the switch control signal BT at a high level. In this embodiment, a pair of coupling switches BT coupled to the bit lines BL, /BL operate independently from each other.

Each precharge circuit PRE is formed by a pair of nMOS transistors for coupling a complementary bit lines BL, /BL to the precharge voltage line VPR and an nMOS transistor for coupling the bit lines BL, /BL with each other. A gate of the nMOS transistor of the precharge circuit PRE receives a precharge control signal BRS (BRS0, BRS1). The precharge circuit PRE supplies the precharge voltage VPR to the bit lines BL, /BL and also equalizes voltages of the bit lines BL, /BL while receiving the precharge control signal BRS at a high level indicating that the memory cells MC are not accessed.

The sense amplifier SA is formed by a pair of CMOS inverters having inputs and outputs coupled to each other. The inputs of each CMOS inverter (gates of the transistors) are coupled to the bit line BL (or /BL). Each CMOS inverter is formed by an nMOS transistor and a pMOS transistor arranged in the horizontal direction of the diagram. A source of the pMOS transistor of each CMOS inverter receives a sense amplifier activation signal PSA. A source of the nMOS transistor of each CMOS inverter receives a sense amplifier activation signal NSA. The sense amplifier activation signal PSA is set to a high level when the sense amplifier SA operates, and set to the precharge voltage VPR when the sense amplifier SA does not operate. The sense amplifier activation signal NSA is set to a low level when the sense amplifier SA operates, and set to the precharge voltage VPR when the sense amplifier SA does not operate.

The column switch CSW is formed by an nMOS transistor coupling the bit line BL to a data line DT and an nMOS transistor coupling the bit line /BL to a data line /DT. A gate of each nMOS transistor receives a column switch signal CL. Upon a read operation, read data signals on the bit lines BL, /BL amplified by the sense amplifier SA are transmitted to the data lines DT, /DT via the column switch CSW. Upon a write operation, write data signals supplied via the data lines DT, /DT are written to the memory cells MC via the bit lines BL, /BL.

FIG. 24 illustrates operations of the core control circuit 22 illustrated in FIG. 17 and the memory core 40 illustrated in FIG. 23. In this example, the read command RD or the write command WR is supplied, or the refresh request RREQ occurs, and a read operation, a write operation or a refresh operation of the row block RBLK0 is performed. The access cycle time from the access request to completion of the access operation is, for example, 100 ns.

First, responding to the access request RD, WR or RREQ, the basic timing signal RASZ, the bit control signal BLTZ, the equalization control signal EQZ, the word control signal WLONZ and the sense amplifier control signal SAEZ are activated sequentially (FIG. 24 (a, b, c, d, e)). The basic timing signal RASZ is generated synchronously with the column address enable signal CAENZ during the common interface mode.

The precharge control signal BRS (BRS0 in this example) is inactivated synchronously with the bit control signal BLTZ (FIG. 24 (f)). By the inactivation of the precharge control signal BRS0, the coupling between the bit lines BL, /BL performing the access operation and the precharge voltage line VPR is released. Further, synchronously with the bit control signal BLTZ, the switch control signal BT (BT1 in this example) corresponding to the bit lines BL, /BL not performing the access operation is inactivated (FIG. 24 (g)).

Synchronously with the activation of the word control signal WLONZ, the word line WL is activated, and data are read from the memory cells MC to the bit line BL (or /BL) (FIG. 24 (h)). Further, the sense amplifier SA starts an amplifying operation synchronously with activation of the sense amplifier control signal SAEZ and amplifies a voltage difference in the bit line pair BL, /BL (a signal amount read from the memory cells MC to the bit line BL (or /BL)) (FIG. 24 (i)).

The write amplifier control signal WAEZ for operating the write amplifier WA is activated upon the write operation WR, and inactivated upon the read operation RD (FIG. 24 (j)). After the voltage difference in the bit line pair BL, /BL becomes large enough, that is, after read data RDT are read to the bit line pair BL, /BL, the column control signal CLPZ is activated, and the column switch CSW selected by a column address CAD turns on (FIG. 24 (k)). In the write operation WR, write data WDT are supplied to the bit lines BL, /BL via the column switch CSW (FIG. 24 (l)). In the read operation RD, the read data RDT on the bit lines BL, /BL are output to the data bus MDQ via the column switch CSW (FIG. 24 (m)). Note that the refresh operation is the same as the read operation except that the column control signal CLPZ is kept inactivated.

After a predetermined time has passed from the start of operation of the sense amplifier SA in Read operation or from rising of /CE1 in write operation, the precharge signal PREX is activated temporarily (FIG. 24 (n)), and the basic timing signal RASZ is inactivated (FIG. 24(o)). Synchronously with the inactivation of the basic timing signal RASZ, the word control signal WLONZ, the bit control signal BLTZ, the equalization control signal EQZ and the sense amplifier control signal SAEZ are inactivated sequentially (FIG. 24 (p, q, r, s)). The word line WL is inactivated synchronously with the inactivation of the word control signal WLONZ, and the coupling of the storage parts of the memory cells MC with the bit line BL (or /BL) is released (FIG. 24 (t)). Synchronously with the inactivation of the bit control signal BLTZ, the precharge control signal BRS (BRS0 in this example) is activated (FIG. 24 (u)). By the activation of the precharge control signal BRS0, the bit lines BL, /BL which performed the access operation are coupled to the precharge voltage line VPR (FIG. 24 (v)). Further, synchronously with the inactivation of the bit control signal BLTZ, the switch control signal BT (BT1 in this example) corresponding to the bit lines BL, /BL which did not perform the access operation is activated, and these bit lines BL, /BL are coupled to the sense amplifier SA (FIG. 24 (w)). Thus, the access operation is completed.

FIG. 25 illustrates a system SYS of the fourth embodiment. The system is formed as, for example, a system in package SiP integrated on a silicon substrate. The SiP has the memory MEM illustrated in FIG. 4, a flash memory FLASH, a memory controller MCNT that accesses the flash memory FLASH, and a CPU (controller) that controls the entire system. The CPU, the memory MEM, and the memory controller MCNT are coupled to one another by a system bus SBUS. The SiP may be coupled to a higher rank system via an external bus. The SiP is a portable equipment such as a mobile phone or the like for example. The CPU outputs the clock signal CLK, the command signal CMD, an address signal ADD, and the write data signal DQ in order to access the memory MEM and receives the read data signal DQ from the memory MEM. Only when the memory MEM is operated in the synchronous mode, the clock signal CLK is supplied to the memory MEM.

Figure 26:
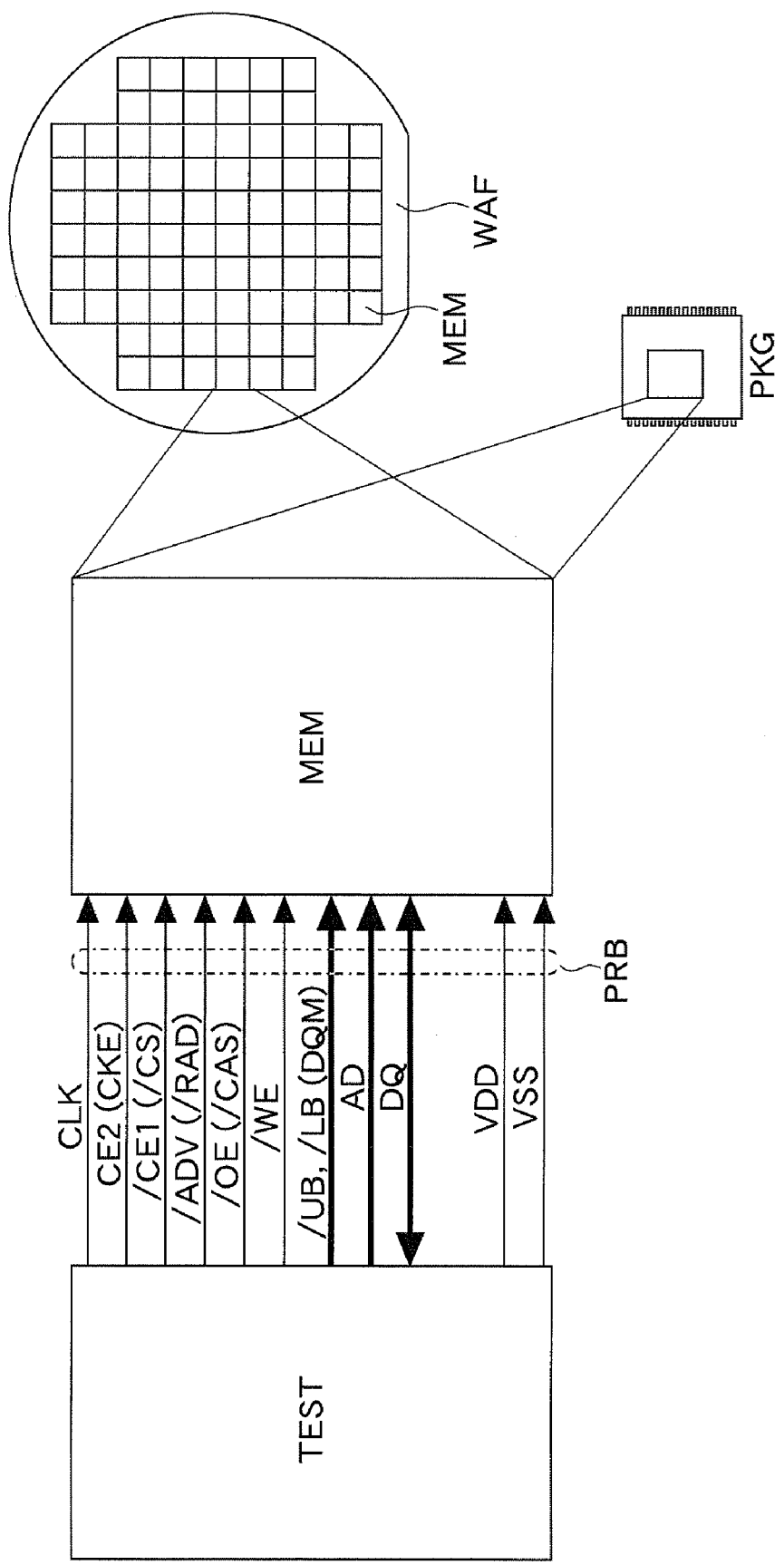
FIG. 26 illustrates a test system of the fourth embodiment.
Figure 37:
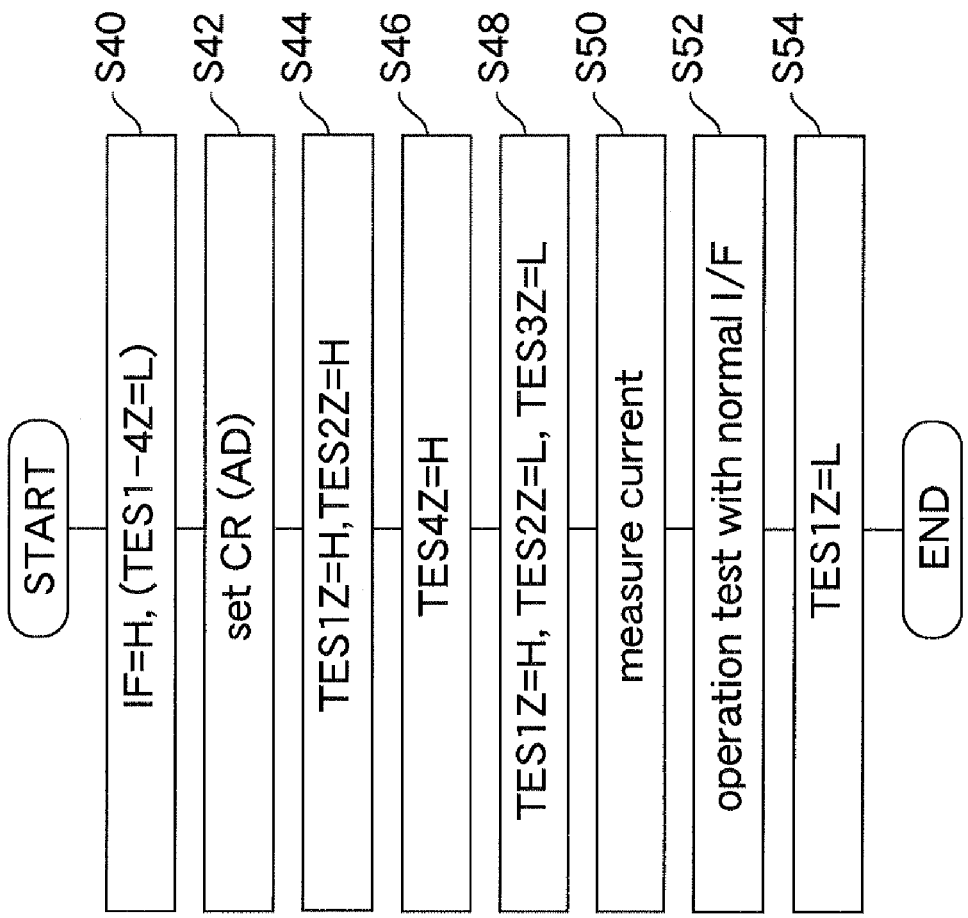
FIG. 37 illustrates a test method of memories using the FCRAM interface mode.

FIG. 26 illustrates a test system of the fourth embodiment. First, a plurality of memories MEM are formed on a semiconductor wafer WAF through a semiconductor manufacturing process. The memories MEM are tested by an LSI tester TEST before being cut off from the wafer WAF (FIGS. 36 and 37). From the LSI tester TEST, not only a control signal but also power supply voltage VDD and ground voltage VSS are supplied. The memories MEM are coupled to the LSI tester TEST via, for example, probes PRB of a not-shown probe card.

Figure 38:
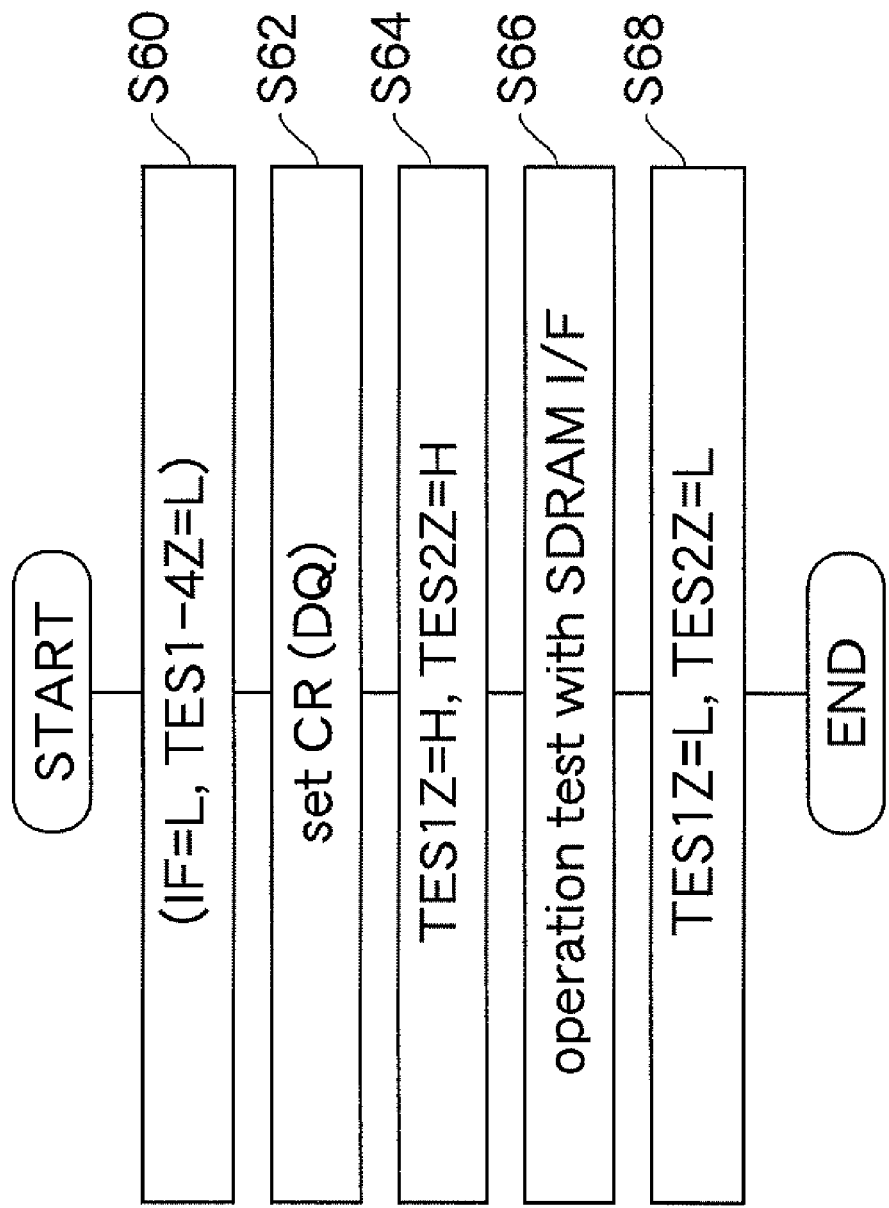
FIG. 38 illustrates a test method of a memory using the common interface mode.
Figure 39:
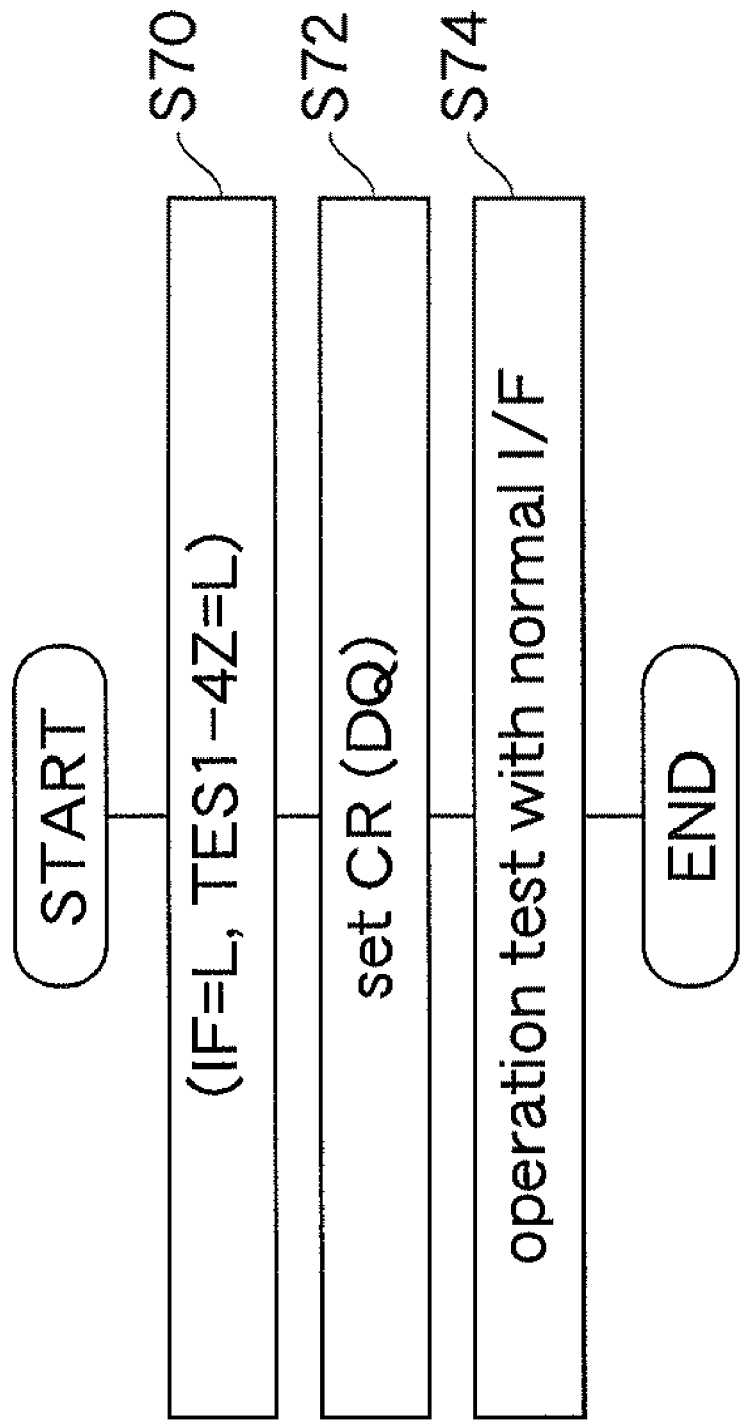
FIG. 39 illustrates a test method of a memory using the FCRAM interface mode.

The memory MEM which passes the test is packaged as single chip or is packaged with other semiconductor chips (PKG). The packaged memory MEM is tested by the LSI tester TEST (FIGS. 38 and 39). In FIG. 26, one memory MEM is coupled to the LST tester TEST, but a plurality of (four for example) memories MEM may be coupled at once to the LSI tester TEST. The number of the memories MEM coupled to the LSI tester TEST at once depends on the number of terminals of the LSI tester TEST and the number of terminals of the memory MEM.

When testing the memory MEM in the common interface mode, the LSI tester TEST uses the test patterns for the SDRAM, supplies a chip select signal /CS, a row address strobe signal /RAS, a column address strobe signal /CAS, a write enable signal /WE, a data mask signal DQM, an address signal AD and a write data signal DQ to the memory MEM, and receives a read data signal DQ from the memory MEM. At this time, a CKE signal, the /CS signal, the /RAS signal, the /CAS signal and the DQM signal are supplied to a CE2 terminal, a /CE1 terminal, a /ADV terminal, a /OE terminal and /UB, /LB terminals.

On the other hand, when testing the memory MEM in the normal operation mode, the LSI tester TEST supplies chip enable signals CE2, /CE1, an address valid signal /ADV, an output enable signal /OE, a write enable signal /WE, an upper byte control signal /UB, a lower byte control signal /LB, an address signal AD and a write data signal DQ to the memory MEM, and receives a read data signal DQ from the memory MEM.

FIG. 27 illustrates a relationship between the terminals of the memory MEM and the terminals of the SDRAM in the test mode (common interface mode). As described above, during the test mode, the LSI tester TEST handles the CE2 terminal, the /CE1 terminal, the /ADV terminal, the /OE terminal and the /UB, /LB terminals as the CKE terminal, the /CS terminal, the /RAS terminal, the /CAS terminal and the DQM terminal of the SDRAM, and uses the test patterns for the SDRAM to test the memory MEM.

FIG. 28 illustrates a write operation (page write operation) in the common interface mode. The operation illustrated in FIG. 28 is executed by the LSI tester TEST supplying the memory MEM with the test pattern for the SDRAM to perform a burst write operation. The LSI tester TEST outputs to the memory MEM an active command ACT, a write command WRA and a plurality of page write commands PWR for the SDRAM as a test pattern (FIG. 28 (a)). This test pattern is the same as the test pattern for the SDRAM except the definition file which determines timings of signals supplied to the memory MEM. Since the test program can be made common to that for the SDRAM, the test design period can be shortened, and the test cost can be reduced.

The memory MEM receives the active command ACT as a write command. At this time, the column address enable signal CAENZ (FIG. 20 (a)) is set to a low level, and hence the memory core 40 does not start the write operation. A row address signal RA00 (AD0-13) supplied together with the active command ACT to the memory MEM is held by the row address latch RALAT (FIG. 28 (b)).

Next, a column address signal CA00 (AD0-8) is supplied together with the write command WRA (FIG. 28 (c)). The address latch signal ADLATZ is activated (FIG. 28 (d)), and the row address signal RA00 and the column address signal CA00 are supplied to the memory core 40. Synchronously with a rising edge of the address valid signal /ADV, the column address enable signal CAENZ is activated as illustrated by FIG. 20 (e), and the active enable signal ACTENZ is activated as illustrated by FIG. 15 (e). Synchronously with the activation of the active enable signal ACTENZ, the sense amplifier SA starts to operate, and the write operation of the memory core 40 is started (FIG. 28 (e)). Note that in the common interface mode, the cycle of the write command WRA needs to be longer as compared to that for the SDRAM so as to include the active operation of the memory core 40 (activation of the word line WL and amplifying operation of the sense amplifier SA). However, this can be handled by modifying the definition file which determines timings of signals, and hence it is not necessary to change the test pattern.

Further, write data D0 is supplied together with the write command WRA (FIG. 28(f)). The data control circuit 38 illustrated in FIG. 22 outputs the write data D0 to the common data bus CDB synchronously with the write data latch signal WDLZ (FIG. 28 (g)). The column control signals CLPZ, CLPDZ are activated sequentially in response to switching of the column address CAD0-2 (FIG. 28 (h)), and the write data D0 is written to a memory cell MC via the data bus MDQ (FIG. 28 (i)). Thereafter, the column control signals CLPZ, CLPDZ are activated sequentially every time the column address CAD0-2 switches, and the write data D1, D2, ..., D7 are written to memory cells MC sequentially (FIG. 28 (j)). By detecting the switching of the column address CAD0-2 by the command generation circuit 20 illustrated in FIG. 13, the test pattern of the SDRAM can be used to perform the page write operation without supplying the clock signal CLK to the memory MEM.

Figure 29:
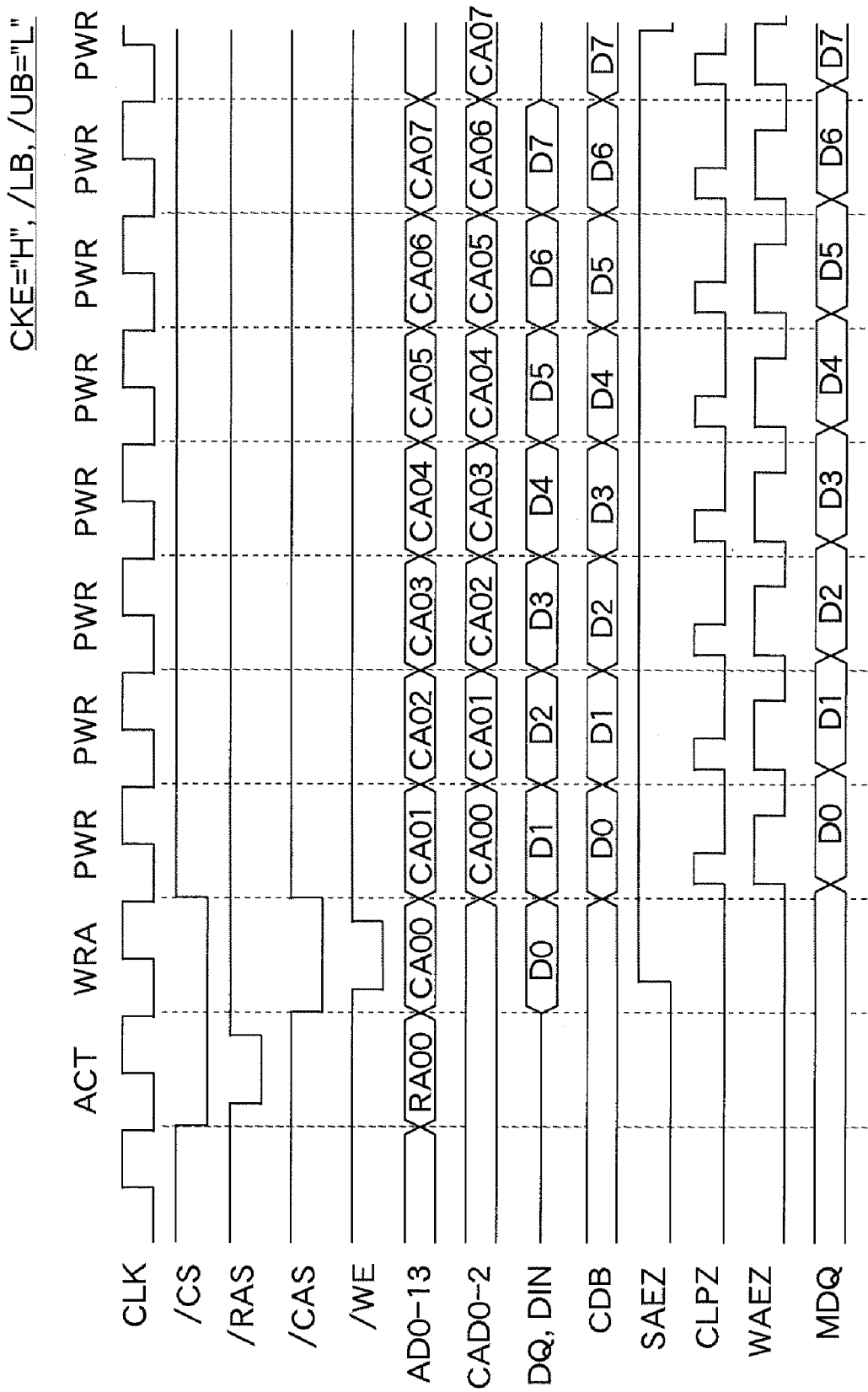
FIG. 29 illustrates a write operation of the SDRAM.

FIG. 29 illustrates a write operation of a general SDRAM. Commands supplied to the SDRAM are the same as those in FIG. 28. As is clear from comparison of FIG. 28 with FIG. 29, in the common interface mode, write data can be written to the memory MEM in the same cycle as in the SDRAM using the commands of the SDRAM. In other words, write data can be supplied to the memory MEM in WRA command input cycle in which the column address are supplied to the memory MEM, similarly to the SDRAM.

Figure 30:
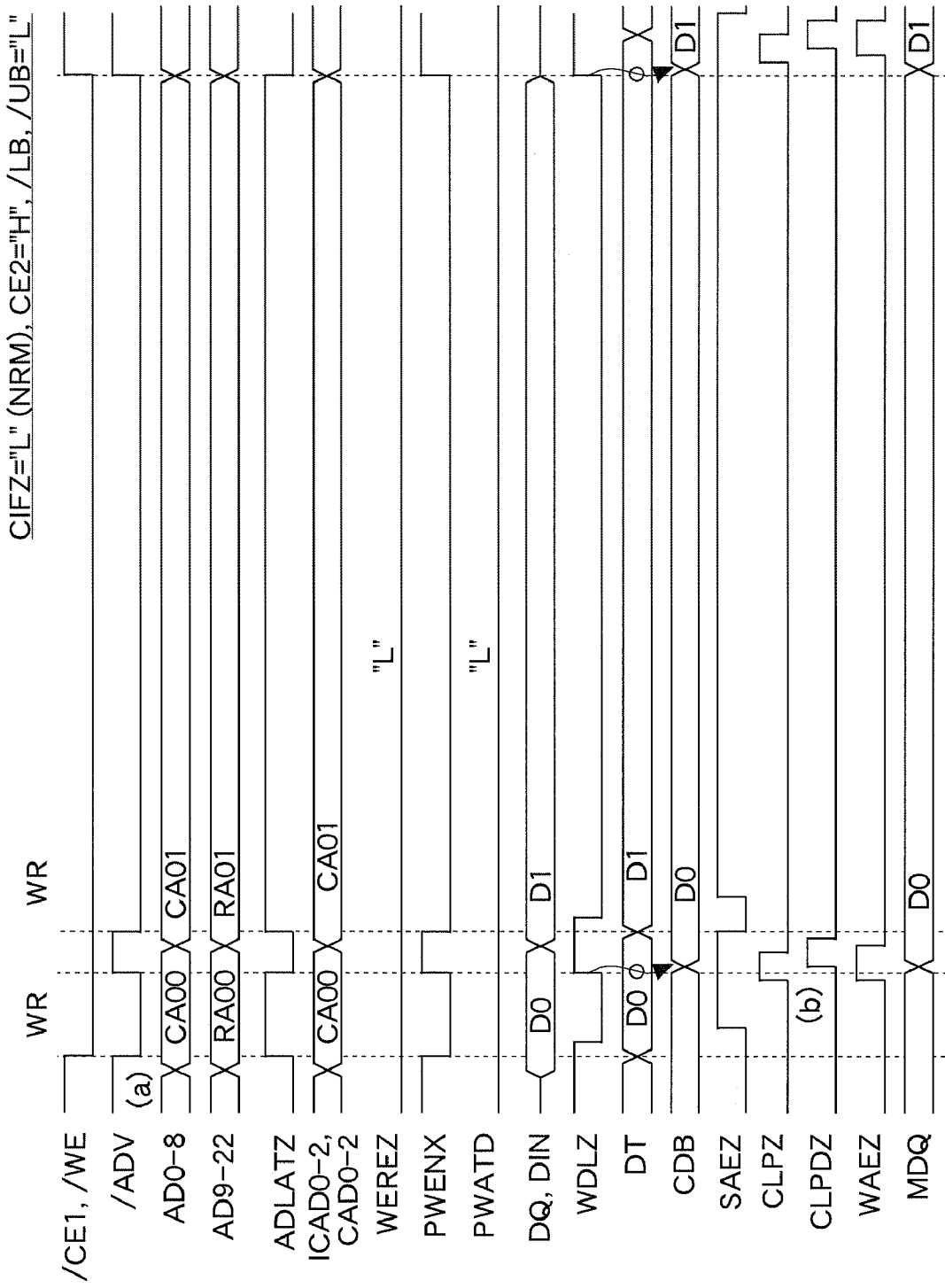
FIG. 30 illustrates a write operation in the FCRAM interface mode.

FIG. 30 illustrates a write operation in the FCRAM interface mode. In the FCRAM interface mode, the row address RA00 and the column address CA00 are supplied together with the write command WR using the address terminals AD0-22 (FIG. 30 (a)). Then the column control signal CLPZ (CLPDZ) is output synchronously with a rising edge of the address valid signal /ADV (FIG. 30 (b)), and write data D0 is written to a memory cell MC. Thus, in the FCRAM interface mode, data can be written to the memory MEM using commands supplied to the general FCRAM.

Figure 31:
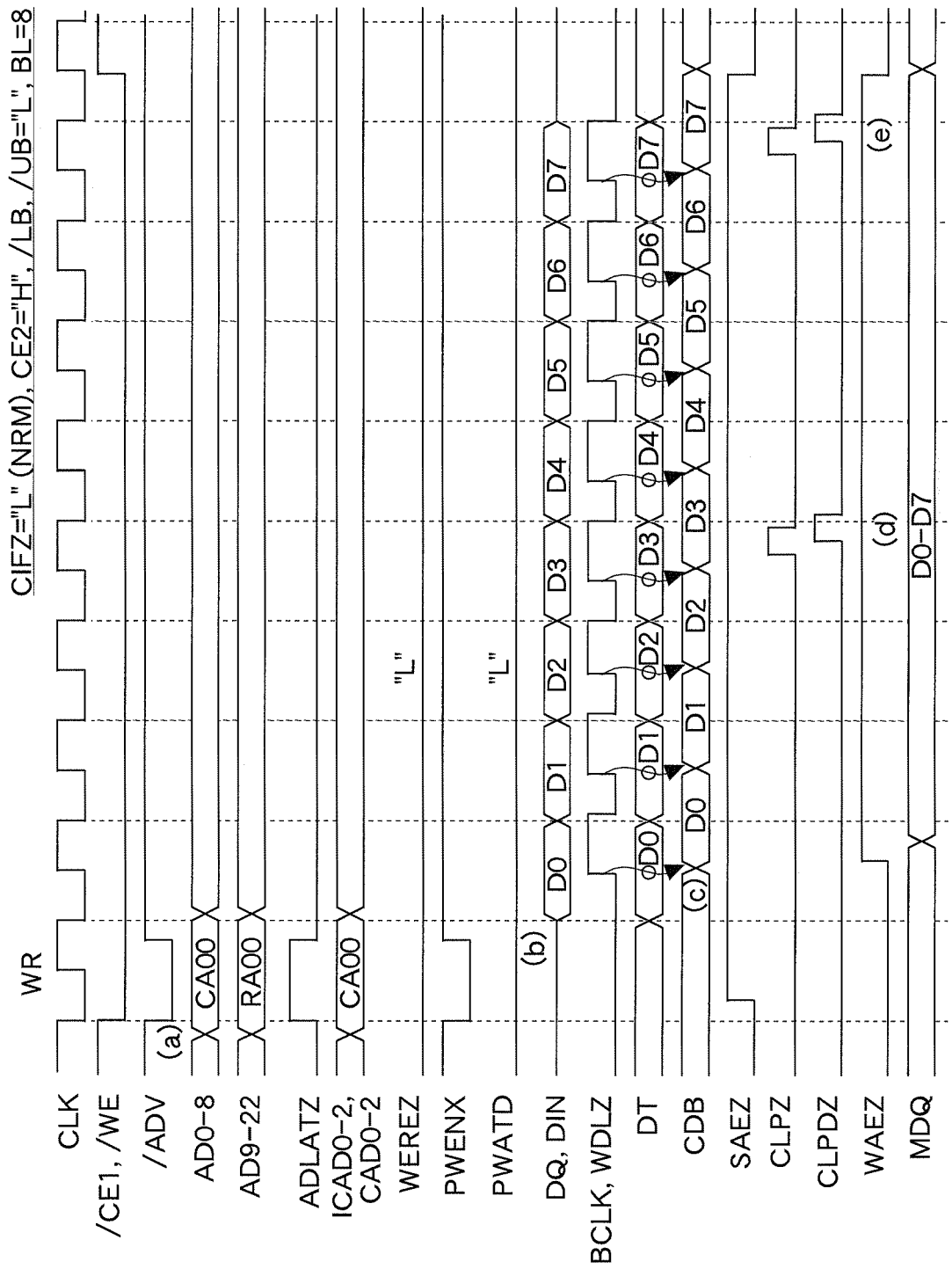
FIG. 31 illustrates a burst write operation in the FCRAM interface mode.

FIG. 31 illustrates a burst write operation in the FCRAM interface mode. In this example, the burst length BL is "8". The burst write operation is performed synchronously with the clock signal CLK (synchronous mode). First, the row address RA00 and the column address CA00 are supplied together with the write command WR using the address terminals AD0-22 (FIG. 31 (a)). Write data D0-D7 are supplied sequentially from the Read Latency −1 clock cycle (FIG. 31 (b)). In FIG. 31, the case of read latency=2 is illustrated.

Next, by the write data latch signal WDLZ that is synchronous with a burst clock signal BCLK, the write data D0-D7 are output sequentially to the common data bus CDB (FIG. 31 (c)). The column control signal CLPZ (CLPDZ) are output synchronously with the write data D3 and D7, and four write data D0-D3, D4-D7 are written to the memory cells MC sequentially via the data bus MDQ (FIG. 31 (d, e)). Thus, in the FCRAM interface mode, it is possible to make the memory MEM perform the burst write operation using commands supplied to the general FCRAM.

Figure 32:
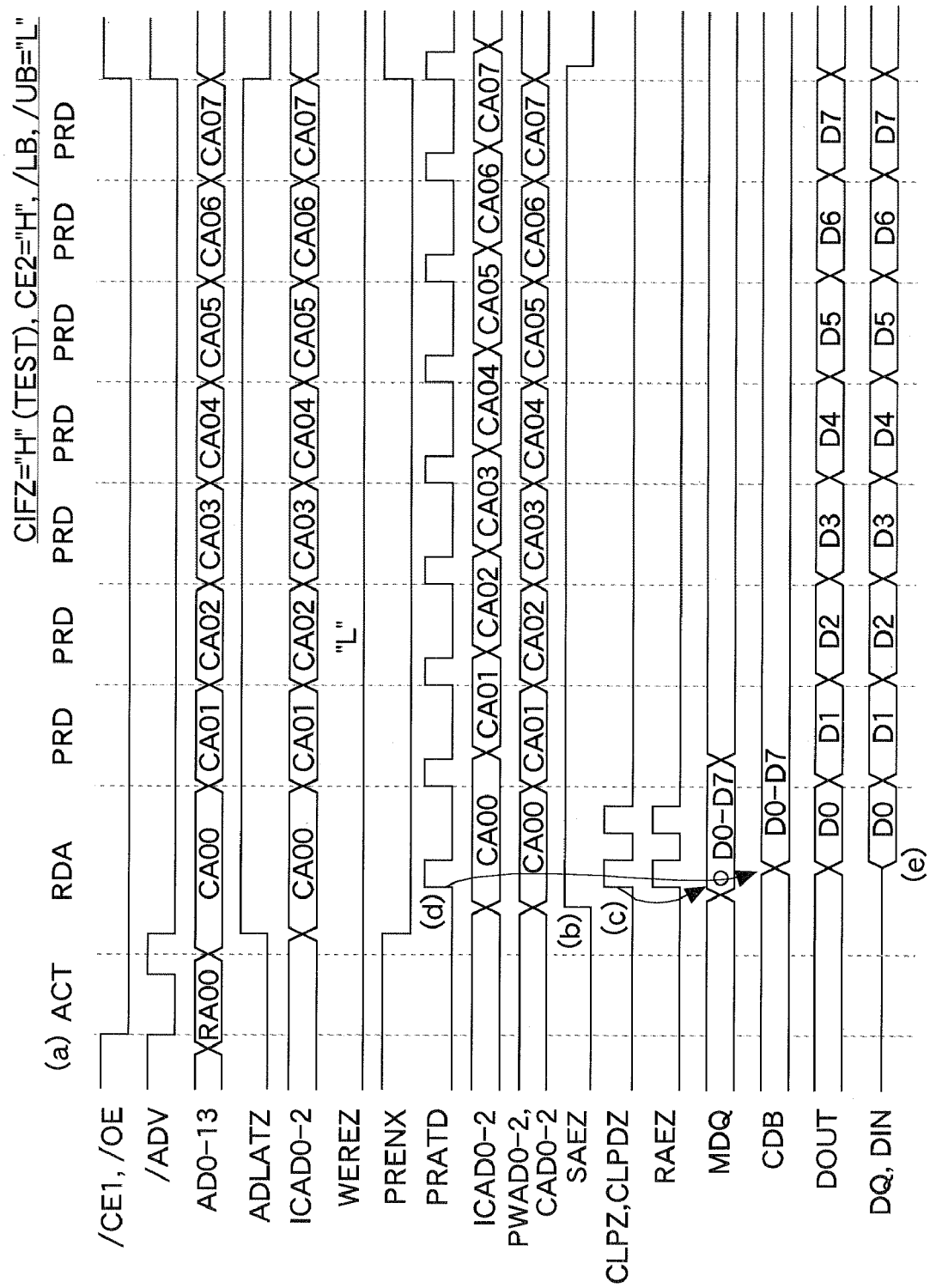
FIG. 32 illustrates a read operation in the common interface mode.

FIG. 32 illustrates a read operation in the common interface mode. An operation of receiving an address signal is the same as in FIG. 28. Since it is the common interface mode, the LSI tester TEST outputs to the memory MEM an active command ACT, a read command RDA and a plurality of page read commands PRD for the SDRAM as a test pattern (FIG. 32 (a)). This test pattern is the same as the test pattern for the SDRAM except the definition file which determines timings of signals supplied to the memory MEM. Since the test program can be made common to that for the SDRAM, the test design period can be shortened, and the test cost can be reduced.

In the read operation in the common interface mode, similarly to FIG. 28, the column address enable signal CAENZ is activated as illustrated in FIG. 20 (e), synchronously with a rising edge of the address valid signal /ADV similarly to FIG. 28, and the active enable signal ACTENZ is activated as illustrated in FIG. 15 (e)). The sense amplifier SA starts to operate synchronously with the activation of the active enable signal ACTENZ, and the read operation of the memory core 40 is started (FIG. 32 (b)). In the read operation, the column control signal CLPZ (CLPDZ) is generated twice in the cycle in which the read command RDA is supplied in response to the sense amplifier control signal SAEZ (FIG. 32 (c)). The read address transition signal PRATD is generated in response to switching of the column address CAD0-2 (FIG. 32 (d)), and the read data D0-D7 are output to the data terminal DQ via the data bus MDQ and the common data bus CDB (FIG. 32 (e)). Note that in the common interface mode, the cycle of the read command RDA needs to be longer as compared to that for the SDRAM so as to include the active operation of the memory core 40 (activation of the word line WL and amplifying operation of the sense amplifier SA). However, this can be handled by modifying the definition file which determines timings of signals, and hence it is not necessary to change the test pattern.

Figure 33:
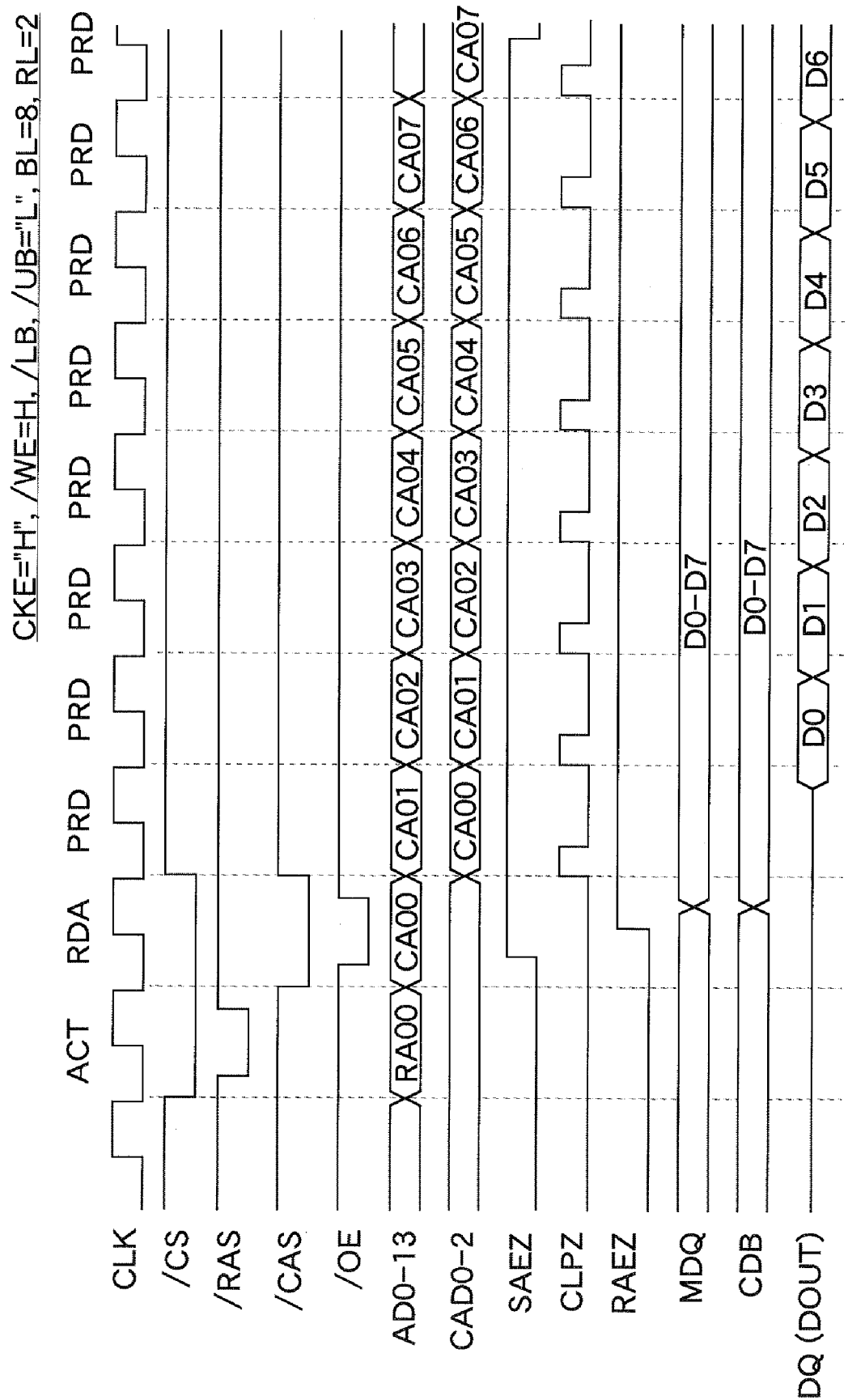
FIG. 33 illustrates a read operation of the SDRAM.

FIG. 33 illustrates a read operation of a general SDRAM. In FIG. 33, an example in which a read latency RL is "2" is illustrated. Commands supplied to the SDRAM are the same as in FIG. 32. As is clear from comparison of FIG. 32 with FIG. 33, in the common interface mode, read data can be read from the memory MEM using the commands of the SDRAM.

Figure 34:
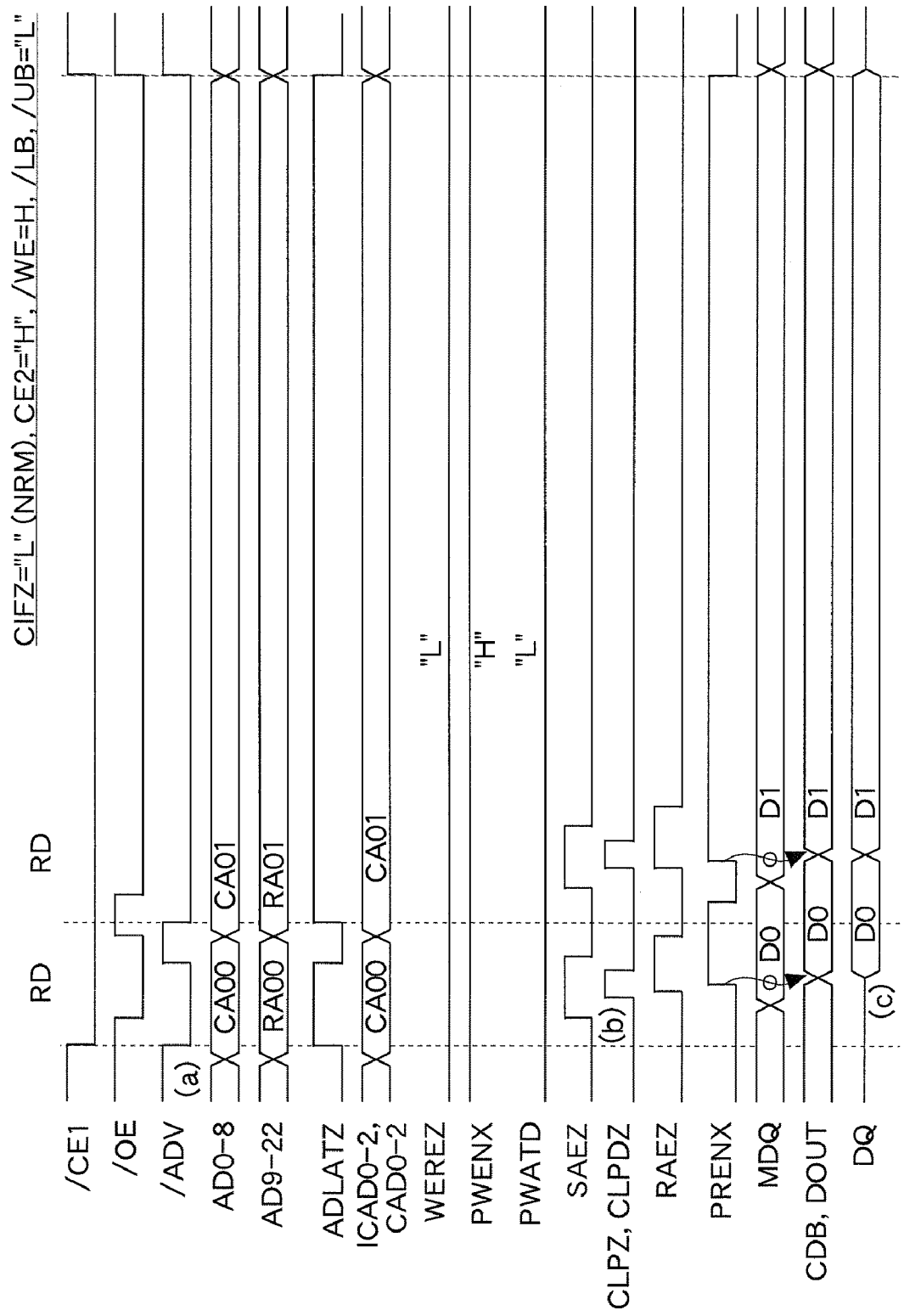
FIG. 34 illustrates a read operation in the FCRAM interface mode.

FIG. 34 illustrates a read operation in the FCRAM interface mode. In the FCRAM interface mode, the row address RA00 and the column address CA00 are supplied together with the read command RD using the address terminal AD0-22 (FIG. 34 (a)). Then the sense amplifier control signal SAEZ and the column control signal CLPZ (CLPDZ) are output sequentially in response to the read command RD (FIG. 34 (b)), and read data are read from the memory cells MC (FIG. 34 (c)). Thus, in the FCRAM interface mode, data can be read from the memory MEM using commands supplied to the general FCRAM.

Figure 35:
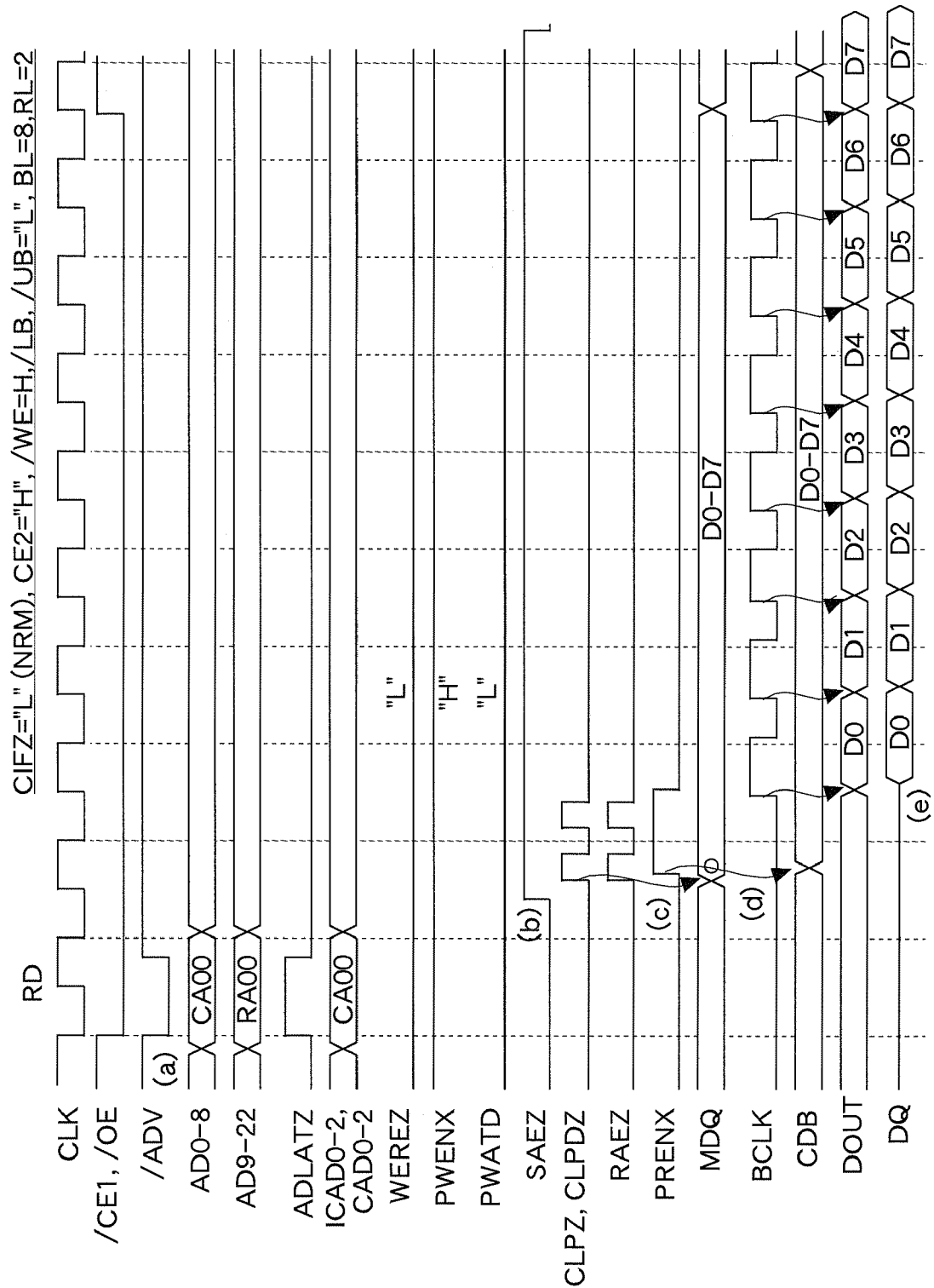
FIG. 35 illustrates a burst read operation in the FCRAM interface mode.

FIG. 35 illustrates a burst read operation in the FCRAM interface mode. In this example, the burst length BL is "8", and the read latency RL is "2". The burst read operation is performed synchronously with the clock signal CLK (synchronous mode). First, the row address RA00 and the column address CA00 are supplied together with the read command RD using the address terminals AD0-22 (FIG. 35 (*a*)). The sense amplifier control signal SAEZ is activated in the next cycle of the read command RD (FIG. 35 (*b*)). Read data D0-D3, D4-D7 on the bit lines BL, /BL are transferred to the data bus MDQ synchronously with the column control signal CLPZ (CLPDZ) which is activated twice continuously (FIG. 35 (*c*)), and transferred further to the common data bus CDB (FIG. 35 (*d*)). Then the read data D0-D7 are output sequentially to the data terminal DQ synchronously with the burst clock signal BCLK (FIG. 35 (*e*)). Thus, in the FCRAM interface mode, it is possible to make the memory MEM perform the burst read operation using commands supplied to the general FCRAM.

FIG. 36 illustrates a test method of memories MEM using the common interface mode. With this flow, memories MEM in a wafer form are tested. The flow in FIG. 36 is executed by the tester TEST illustrated in FIG. 26 performing a test program. The address terminals AD14-22 are not coupled to the tester TEST. When the memories MEM have a compression test function of data signal, a part of the data terminals DQ is not coupled to the tester TEST. Thus, by reducing the number of terminals used for the test, it is possible to increase the number of memories MEM that can be tested at once.

The tester TEST supplies power supply voltage VDD (high level H) to the test pad IF in step S10. When each memory MEM is powered on, the test signals TES1-4Z are initialized to a low logic level L. Accordingly, by the test pad IF at a high level H, the operation mode of the memory MEM is set to the common interface mode. Further, the register set signal CCRZ is set to a high logic level by the test pad IF at the high level H, and hence the configuration register 16 becomes settable by the address signal AD.

Next, in step S12, the configuration register 16 is set by the address signal AD, and the internal state of the memory MEM is set. At this time, the refresh disable test command may be supplied so as to disable the refresh operation. In step 14, the test command is supplied to the test entry circuit 10, and the test signals TES1Z, TES2Z are set to a high logic level H. Accordingly, the register set signal CCRZ is set to a low logic level still in the common interface mode. In other words, the configuration register 16 becomes settable by the data signal DQ, and this can prevent the configuration register 16 from being set by mistake. Specifically, by switching the setting specification of the configuration register 16 to the data signal DQ, it is necessary to hold all of the address signals RAD, CAD to a high logic level H so as to set the configuration register 16 during the test. By tightening up the condition for setting the configuration register 16, it is possible to securely prevent the configuration register 16 from being set by mistake.

In step S16, the test command is supplied to the test entry circuit 10, and the test signal TES4Z is set to a high logic level H. Accordingly, as illustrated in FIG. 5, coupling of the test pad IF and the ground line is released, and it is possible to prevent that leak current flows from the test pad IF to the ground line. In step S18, a test of standby current or the like is executed. Since the leak current does not flow due to the processing in step S16, the current value can be measured accurately.

In step S20, at least one of a plurality of test signals TESZ is set to a high logic level H. In step S22, an operation test of the memory MEM is executed in the common interface mode (namely, SDRAM interface). In the operation test, particularly a test of the inside of the memory core 40 is executed.

Next, in step S24, the test signal TES1Z is set to a low logic level L so as to set the register set signal CCRZ to a high logic level. In step 26, the configuration register 16 is set by the address signal AD, and the internal state of the memory MEM is changed. In step 28, the test signal TES1Z is set to a high logic level H again, and the configuration register 16 becomes settable by the data signal DQ. Then, in step S30, a different test of the memory MEM is executed in the common interface mode (namely, SDRAM interface). By repeating step S24 to step S30, a plurality of operation tests can be executed. Thus, the test in the wafer state with the common interface mode is finished.

FIG. 37 illustrates a test method of memories MEM using the FCRAM interface mode. With this flow, the memories MEM in a wafer form are tested. The flow in FIG. 37 is executed by the tester TEST illustrated in FIG. 26 performing a test program. In this test, a test of a peripheral circuit peculiar to the memories MEM (FCRAM), a test of operation current when operated as the FCRAM, and the like are executed. Since the operation test of the memory cells MC is executed in the test in FIG. 36, it is not necessary to couple the address terminals AD14-22 to the tester TEST.

From step S40 to step S46 are the same as from step S10 to step S16 in FIG. 36. In step S48, the test signals TES1Z, TES2Z and TES3Z are set to a high logic level H, a low logic level L and a low logic level L, respectively. Accordingly, the register set signal CCRZ is set to a low logic level still in the FCRAM interface mode. In other words, the configuration register 16 becomes settable by the data signal DQ, and this can prevent the configuration register 16 from being set by mistake. In step S50, the read command and the write command are supplied by a smallest cycle, or the burst read operation or the burst write operation is performed, and the operation current is tested.

In step S52, an operation test peculiar to the memories MEM is executed in the FCRAM interface mode. At this time, by providing each memory MEM with a function (switch circuit for the address signals AD) to couple the address terminals AD0-9 to the address buffer corresponding to the address terminals AD14-22, a test of a circuit coupled to the address terminals AD14-22 can be executed. This test can be executed by a certain test mode that can be set by the test entry circuit 10. Then, in step S54, the test signal TES1Z is set to the low logic level L, and thereby the register set signal CCRZ is set to a high logic level. The configuration register 16 becomes settable by the address signal AD. Thus, the test in a wafer state by the common interface mode is finished.

FIG. 38 illustrates a test method of a memory MEM using the common interface mode. With this flow, a packaged memory MEM is tested. The flow in FIG. 38 is executed by the tester TEST illustrated in FIG. 26 performing a test program. The address terminals AD14-22 are not coupled to the tester TEST. Accordingly, also regarding the memory MEM enclosed in a package, the number of memories MEM that can be tested at once can be increased. Additionally, it is made possible to test packaged sample in the same condition with the wafer test and analyze test condition to make it better.

Step S60 illustrates an initial state at the time of starting the test. The test pad IF of the memory MEM in the package is in an open state, and the node of the test pad IF is grounded to a ground line via a register R1 illustrated in FIG. 5 (IF=L level). When the memory MEM is powered on, the test signals TES1-4Z are initialized to an L level. Accordingly, the memory MEM is set to the FCRAM interface mode. The configuration register 16 is settable by the data signal DQ.

In step S62, the configuration register 16 is set using the data signal DQ. In step S64, the test signals TES1Z, TES2Z are both set to a high logic level H, and the memory MEM is set to a common interface mode. Then in step S66, an operation test of the memory MEM is executed in the common interface mode (namely, SDRAM interface). In the operation test, particularly a test of the inside of the memory core 40 is executed. In step S68, the test signals TES1Z, TES2Z are both set to a low logic level L, and the memory MEM is set to the FCRAM interface mode. Thus, the test in the packaged state by the common interface mode is finished. Note that in the test in FIG. 38, similarly to FIG. 36, a test of current such as standby current may be executed.

FIG. 39 illustrates a test method of a memory MEM using the FCRAM interface mode. With this flow, a packaged memory MEM is tested. The flow in FIG. 39 is executed by the tester TEST illustrated in FIG. 26 performing a test program. Steps S70, S72 are the same as steps S60, S62 in FIG. 39. In this state, the memories MEM are set to the FCRAM interface mode. The configuration register 16 is settable by the data signal DQ.

In step S74, an operation test peculiar to the memory MEM is executed in the FCRAM interface mode. At this time, similarly to FIG. 37, by a certain test mode that can be set by the test entry circuit 10 for example, a test of a circuit coupled to the address terminals AD14-22 can be executed. Then, the test in the packaged state by the FCRAM interface mode is finished.

As above, in the fourth embodiment, when the memory MEM is tested, the address terminals AD14-22 can be left unused, and the number of memories MEM that can be tested at once can be increased. Further, it becomes possible to use test assets of for a DRAM or the like of the address non-multiplex type (for example, a test program for an SDRAM) to test the memory MEM. Consequently, the test efficiency can be improved, and the test cost can be reduced.

A proposition of the embodiments is to make it possible to test a semiconductor memory using test assets for other semiconductor memories, to thereby improve the test efficiency and reduce the test cost.

For example, the number of semiconductor memories that are tested at once can be increased by executing an operation test of the semiconductor memories in the second operation mode. In addition, it becomes possible to test a semiconductor memory using test assets for other semiconductor memories that receive a row address signal and a column address signal sequentially at the same address terminal to operate. Consequently, the test efficiency can be improved, and the test cost can be reduced. For example, in a test of a semiconductor memory, first, the semiconductor memory is set to the second operation mode. Next, the row address signal and the column address signal are supplied sequentially to the second address terminal group, and the operation test of the semiconductor memory is executed. For example, the first operation mode is a normal operation mode, and the second operation mode is a test mode. For example, the semiconductor memory forms a system together with a controller which accesses the semiconductor memory.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
   a memory core having a plurality of memory cells, a plurality of word lines coupled to the memory cells, a plurality of bit lines coupled to the memory cells, a row decoder which selects the word lines according to a row address signal, and a column decoder which selects the bit lines according to a column address signal; and
   an address switch circuit which receives the row address signal supplied to a first address terminal group and the column address signal supplied to a second address terminal group and supplies the received row address signal and the received column address signal to the row decoder and the column decoder during a first operation mode, and receives the row address signal supplied to the second address terminal group and thereafter receives the column address signal supplied to the second address terminal group and supplies the received row address signal and the received column address signal to the row decoder and the column decoder during a second operation mode.

2. The semiconductor memory according to claim 1, further comprising an access control circuit which outputs to the memory core an access control signal configured to perform an access operation of the memory core in response to an access command supplied together with the column address signal and the row address signal during the first operation mode, and outputs to the memory core the access control signal in response to supply of the column address signal to the address switch circuit during the second operation mode.

3. The semiconductor memory according to claim 2, wherein the access control circuit comprises:
   an active control circuit which keeps activating an active enable signal during the first operation mode, and activates the active enable signal in response to supply of the column address signal during the second operation mode;
   a command output control circuit which outputs the access command as an access request signal during activation of the active enable signal, and disables output of the access request signal during inactivation of the active enable signal; and
   a core control circuit which generates the access control signal according to the access request signal.

4. The semiconductor memory according to claim 3, wherein the active control circuit has a plurality of transition edge detectors which each output a detection pulse when detecting one of the access command and a transition edge of the column address signal, and the active control circuit activates the active enable signal synchronously with one of the detection pulses which is output at a latest timing during the second operation mode.

5. The semiconductor memory according to claim 1, further comprising:
   an address control circuit which keeps activating a column address enable signal during the first operation mode, and activates the column address enable signal after a first access command is supplied during the second operation mode; and
   an address latch circuit which latches the row address signal and the column address signal synchronously with an access command during activation of the column address enable signal, and outputs the latched address signal to the memory core.

6. The semiconductor memory according to claim 1, further comprising:
a write transition edge detector which operates when receiving a write command during the second operation mode, and outputs a write detection pulse every time the transition edge of the column address signal is detected; and
a data control circuit which supplies write data to be written to the memory cells to the memory core in response to the write detection pulse, wherein
write data are supplied every time the column address signal is switched while receiving the write command.

7. The semiconductor memory according to claim 6, further comprising a data input buffer which receives first write data corresponding to the write command at a timing matched to a supply timing of the column address signal.

8. The semiconductor memory according to claim 1, wherein:
the address switch circuit receives the row address signal supplied to a third address terminal group during the first and second operation modes; and
a bit number of the row address signal received at the third address terminal group is different in the first operation mode and in the second operation mode.

9. The semiconductor memory according to claim 1, wherein the first operation mode is a normal operation mode for access to a semiconductor memory using the first and second address terminal groups, and the second operation mode is a test mode for access to a semiconductor memory using only the first address terminal group.

10. The semiconductor memory according to claim 1, wherein:
the first operation mode is an address non-multiplex mode to receive the column address signal and the row address signal simultaneously; and
the second operation mode is an address multiplex mode to receive the column address signal and the row address signal sequentially.

11. The semiconductor memory according to claim 1, further comprising a configuration register supplied with at least one of the column address signal and one of the row address signal and a data signal according to a logic level of a register set signal, so as to change an operation specification of the semiconductor memory.

12. The semiconductor memory according to claim 11, further comprising a configuration register control circuit which selects at least one of the column address signal and the row address signal or a data signal according to a logic level of the register set signal, and outputs the selected signal to the configuration register.

13. The semiconductor memory according to claim 11, further comprising a selector which outputs the register set signal according to a voltage value supplied to a test terminal when a mode selection control signal indicates a first logic level, and outputs the register set signal according to a logic level of a register switch signal when the mode selection control signal indicates a second logic level.

14. The semiconductor memory according to claim 1, further comprising a selector which outputs a mode signal indicating one of the first and second operation mode according to a voltage value supplied to a test terminal when a mode selection control signal indicates a first logic level, and outputs the mode signal according to a level of a mode switch signal when the mode selection control signal indicates a second level, wherein
the address switch circuit operates according to the first or second operation mode indicated by the mode signal.

15. The semiconductor memory according to claim 14, further comprising a switch circuit which is arranged between a voltage line supplied with a predetermined voltage and the test terminal, and turns on when a cut-off signal indicates a first level and turns off when the cut-off signal indicates a second level, wherein
the selector outputs the mode signal indicating the first operation mode when the predetermined voltage is received.

16. The semiconductor memory according to claim 1, further comprising a test entry circuit which receives as a test code the column address signal supplied to the first address terminal group and the row address signal supplied to the second address terminal group together with a plurality of test commands during the first operation mode, receives as the test code the row address signal and the column address signal supplied to the first address terminal group sequentially together with the test commands during the second operation mode, and outputs a test signal to test an internal circuit according to the received test code.

17. A test method of a semiconductor memory including:
a memory core having a plurality of memory cells, a plurality of word lines coupled to the memory cells, a plurality of bit lines coupled to the memory cells, a row decoder which selects the word lines according to a row address signal, and a column decoder which selects the bit lines according to a column address signal; and
an address switch circuit which receives the row address signal supplied to a first address terminal group and the column address signal supplied to a second address terminal group and supplies the received row address signal and the received column address signal to the row decoder and the column decoder during a first operation mode, and receives the row address signal supplied to the second address terminal group and thereafter receives the column address signal supplied to the second address terminal group and supplies the received row address signal and the received column address signal to the row decoder and the column decoder during a second operation mode, and
the test method comprising:
setting the semiconductor memory to the second operation mode; and
supplying the row address signal and the column address signal sequentially to the second address terminal group so as to execute an operation test of the semiconductor memory.

18. The test method of the semiconductor memory according to claim 17, further comprising:
setting the semiconductor memory to the first operation mode after the operation test; and
supplying the row address signal and the column address signal to the first and second address terminal groups so as to execute an operation test of the semiconductor memory.

19. A system comprising a semiconductor memory and a controller which accesses the semiconductor memory, wherein the semiconductor memory comprises:
a memory core having a plurality of memory cells, a plurality of word lines coupled to the memory cells, a plurality of bit lines coupled to the memory cells, a row decoder which selects the word lines according to a row address signal, and a column decoder which selects the bit lines according to a column address signal; and
an address switch circuit which receives the row address signal supplied to a first address terminal group and the column address signal supplied to a second address terminal group and supplies the received row address signal and the received column address signal to the row decoder and the column decoder during a first operation mode, and receives the row address signal supplied to the second address terminal group and thereafter receives the column address signal supplied to the second address terminal group and supplies the received row address signal and the received column address signal to the row decoder and the column decoder during a second operation mode.

* * * * *